US008228968B2

(12) United States Patent
Fullerton et al.

(10) Patent No.: US 8,228,968 B2
(45) Date of Patent: *Jul. 24, 2012

(54) METHOD AND APPARATUS FOR GENERATING RF WAVEFORMS HAVING AGGREGATE ENERGY WITH DESIRED SPECTRAL CHARACTERISTICS

(75) Inventors: Larry W. Fullerton, Huntsville, AL (US); Arthur Bradley, Yorktown, VA (US); Mark D. Roberts, Huntsville, AL (US)

(73) Assignee: Alereon, Inc., Austin, TX (US)

( * ) Notice: Subject to any disclaimer, the term of this patent is extended or adjusted under 35 U.S.C. 154(b) by 99 days.

This patent is subject to a terminal disclaimer.

(21) Appl. No.: 12/235,247

(22) Filed: Sep. 22, 2008

(65) Prior Publication Data
US 2010/0277208 A1    Nov. 4, 2010

Related U.S. Application Data

(63) Continuation of application No. 10/686,814, filed on Oct. 17, 2003, now Pat. No. 7,428,258.

(60) Provisional application No. 60/419,459, filed on Oct. 17, 2002, provisional application No. 60/432,435, filed on Dec. 11, 2002, provisional application No. 60/460,165, filed on Apr. 3, 2003.

(51) Int. Cl.
*H04B 1/00* (2006.01)
(52) U.S. Cl. ...................................................... 375/130
(58) Field of Classification Search .................. 375/130, 375/135, 139, 146, 295
See application file for complete search history.

(56) References Cited

U.S. PATENT DOCUMENTS

| 4,641,317 | A | 2/1987 | Fullerton |
|---|---|---|---|
| 4,743,906 | A | 5/1988 | Fullerton |
| 4,813,057 | A | 3/1989 | Fullerton |
| 4,979,186 | A | 12/1990 | Fullerton |
| 5,636,108 | A | 6/1997 | Taurand et al. |
| 5,677,927 | A | 10/1997 | Fullerton et al. |
| 5,678,169 | A | 10/1997 | Turney |
| 5,808,962 | A | 9/1998 | Steinberg et al. |
| 5,812,081 | A | 9/1998 | Fullerton |
| 5,832,035 | A | 11/1998 | Fullerton |
| 5,952,956 | A | 9/1999 | Fullerton |
| 6,111,536 | A | 8/2000 | Richards et al. |
| 6,133,876 | A | 10/2000 | Fullerton et al. |
| 6,177,903 | B1 | 1/2001 | Fullerton et al. |
| 6,218,979 | B1 | 4/2001 | Barnes et al. |
| 6,300,903 | B1 | 10/2001 | Richards et al. |
| 6,351,652 | B1 | 2/2002 | Finn et al. |
| 6,354,946 | B1 | 3/2002 | Finn |
| 6,462,701 | B1 | 10/2002 | Finn |

(Continued)

OTHER PUBLICATIONS

Office Action for U.S. Appl. No. 10/686,814, mailed Apr. 20, 2007, 25 pgs.

(Continued)

*Primary Examiner* — Sam K Ahn
(74) *Attorney, Agent, or Firm* — Sprinkle IP Law Group

(57) ABSTRACT

The present invention relates to a method and system that emulates a desired waveform by producing a time profile of the desired waveform, which is characterized by a plurality of sample values, and generating a plurality of RF waveforms, each RF waveform of the plurality of RF waveforms having a polarity and scaled energy based on a corresponding one of the plurality of sample values, to produce an aggregate RF energy having spectral characteristics that approximate the spectral characteristics of the desired waveform.

16 Claims, 44 Drawing Sheets

U.S. PATENT DOCUMENTS

| | | |
|---|---|---|
| 6,466,125 B1 | 10/2002 | Richards et al. |
| 6,469,628 B1 | 10/2002 | Richards et al. |
| 6,483,461 B1 | 11/2002 | Matheney et al. |
| 6,489,893 B1 | 12/2002 | Richards et al. |
| 6,492,206 B2 | 12/2002 | Hawley et al. |
| 6,492,904 B2 | 12/2002 | Richards |
| 6,501,393 B1 | 12/2002 | Richards et al. |
| 6,504,483 B1 | 1/2003 | Richards et al. |
| 6,512,455 B2 | 1/2003 | Finn et al. |
| 6,606,350 B2 * | 8/2003 | Dress et al. .................. 375/213 |
| 6,614,384 B2 | 9/2003 | Hall et al. |
| 6,937,646 B1 | 8/2005 | McCorkle |
| 6,975,665 B1 * | 12/2005 | McCorkle .................... 375/130 |
| 7,170,951 B1 | 1/2007 | Perthold et al. |
| 7,428,258 B2 | 9/2008 | Fullerton et al. |

OTHER PUBLICATIONS

Office Action for U.S. Appl. No. 10/686,814, mailed Dec. 17, 2007, 28 pgs.

\* cited by examiner

METHOD AND APPARATUS FOR GENERATING RF WAVEFORMS HAVING AGGREGATE ENERGY WITH DESIRED SPECTRAL CHARACTERISTICS

CROSS-REFERENCE TO RELATED APPLICATIONS

This application is a continuation of, and claims priority to U.S. application Ser. No. 10/686,814, filed Oct. 17, 2003, now granted U.S. Pat. No. 7,428,258, which claims priority to U.S. Provisional Application No. 60/419,459, filed Oct. 17, 2002; U.S. Provisional Application No. 60/432,435, filed Dec. 11, 2002, and U.S. Provisional Application No. 60/460,165, filed Apr. 3, 2003, all of which are incorporated herein by reference.

FIELD OF THE INVENTION

The present invention generally relates to communication systems. More specifically, the present invention relates to generating RF waveforms having desired spectral characteristics.

BACKGROUND OF THE INVENTION

Known communications systems and networks allow wireless devices to communicate information over radio frequency (RF) channels. Such wireless systems, networks, and devices offer many advantages in terms of making information ubiquitously available and easily accessible in various business and personal applications. Recognizing the benefits associated with wireless communication of information, governmental agencies responsible for frequency spectrum allocation have allocated specific frequency bands for such use. For example, in the US, the Federal Communications Commission (FCC) in a 1985 ruling made portions of the spectrum previously designated for military use, namely, in the 915 MHz, 2.4 GHz bands available and designated them as Industrial, Scientific and Medical (ISM) bands for communicating information without a license. In addition, the FCC allocated portions of the 5 GHz spectrum as the Unlicensed National Information Infrastructure (UNII) band. Making these portions of the frequency spectrum available for unlicensed use has resulted in proliferation of many types of wireless communication devices ranging from wireless telephones to devices that operate within wireless local-area networks (WLANs). Of course, the unlicensed use of the allocated portions of the spectrum remains subject to FCC regulation, which specifies the rules governing the operational requirements within the allocated bands. The operational requirements are generally defined in terms of allocated spectra and transmission or emission power levels.

Based on the rules promulgated by designated governmental agencies, standardization bodies throughout the world, including ANSI, IEEE, and ISO, have developed various standards that specify the requirements for ensuring interoperability amongst devices offered by different manufacturers. For example, the ANSI/IEEE 802.11 standard defines a protocol for compatible interconnection of data communication equipment via the air, radio, or infrared at specified data rates in local area networks, using a carrier sense multiple access protocol with collision avoidance (CSMA/CA) medium sharing mechanism. The IEEE 802.11 standard, which is hereby incorporated by reference, also specifies a medium access control (MAC) layer that supports operations under control of an access point as well as between independent remote stations. Amongst the functions performed by the 802.11-specified MAC layer are authentication, association, re-association services, encryption/decryption procedures, power management, and point coordination functions for power coordination.

Other standards known as IEEE 802.11a and IEEE 802.11b, which are also hereby incorporated by reference, define higher speed physical (PHY) layer extensions in the 5 GHz UNII band and 2.4 GHz ISM band, respectively. The respective PHY layer standards specify the interface with the 802.11 MAC layer as well as modulation techniques for transmitting information within the allocated bands.

The provisions of the IEEE 802.11, 802.11a and 802.11b standards have now become the blueprints for building local, regional and even nationwide WLANs. These types of WLANs are proliferating to provide high-speed wireless internet access in such places as airports, hospitals, coffee shops, etc. Each WLAN provides wireless communications among a plurality of devices, including an access point as well as remote stations that are situated within a common area. Generally, each mobile and access point device, which functions as an interface between a wireless and a wired network, is equipped with a network interface card (NIC) that incorporates MAC and PHY layer circuitry as well as radio frequency circuitry, including antenna circuitry. Other standards at various stages of development include the 802.11g and HiperLAN/2 standards that provide additional features such as higher data rates and wireless voice over IP capabilities. Also defined are provisions to provide capabilities amongst mobile wireless stations operating within a plurality of adjacent wireless LANs through access points roaming that provide communication coverage for designated areas. This proliferation of wireless devices that operate in the allocated bands and coexistence among the many wireless systems and devices has placed substantial burden on the available frequency bands in terms of congestion and interference.

Bandwidth availability has therefore become an important factor in proliferation and use of wireless devices. Historically, bandwidth availability, which is regulated by governmental agencies, has been constrained primarily because of technological factors. Data rate throughput is an important parameter in the design of wireless systems. Data rate throughput capability varies proportionally with available bandwidth but only logarithmically with the available signal to noise ratio (SNR). To achieve high capacity data rate systems within a constrained bandwidth, complex signal modulations techniques have been used. Unfortunately, use of such modulation techniques may significantly decrease SNR.

Typically in such systems, data rate is lowered, often dynamically, for example, based on a received signal quality criterion, to improve communication reliability. Conversely, high data rates are used with reduced reliability. The principle barrier to high data rate communications in a wireless local-area network is an interference phenomenon called "multi-path." A radio signal commonly traverses many paths as it travels toward a receiver. Multiple propagation paths can be caused by reflections from surfaces in the environment, for example. Some of these paths are longer than others. Therefore, since each version of the signal travels at the same speed, some versions of the signal will arrive after other versions of the signal. Sometimes the delayed signals will interfere with more prompt signals as the delayed signals arrive at the receiver, causing signal degradation.

Recent advances in communications technology have enabled ultra-wideband (UWB) systems, which can be used for communications, radar, and/or positioning. UWB technology holds great promise for a vast array of new applications that provide significant benefits for public safety, business, and consumers. UWB technology is often referred to as impulse radio technology but may employ any of several types of RF waveforms. Some UWB systems and devices operate by employing very narrow or short duration pulses having a small number of cycles (e.g., one or two cycles) that result in transmissions having very large bandwidths on the order of, for example, several GHz. Narrower bandwidth UWB implementations typically involve wider pulses having many cycles (e.g., 25 to 100) that may have bandwidths on the order of, for example, 500 MHz. Generally, with UWB systems, the shorter the pulse duration the larger the bandwidth, and vice versa.

UWB transmitters and receivers can employ numerous data modulation (and demodulation) techniques, including amplitude modulation, phase modulation, frequency modulation, pulse-position modulation (PPM) and M-ary versions of these (e.g., bi-phase, quad-phase, and M-phase modulation).

Various implementations of impulse radio are described in U.S. Pat. Nos. 4,641,317 (issued Feb. 3, 1987), 4,743,906 (issued May, 10, 1988), 4,813,057 (issued Mar. 14, 1989), 4,979,186 (issued Dec. 18, 1990), 5,363,108 (issued Nov. 8, 1994), 5,677,927 (issued Oct. 14, 1997), 5,687,169 (issued Nov. 11, 1997), 5,812,081 (issued Sep. 22, 1998), 5,832,035 (issued Nov. 3, 1998), 5,952,956 (issued Sep. 14, 1999), and 6,133,876 (issued Oct. 17, 2000), and U.S. patent application Ser. Nos. 09/811,326 (filed Jul. 20, 2001), 10/206,648 (filed Jul. 26, 2002), 60/451,538 (filed Mar. 3, 2003), and 10/436, 646 (filed May 13, 2003), all of which are assigned to the assignee of the present invention and are incorporated herein by reference.

It has been recognized, however, that the benefits of UWB technology could be outweighed by its potential to cause harmful interference, particularly with other important radio operations, such as licensed services. It has also been shown that, under suitable operating restrictions, UWB devices may operate using portions of the frequency spectrum occupied by existing radio services without causing harmful interference, thereby permitting scarce spectrum resources to be used more efficiently.

Having recognized the promising benefits and potential for harmful interference associated with UWB technology, governmental agencies in various parts of the world have begun cautiously considering and allocating portions of the frequency spectrum for unlicensed use by UWB devices. For example, the FCC amended Part 15 rules to permit unlicensed operation of UWB devices. In April 2002, the FCC released a First Report and Order in connection with Part 15 revisions (In re: Revision of Part 15 b of the Commission's Rules Regarding Ultra-Wideband Transmissions systems (ET Docket 98-153), FCC 02-48 document, which is hereby incorporated by reference.)

At the present time, work is in progress for developing standards for exploiting UWB technology. One such effort is by an IEEE working group under IEEE 802.15. Information for obtaining all published documents of the IEEE standard setting body may be obtained by visiting the IEEE website, www.ieee.com. Briefly, these UWB standards will apply to UWB devices operating in shared or in non-government frequency bands, including UWB devices operated by U.S. Government agencies. In general, the FCC rules establish corresponding technical standards and operating restrictions for various types of UWB devices mainly based on their potential to cause interference. For example, outdoors use of UWB devices are currently restricted to certain imaging systems, hand held devices, and vehicular radar systems that operate with very low power. In fact, UWB devices with potential for use in high power applications, such as wide-area mobile radio services, are not permitted to operate.

The rules governing operational restrictions are generally specified in terms of allocated spectrum, minimum bandwidth, and emission limitations for each UWB device type. The rules divide the frequency spectrum into sub-spectrums, with each sub-spectrum being subject to corresponding operational and emission limitations based on the type of the UWB device. For example, ground penetrating radar (GPR) and wall imaging systems are permitted to operate in the 3.1-10.6 GHz frequency band and through-wall imaging systems are permitted to operate in the 1.99-10.6 GHz frequency band. Surveillance systems are permitted to operate in the 1.99-10.6 GHz frequency band, and medical systems must operate in the 3.1-10.6 GHz frequency band. Communication devices are permitted to operate in the 3.1-10.6 GHz frequency band.

The frequency band of operation of UWB devices is based on the $-10$ dB bandwidth of the UWB emission. For example, the FCC rules define a UWB device as any device where the fractional bandwidth is greater than 0.20 or has a minimum bandwidth of 500 MHz, i.e., occupies 500 MHz or more of spectrum.

At least initially, the adopted rules are significantly stringent. However, the FCC has acknowledged that the initial rules are extremely conservative and may change in the future as more and more data is collected regarding UWB emissions. For example, in order to limit unwanted emissions from UWB devices, the FCC has initially adopted more conservative limits than those imposed on other Part 15 devices. Taking into account lack of experience with UWB devices, FCC rules regarding UWB emission limits are defined in terms of a reduction to the Part 15 general emission levels over defined frequency bands to ensure that UWB devices have the least possible impact to authorized radio services. Moreover, the emission limits are also designed to ensure that harmful interference from the cumulative effect of multiple UWB devices is minimized.

The following table specifies the average emission limits in terms of dBm EIRP as measured with a one megahertz resolution bandwidth for UWB operation.

| Frequency Band (MHz) | Imaging below 960 MHz | Imaging, Mid-Frequency | Imaging, High frequency | Indoor applications | Hand held, including outdoor | Vehicular radar |
| --- | --- | --- | --- | --- | --- | --- |
| 0.009-960 | §15.209 | §15.209 | §15.209 | §15.209 | §15.209 | §15.209 |
| 960-1610 | −65.3 | −53.3 | −65.3 | −75.3 | −75.3 | −75.3 |
| 1610-1990 | −53.3 | −51.3 | −53.3 | −53.3 | −63.3 | −61.3 |
| 1990-3100 | −51.3 | −41.3 | −51.3 | −51.3 | −61.3 | −61.3 |
| 3100-10600 | −51.3 | −41.3 | −41.3 | −41.3 | −41.3 | −61.3 |
| 10600-22000 | −51.3 | −51.3 | −51.3 | −51.3 | −61.3 | −61.3 |

-continued

| Frequency Band (MHz) | Imaging below 960 MHz | Imaging, Mid-Frequency | Imaging, High frequency | Indoor applications | Hand held, including outdoor | Vehicular radar |
|---|---|---|---|---|---|---|
| 22000-29000 | −51.3 | −51.3 | −51.3 | −51.3 | −61.3 | −41.3 |
| Above 29000 | −51.3 | −51.3 | −51.3 | −51.3 | −61.3 | −51.3 |

FCC rules also allow for the use of various forms of modulation as long as the UWB devices comply with all of the technical standards defined by the rules. Thus, as long as the transmission system complies with the fractional bandwidth or minimum bandwidth requirements at all times during its transmission, it is permitted to operate under the UWB regulations. It is up to the manufacturers of UWB devices to determine how they will comply with the UWB standards.

The above-mentioned combinations of technical standards and operational restrictions are designed to ensure that UWB devices coexist with licensed radio services without the risk of harmful interference. Clearly, the FCC-promulgated rules are extremely complex, applying numerous detailed standards and restrictions to different types of UWB devices based on their potential to cause harmful interference. In particular, FCC rules have been tailored to protect sensitive portions of the US spectrum from possible UWB interference, e.g., the global positioning service (GPS) band. These requirements for different UWB emission levels at different portions of the spectrum in effect creates a "frequency mask" to which UWB devices must be designed.

Additionally, other countries have their own sets of detailed and complex spectrum management rules. UWB emission standards established by regulating agencies in other countries will likely have provisions tailored to protect sensitive portions of their spectrum. Because spectrum allocation and emission standards vary in different regions of the world, UWB rules and restrictions are also likely to vary substantially from region to region. In other words, each country or region will have its own frequency mask. Furthermore, the various frequency masks established for the various countries and regions are subject to change over time.

Making matters even more complicated is the desire by some manufacturers to protect investments in systems that operate under already defined IEEE standards discussed above, which are not subject to FCC Part 15 rules. Indeed, in some cases, UWB emissions restrictions imposed by such non-FCC standards may be even more stringent than FCC requirements. Such non-FCC-imposed restrictions must also be taken into account when designing UWB devices. Accordingly, because frequency masks to which UWB devices must be designed will vary from country to country and because these masks are subject to change as government and industry emission standards evolve, there is a need for UWB devices that have the flexibility to vary their emissions to meet the various UWB spectral requirements.

Moreover, the cost of UWB devices is increasingly becoming a critical factor as the use of wireless devices permeates to create a consumer base that constantly strives for smaller devices having long battery life. The cost concern becomes even more prevalent if multi-national manufacturers are to maintain multiple inventories of devices that cover different applications and meet country-specific emission requirements. Therefore, there exists a need for UWB devices capable of efficiently and cost effectively operating under the various frequency masks.

Generally, RF transmission of information requires the creation of an RF carrier in the transmitter that is modulated with the information. RF reception requires "mixing" the incoming modulated carrier for demodulation and recovery of the transmitted information. Known narrowband systems use fixed-frequency sources for transmission and reception. However, UWB systems require sources that generate frequencies at a rate on the order of the information rate. One known UWB system is disclosed in the U.S. Pat. No. 6,026,125, entitled "Waveform Adaptive Ultra-Wideband Transmitter," issued to Larrick et al. Other prior art methods use fast switching phase locked loops (PLLs), super heterodyne frequency shifting, and frequency-tracking filters for generating fixed frequencies at a high rate. However, the implementation of such methods requires complex circuitry, with limitations that makes them difficult to build on integrated circuits (ICs). A fast-switching PLL needs a low-jitter voltage-controlled oscillator (VCO) that can be tuned to a new frequency very quickly. Generating low-jitter VCO output at high rate is not easy to accomplish and leads to complex, power consuming circuitry. Moreover, highly linear mixers with wide dynamic ranges are needed for super heterodyne frequency conversion. Such linear mixers require precision components to achieve balanced operation, which makes them difficult to integrate. Frequency-tracking filters, preferably, containing tunable passive or reactive components, (e.g., capacitors and inductors), are also needed to change the frequency of operation. It is well known that passive or reactive components are also difficult to integrate. The requirement for rapidly tunable filters further complicates integration.

Primarily, integrated circuit implementation that meets the above-described requirement should be simple to implement, inexpensive to produce, and consume as little power as possible. Consequently, it is necessary to reduce the number of components, particularly those components that are difficult to integrate with other active circuitry. Further, the cost effective circuit integration requires accounting for component variations both across a single IC as well as from batch to batch.

SUMMARY OF THE INVENTION

Briefly, the present invention relates to a method and system that emulates a desired waveform by producing a time profile of the desired waveform, which is characterized by a plurality of sample values, and generating a plurality of RF waveforms, each RF waveform of the plurality of RF waveforms having polarity and scaled energy based on a corresponding one of the plurality of sample values, to produce an aggregate RF energy having spectral characteristics that approximate the spectral characteristics of the desired waveform. Scaling, in accordance with the present invention, is to pattern, make, set, regulate, or estimate the energy of each RF waveform of the plurality of RF waveforms according to a corresponding sample value of the plurality of sample values relative to a reference value. In one embodiment, the reference value corresponds to the maximum sample value of the plurality of sample values. As such, the present invention addresses the above described needs by generating a plurality of RF waveforms based on the time profile of the desired waveform, where the desired waveform corresponds to a prototype signal that the plurality of RF waveforms emulate.

In an exemplary embodiment, each of the plurality of RF waveforms has a waveform type, such as an impulse, gaussian pulse, doublet pulse, triplet pulse, step pulse, triangle pulse, sawtooth pulse, or burst of cycles, and the bandwidth of each of the plurality of RF waveforms spans a frequency band of interest. In accordance with the invention, the polarity of each RF waveform corresponds to the polarity of a corresponding one the plurality of sample values, and the energy of each RF waveform of the plurality of RF waveforms is scaled by varying at least one of amplitude, width or waveform type based on the value of a corresponding one of the plurality of sample values relative to the maximum value of the plurality of sample values. In one embodiment, each RF waveform of the plurality of RF waveforms can have substantially the same width, with the polarity and amplitude of each RF waveform being determined based on the value of a corresponding one of the plurality of sample values relative to the maximum value of the plurality of sample values. In an alternative embodiment, each of the plurality of RF waveforms can have substantially the same amplitude, with their polarities and widths being determined based on the value of a corresponding one of the plurality of sample values relative to the maximum value of the plurality of sample values. In another embodiment, both the width and amplitude can be determined based on the value of a corresponding one of the plurality of sample values relative to the maximum value of the plurality of sample values. In a further embodiment, the width and amplitude are determined such that a defined amplitude/width ratio is maintained for each RF waveform of the plurality of RF waveforms. In still another embodiment, the waveform type, or shape, of each RF waveform can be varied in order to achieve the appropriate energy scaling. For example, the number of cycles in RF waveforms comprising bursts of cycles can be varied.

Preferably, the plurality of the RF waveforms is generated according to the timing of the sampling of the time profile. Under one arrangement that is applicable for certain types of RF waveforms, e.g., doublet pulses, the timing of the plurality of RF waveforms can correspond to a zero crossing or a crest of each RF waveform. Alternatively, the timing of the plurality of RF waveforms can correspond to an arbitrarily selected location of each RF waveform, for example, the beginning of each RF waveform. As such, the time spacing between the generated RF waveforms corresponds to the time spacing between the samples of the time profile. The timing of the plurality of RF waveforms can define a desired center frequency within the frequency band of interest. Moreover, the timing of each RF waveform of the plurality of RF waveforms can be dithered. The time dithering can be pseudorandom and can be in accordance with a code. In one embodiment, the timing of each RF waveform of the plurality of RF waveforms is dithered to suppress at least one harmonic of the fundamental spectra of the desired waveform.

In an exemplary embodiment, the timing of the plurality of sample values can correspond to a Nyquist sampling rate at a frequency within the frequency band of interest. Alternatively, the sampling rate can be greater than or less than the Nyquist sampling rate, including multiples or fractions thereof.

According to some of the more detailed features of the present invention, the time profile can be produced by an inverse Fourier transformation of the frequency profile of the desired waveform.

The frequency profile can be defined by frequency, phase, and amplitude parameters where amplitude or phase is maintained constant over a specified bandwidth. The frequency profile can include spectral artifacts including a notch, spike, or roll off within the frequency band of interest and can correspond to a mask such as the one defined by the FCC to regulate UWB transmissions. The frequency profile can be produced by a Fourier transformation of a vector amplitude profile of the desired waveform.

In one exemplary embodiment, the vector amplitude profile can comprise x, y, z, t, amplitude, and vector polarization angle parameters, where x, y, and z correspond to location coordinates, and where one or more parameters of the x, y, z, t, amplitude, and vector polarization angle parameters is maintained constant over time to define a signal amplitude and polarization at one of a point, line, plane, and surface in space relative to a position, for example, a transmit antenna position.

The duration of the time profile can be selected to correspond to the bandwidth of the desired waveform. In one embodiment, the duration of the time profile can be selected to correspond to the bandwidth of the fundamental spectra and each one of a plurality of harmonics of the fundamental spectra present in the aggregate RF energy.

In an exemplary embodiment, the desired waveform can correspond to an enveloped sine wave signal having a carrier frequency that corresponds to the center frequency within the frequency band of interest. The envelope shape of the sine wave signal can be selected from a cosine, raised cosine, trapezoid, and rectangle, among others. The time profile, including its peak amplitude, can be programmable to produce a desired envelope shape. The time profile can have a shifted average DC level. In one embodiment, the average DC level is shifted such that each of the plurality of sample values has the same polarity. Under one arrangement, a DC component can be removed from the aggregate RF energy by a filter.

Under another arrangement, the time profile of the desired waveform can correspond to the time profile of a plurality of orthogonal waveforms. The plurality of orthogonal waveforms can comprise orthogonal waveforms that are orthogonal when arriving at different times at a receiver. The orthogonal waveforms can have the same power spectral density profile, but their phase profiles across a frequency span can cause the plurality of orthogonal waveforms to be orthogonal. For example, the phase of a first orthogonal waveform can correspond to the phase of a second orthogonal waveform rotated an even multiple of $2\pi$ radians across its bandwidth. Alternatively, the plurality of orthogonal waveforms can have phase shifts in accordance with a plurality of Walsh functions. The plurality of orthogonal waveforms can also comprise n orthogonal waveforms phase shifted by 0 or $\pi$ radians in accordance with a plurality of n-bit Walsh functions. Additionally, a first orthogonal waveform of the plurality of orthogonal waveforms can be the Hilbert transform of a second orthogonal waveform of the plurality of orthogonal waveforms. Each orthogonal waveform of the plurality of orthogonal waveforms can also be an $n^{th}$ order derivative of a first orthogonal waveform of the plurality of orthogonal waveforms.

In another exemplary embodiment, the time profile of the desired waveform can be modulated in accordance with at least one of an information signal and a code. The time profile of the desired waveform can be time limited and can be frequency limited.

Moreover, the aggregate energy spectra of the plurality of RF waveforms can be limited to the frequency band of interest, for example, via a filter. Under one arrangement, one or more filters can be used to select the fundamental spectra, one or more harmonics, or one or more fold images. The one or more harmonics and/or one or more fold images can be selected in accordance with a code, which defines a communications channel, and can be selected in accordance with an information signal as a form of modulation.

According to one embodiment, the plurality of RF waveforms is generated in one or more groups, with each group comprising two or more RF waveforms having a predefined time spacing. Under this arrangement, one RF waveform in each group can be inverted to selectively eliminate a fold image in the frequency band of interest. In a more specific implementation, the frequency of the fold image corresponds to the generation rate of the plurality of RF waveforms, with the predefined time spacing corresponding to one fourth of the period of the frequency of a fold image.

Each of the plurality of RF waveforms can be separately generated as one of a plurality of digital waveforms or a plurality of analog waveforms. The plurality of analog waveforms can be generated in response to one or more digital signals of a plurality of digital signals that are stored in a memory.

According to another aspect of the invention, a method for generating waveforms includes generating a plurality of RF waveforms at a waveform generation rate selected in accordance with a center frequency within a frequency band of interest and modulating the plurality of RF waveforms in accordance with a time profile of a prototype signal to produce an aggregate RF energy that approximates the prototype signal. The plurality of RF waveforms can be amplitude and/or width modulated in accordance with the time profile to produce the desired aggregate RF energy.

According to yet another aspect of the present invention, a waveform generator includes a signal generator that generates a plurality of time spaced RF waveforms at a waveform generation rate. The amplitude and/or width of each of the plurality of time spaced RF waveforms is in accordance with a desired envelope. An optional filter limits the aggregate RF energy of the plurality of time spaced RF waveforms to within a frequency band of interest.

A first signal generator and a second signal generator can be used to generate a first and second plurality of RF waveforms, with a defined time spacing between each of the second plurality of ed RF waveforms and a corresponding one of the first plurality of RF waveforms. The first and second plurality of RF waveforms are amplitude and/or width modulated in accordance with the desired envelope. Under one arrangement, the defined time spacing corresponds substantially to one fourth of the period of the frequency of a fold image to be eliminated.

The signal generator can include a constant amplitude (or width) signal generator that generates a plurality of constant amplitude (or width) time spaced signals, and an amplitude (or width) modulator that modulates the plurality of constant amplitude (or width) time spaced signals to produce the plurality of time spaced RF waveforms. Alternatively, the signal generator can include a variable amplitude (or width) signal generator that separately generates each of said plurality of time spaced RF waveforms. The amplitudes (or widths) of each of the plurality of variable time spaced RF waveforms can be digitally represented in terms of quantized amplitude (or width) representations stored in a memory. In one embodiment, the representations are normalized. The quantized amplitude (or width) representations can then be retrieved from the memory to be applied to a digital to analog converter.

The signal generator can include a variable amplitude variable width signal generator that separately generates each of said plurality of time spaced RF waveforms where both amplitude and width can vary. The amplitudes and widths of the plurality of time spaced RF waveforms can be digitally represented in terms of quantized amplitude and width representations stored in a memory. In one embodiment, the representations are normalized. The quantized amplitude and width representations can then be retrieved from the memory to be applied to a digital to analog converter.

BRIEF DESCRIPTION OF THE DRAWINGS

The present invention will be described with reference to the accompanying figures, wherein.

DETAILED DESCRIPTION OF THE INVENTION

Foreword

Figure 1:
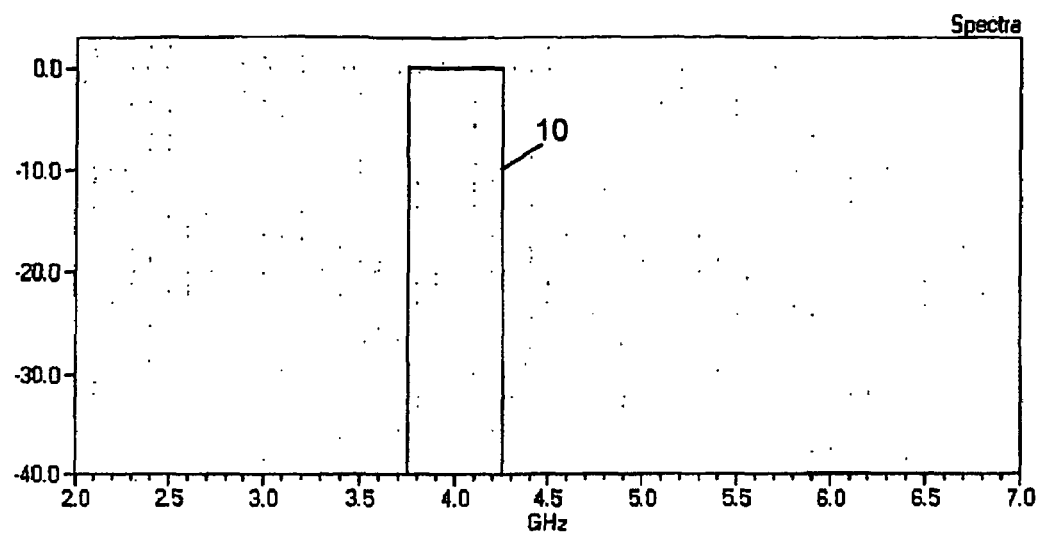
FIG. 1 illustrates an exemplary frequency band of interest.

The invention described herein is believed to be a truly pioneering invention that can be likened to the discovery of Calculus. As Calculus made complex mathematical abstraction possible, the current invention makes the generation of RF waveforms having desired spectral characteristics possible. It is believed, that as Calculus enabled an entirely new mathematical paradigm, the present invention enables an entirely new paradigm in radio communications.

Applications of the Present Invention

The present invention can be used to produce RF waveforms compatible with any type of narrowband, wideband or ultra-wideband device. Such devices include, but are not limited to, those that produce multi-band, pulse, RF burst, and continuous RF signals. An exemplary system in accordance with the present invention can be used in various types of UWB communication devices where one or more aspects of an UWB waveform is modulated such as its amplitude, phase, frequency, or position in time. UWB-enabled communications may involve tethered or un-tethered implementations. For example, UWB transmitters, receivers, and/or transceivers can be used to provide wireless communications between a set-top box and a portable television, where the set-top box receives television signals via a cable infrastructure that are conveyed via UWB devices to the portable television. Information may also be conveyed from the portable television to the set-top box. Similarly, UWB devices can be used to provide communications between a network hub and a portable laptop personal computer or a personal digital assistant (PDA) device. Generally, UWB devices can be used to convey analog and/or digital information between tethered and un-tethered devices such as computers, printers, cameras, sensors, phones, gaming devices, PDAs, home appliances, meters, etc. Examples of various applications involving UWB communications may be found in U.S. Pat. Nos. 6,351,652, 6,354,946, 6,492,904, and 6,512,455 and U.S. patent application Ser. Nos. 09/407,115, 09/436,234, 09/501,372, 09/694,647, 09/709,867, 09/750,822, and 10/225,298, all of which are assigned to the assignee of the present invention and are incorporated herein by reference.

An exemplary system in accordance with the present invention can be used in various types of radar devices. Examples of UWB radar devices include ground penetrating radar (GPR), wall imaging, through-wall surveillance, medical imaging devices, and vehicular radar systems. Usually, GPR operates in contact with, or within close proximity to, the ground. Objects such as pipes, rocks, minerals, oil, etc. are detected by emitting pulses into the ground and evaluating signal reflections, or returns, received from the objects. Wall-imaging systems are designed to detect the location of objects contained within a "wall," such as a concrete structure, the side of a bridge, or the wall of a mine. Surveillance systems operate as "security fences" by establishing a stationary RF perimeter field and detecting the intrusion of persons or objects in that field. A medical imaging system may be used for a variety of health applications to "see" inside the body of a person or animal. Vehicular radar devices are able to detect the location and movement of objects near a vehicle, enabling features such as near collision avoidance, improved airbag activation, and suspension systems that better respond to road conditions. Generally, UWB radar operates by transmitting pulses and detecting a signal reflecting off an object after one or more predetermined time delays corresponding to one or more distances from the UWB transmitter to the object and from the object to the UWB receiver. UWB radar may be mono-static or bi-static meaning the transmitter and receiver may be in the same location or in separate locations. Bi-static implementations may also involve multiple transmit antennas and/or multiple receive antennas. Examples of various applications involving UWB radar may be found in U.S. Pat. Nos. 6,177,903, 6,218,979, 6,462,701, and 6,614,384, and U.S. patent application Ser. Nos. 09/998,480, and 10/083,191, all of which are assigned to the assignee of the present invention and are incorporated herein by reference.

An exemplary system in accordance with the present invention can be used in various types of positioning systems. Examples include systems for tracking assets such as cargo, inventory, or luggage, systems for tracking emergency personnel such as firemen, and systems for tracking persons or objects within a mall, amusement park, grocery store, etc. Such systems typically involve reference impulse radios having known positions and mobile impulse radios attached to an asset, object, person or animal. Various architectures can be employed involving simplex or duplex communications between the reference and mobile radios where the three dimensional location of a mobile radio can be determined relative to known positions of the reference radios to within a few centimeters. Examples of various UWB positioning systems, architectures, and applications may be found in U.S. Pat. Nos. 6,133,876, 6,111,536, 6,300,903, and 6,483,461 and U.S. patent application Ser. Nos. 09/511,991, 09,619,295, 09/642,892, 09/694,151, and 09/710,679, all of which are assigned to the assignee of the present invention and are incorporated herein by reference.

UWB systems may also involve a combination, or fusion, of communications, radar, and/or positioning location and tracking (PLT) capabilities where a single UWB transceiver is used for all needed functions. For example, an UWB-enabled robot may employ UWB radar to detect objects within its proximity. An UWB-enabled object, such as a robot, may be controlled based on its position relative to reference radios and may receive commands and transmit information such as sensor data using UWB communications. Examples of UWB systems involving the fusion of communications, radar, and/or PLT may be found in U.S. Pat. Nos. 6,466,125, 6,469,628, 6,489,893, 6,492,206, 6,501,393, and 6,504,483 and U.S. patent application Ser. Nos. 09/710,679, 09/760,922, 09/873,439, and 09/873,968, all of which are assigned to the assignee of the present invention and are incorporated herein by reference.

Because UWB (and non-UWB) devices may be employed in such a wide variety of applications, the present invention is intended to generate a wide variety of RF waveforms having a wide variety of spectral characteristics, for example, to accommodate government rules and regulations, industry standards, and application-specific requirements. In compliance with FCC rules, through-wall imaging systems and surveillance systems made in accordance with the present invention may operate with a minimum bandwidth within the 1990-10,600 MHz frequency band while higher frequency imaging devices and hand held devices might operate within the 3100-10,600 MHz frequency band. Similarly, vehicular radar systems may operate within the 22-29 GHz frequency band and with a carrier frequency greater than 24.075 GHz. However, any other suitable device type, requiring different spectral characteristics may operate in accordance with the present invention.

In an exemplary system, the bandwidth is determined based on $-10$ dB emission points and the center frequency of the UWB emission. However, depending on other considerations, including practicality and measurement accuracy, emission points may be set at any suitable level, e.g., $-5$ dB or $-15$ dB. In an exemplary embodiment, the UWB devices operating within the system have a fractional bandwidth or a minimum bandwidth. The fractional bandwidth is defined by $2(fH-fL)/(fH)$, where fH is the upper frequency of the specified emission point and fL is the lower frequency of the specified emission point. The center frequency of the transmission is determined based on the average of the upper and lower of the specified emission points, i.e., $(f_H+f_L)/2$. It should also be noted that in some UWB systems, there is no clear center frequency as with other modulation techniques, such as AM and FM. Furthermore, the shape of the transmitted spectrum may be significantly modified by the frequency response of the antenna such that even the carrier frequency, where employed, may not represent the center frequency.

For the purpose of discussion, the fractional bandwidth is selected to be greater than 0.20 and the minimum bandwidth is selected to be greater than or equal to 500 MHz. In other words, the UWB devices transmit signals that occupy 500 MHz or more of the allocated spectrum. However, it should be noted that depending on application, any other suitable fractional bandwidth ranges, e.g., 0.15, 0.17, 0.25, may be used. Also, the minimum bandwidth may be set to other values, ranging from tens or hundreds of MHz to a few GHz. It should be noted that transmission systems are not precluded from UWB definition simply because the bandwidth of the emission is due to a high-speed data rate instead of the width of the pulse or impulse.

Emission limits in the system of the present invention are based on the equivalent of a power spectral density, i.e., a field strength limit is specified along with a measurement bandwidth. Preferably, the radiated limits below 1 GHz are based on measurements employing a quasi-peak detector that effectively provides an average reading with some weighting for peak signal levels. The radiated emissions limits for both intentional and unintentional radiators above 1 GHz are based on measurements using an average detector. However, intentional radiators may also be subject to a requirement that the total peak levels of emissions above 1 GHz be no greater than a specified level, e.g., 20 dB above the average limits.

An exemplary system according to the present invention supports emission limits for various portions of the allocated UWB spectrum in absolute terms or in relative terms. In one embodiment, the relative terms corresponds to specified emission limits, e.g., the general emissions limits of the FCC Part 15. For example, some types of UWB devices, e.g., GPRs, may operate with the specified minimum bandwidth below 960 MHz at the Part 15 general emission limits while attenuating emissions in the 960-1610 MHz below the general limits by a defined amount, e.g., 24 dB. Furthermore, the present invention supports high level attenuation of narrowband emissions in the GPS below the general limits by large amounts, e.g., 34 dB. Emissions in the 1610-1990 MHz may be attenuated below the general limits by yet another amount, e.g. 12 dB, while emissions above 1990 MHz may be attenuated below the general limits by still another amount, e.g., 10 dB. Other UWB device type, e.g., handheld devices, can operate within the band from 3100 MHz to 10,600 MHz at the Part 15 general emission limits, while ensuring emissions below 960 MHz do not exceed the general limits and emissions in the 960-1610 MHz band are attenuated below the general limits by specified levels, e.g., 24 dB. Again, narrowband emissions in the GPS band can be attenuated below the general limits by larger degrees, e.g., 34 dB to protect GPS devices. In short, the present invention can support a wide variety of emission limits for specified UWB device types within different frequency bands for indoor and outdoor applications.

Still another type of UWB device, for example, vehicular radar systems, operates with the specified minimum bandwidth within the 22-29 GHz band and with the center frequency and the frequency at which the maximum emission occurs both located above 24.075 GHz. According to this embodiment, emissions below 960 MHz do not exceed the general limits, emissions in the 960-1610 MHz band are attenuated below the general limits by 34 dB; narrowband emissions in the GPS bands are attenuated below the general limits by 44 dB; emissions in the 1610-22,000 MHz band and in the band above 3.1 GHz are attenuated below the general limits by 20 dB; and emissions between 29 GHz and 31 GHz are attenuated below the general limits by 10 dB.

The present invention may be used with any type of narrowband, wideband or ultra-wideband device, including but not limited to the types of UWB devices described above. Such devices include, but are not limited to, those that produce multi-band, pulse, RF burst, and continuous RF signals. Exemplary embodiments that may use the waveform generation technique of the present invention may employ any type of modulation including, but not limited to, frequency, amplitude, phase, position (e.g., PPM), Single Side Band (SSB), Double Side Band (DSB) or other types of modulation. However, it should be noted that modulation is not required for practicing the invention. Also, the present invention may be used in systems that utilize a wide variety of multiple access methods, such as FDMA, CDMA, TDMA, or any combination thereof.

Emulation of Desired Waveform

According to one aspect, the present invention relates to a system and method that emulate a desired waveform. The present invention emulates the desired waveform by generating a plurality of RF waveforms having aggregate energy that approximates the energy of the desired waveform to meet a wide range of spectral requirements including those of exemplary applications given above. Such requirements may be defined in terms of a mask and be characterized by various energy level or power emission distributions across a desired frequency spectrum. In one exemplary embodiment, the RF waveforms generated in accordance with the present invention together have a bandwidth of at least 500 MHz within a frequency band spanning from 1.9 GHz to 10.6 GHz, as defined by the now amended FCC Part 15 requirements.

The desired waveform has a time profile that can be characterized by a plurality of sample values. The polarity of each generated RF waveform of the plurality of RF waveforms is in accordance with the plurality of a corresponding one of the plurality of sample values of the time profile. The energy contained in each generated RF waveform of the plurality of RF waveforms is scaled according to a corresponding one of the plurality of sample values of the time profile to produce an aggregate RF energy that approximates the spectral characteristics of the desired waveform. In other words, the present invention emulates the desired waveform to fill a spectrum within a frequency band of interest with aggregate RF energy that approximates the spectral characteristics of the desired waveform.

The energy of each RF waveform can be scaled by patterning, making, setting, regulating, representing or estimating the energy of each RF waveform of the plurality of RF waveforms according to a corresponding sample value of the plurality of sample values relative to a reference value. For example, the reference value can corresponds to the maximum sample value of the plurality of sample values. For scaling purpose, the sample values may be normalized against the maximum sample value. The energy of each RF waveform can be scaled by varying one or any combination of the width, amplitude or type of the RF waveform. As herein described, the term amplitude can represent voltage or current.

In an exemplary embodiment, the present invention achieves the desired spectral characteristics by scaling the root mean squared (RMS) amplitudes of each of the plurality of RF waveforms, where the timing of the sample values of the time profile corresponds to the nominal timing of the generated plurality of RF waveforms. According to the present invention, the RMS amplitude of each RF waveform may be scaled by varying the width, amplitude and/or type of the waveform where the amplitude can be voltage or current.

In one embodiment, the time profile is sampled at the Nyquist rate, which is two times the carrier frequency. In another embodiment of the invention, the time profile is sampled at a rate greater than the Nyquist rate, for example, 2× Nyquist. In a further embodiment, the time profile is sampled at a rate less than the Nyquist rate, which is referred to by the inventors as sub-sampling and is described further below. The time profile can also be sampled at any fraction of the Nyquist rate.

It should be noted that the present invention has been simulated using software having variables that control and support analysis of the invention. The software, referred to as the Waveform Synthesis Analyzer, was developed using the Borland Delphi™ programming language to execute under the Windows™ operating system on a Pentium™-based personal computer. Many of the figures included herein were generated using the Waveform Synthesis Analyzer, which is further described later in this specification.

The Desired Waveform

As stated above, the present invention generates a plurality of RF waveforms that emulate a desired waveform. Typically, a transmitted RF signal must have spectral characteristics that fall within allowable spectral boundaries such as spectral requirements defined by government rules and regulations and/or industry standards. Ideally, the transmitted waveform would have a power spectral density (PSD) across a frequency band of interest that is exactly equal to what is permitted by spectral requirements, in which case the transmitted waveform could be referred to as an ideal waveform. However, generating such an ideal waveform using conventional techniques could require complex and expensive circuitry. Consequently, it may be more practical and therefore more desirable to produce a simpler waveform having spectral characteristics similar to those of the ideal waveform, or a part of the ideal waveform, which satisfy spectral requirements instead of exactly meeting them. The inventors refer to such a waveform as the desired waveform. Thus, the desired waveform can be selected to satisfy defined spectral requirements. As such, the desired waveform can be used to define a plurality of RF waveforms that when generated have aggregate energy that approximates the energy of the desired waveform had it been generated. Thus, the aggregate energy spectra of the generated RF waveforms corresponds to the spectral characteristics of the desired waveform.

The Frequency Profile

A frequency profile can be used to characterize spectral requirements and can be defined by frequency, phase, and amplitude parameters. Amplitude or phase parameters can be maintained constant over a specified bandwidth. Typically, phase is held constant. The frequency profile can be characterized by the fundamental spectra of a transmitted waveform (or waveforms), harmonics of the fundamental spectra, and fold images of the fundamental spectra and the harmonics. The frequency profile may include a frequency band of interest. The frequency profile can also include spectral artifacts including a notch, spike, or roll off within the frequency band of interest or it can correspond to a mask such as the one defined by the FCC to regulate UWB transmissions.

FIG. 1 shows an exemplary frequency profile of spectral requirements for a frequency band of interest 10 centered at 4 GHz with a 500 MHz bandwidth. In an ideal case, the transmitted waveform would 'fill the band' such that the PSD of the transmitted signal would be exactly equal to what is permitted by the spectral requirements.

One skilled in the art will recognize that a frequency band of interest may have power limitations that vary across the band. For example, the frequency band in which UWB signals are allowed spans across 1.9 GHz to 10.6 GHz and has various power constraints for different portions of the band, as previously described. Thus, the frequency profile used in accordance with the invention might correspond to a frequency mask such as the FCC mask governing UWB transmissions that spans the 1.9 GHz to 10.6 GHz frequency band or the frequency profile might correspond to a portion of a frequency mask such as the 3.1 GHz to 10.6 GHz portion of the FCC UWB mask to be used by ground penetrating radar systems.

The Time Profile

As stated above, the present invention produces a plurality of RF waveforms based on samples of a time profile of the desired waveform such that the aggregate energy spectra of the plurality of RF waveforms satisfies various frequency and energy profile requirements. In a preferred embodiment, a time profile plots voltage versus time, although a time profile may alternatively plot current, power or energy versus time. A time profile can be produced by an inverse Fourier transformation of a frequency profile or otherwise produced.

Figure 2:
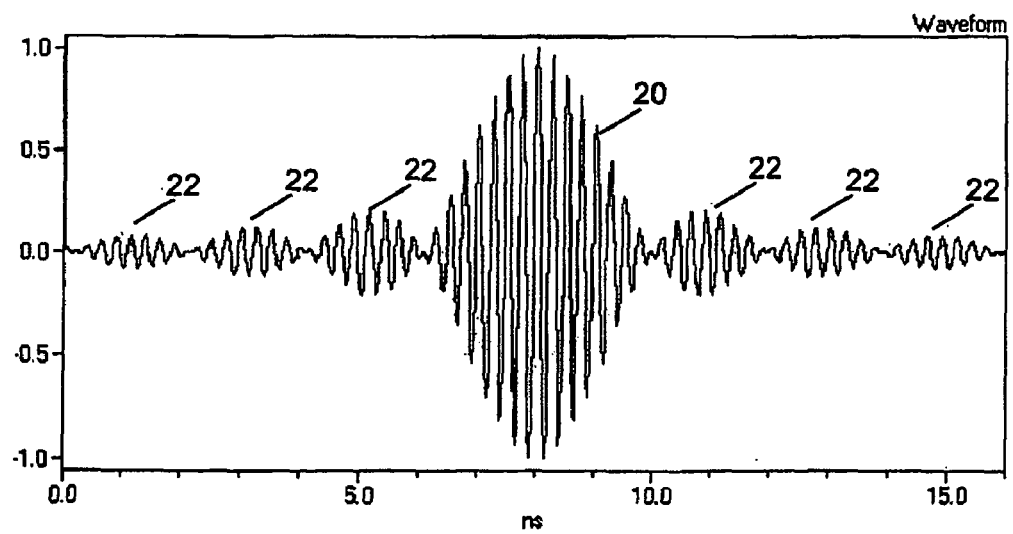
FIG. 2 is a diagram of a time profile of an ideal waveform.

FIG. 2 shows the time profile of an exemplary ideal waveform that substantially fills the frequency band of interest 10 of FIG. 1. The ideal waveform comprises an amplitude-modulated sine wave having a 4 GHz carrier frequency that was produced by an inverse Fourier transformation of the frequency profile of FIG. 1, which has a 4 GHz center frequency. As shown, the ideal waveform has an exemplary envelop comprising a main lobe 20 and a plurality of side lobes 22.

In FIG. 2, the duration of the main lobe 20 is 4 nsec, which roughly corresponds to the 500 MHz bandwidth of the frequency band of interest 10 of FIG. 1. Although FIG. 2 shows six side lobes 22 (three on each side of the main lobe), the ideal waveform has additional smaller and smaller side lobes ad infinitum that are not shown. One skilled in the art would recognize that various other waveforms having suitable time profiles could also be produced that substantially meet numerous frequency profile requirements within any frequency band of interest 10.

Vector Amplitude Profile

In another embodiment, the frequency profile can be produced by a Fourier transformation of a vector amplitude profile of the desired waveform. The vector amplitude profile can comprise x, y, z, t, amplitude, and vector polarization angle parameters, where x, y, and z correspond to location coordinates, and where one or more parameters of the x, y, z, t, amplitude, and vector polarization angle parameters is maintained constant over time to define a signal amplitude and polarization at one of a point, line, plane, and surface in space relative to a position, for example, a transmit antenna position. A frequency profile derived from a vector amplitude profile can then be used to produce a time profile of the desired waveform as previously described.

Prototype Signals

As stated previously, a desired waveform can be generated as a simpler, less expensive alternative to generating an ideal waveform. For example, to substantially fill the 500 MHz frequency band of interest 10 of FIG. 1, a desired waveform may correspond to the main lobe 20 of the ideal waveform of FIG. 2, since the main lobe contains the majority of the energy of the ideal waveform. According to the invention, the desired waveform is modeled using a prototype signal corresponding to the desired waveform. The prototype can be the same as or representative of the desired waveform. In one embodiment of the present invention, a desired waveform is emulated by a plurality of RF waveforms defined by samples of the time profile of a prototype signal corresponding to the desired waveform.

Generally, the bandwidth of the prototype signal is defined by its shape and duration. Its shape also defines the characteristics of its side lobes. Often, it is desirable that the energy of the largest side lobe be 20 to 25 dB below the peak power of the main lobe in order to provide a desirable carrier-to-noise ratio. Furthermore, for channelization purposes, it may be desirable to minimize overlapping of the main lobe into adjoining frequency bands. One skilled in the art will appreciate that certain envelope shapes can have certain advantages over others depending on the conditions under which a signal is to be transmitted and received and that selection of prototype signal characteristics may involve various tradeoffs.

The prototype signal can be a sine wave signal, chirped signal, pulse signal, or any other form of signal that has desired spectral characteristics, including a noise-like signal. If the prototype signal is a sine wave signal, its center frequency is defined by its carrier frequency, whereas alternative forms of a prototype signal may not have a carrier. The shape of the prototype signal may be defined by an envelope although it is not necessary for the prototype signal to be defined by an envelope to practice the invention. A suitable envelope shape might be a half cosine, raised half cosine, trapezoid, rectangle, Gaussian, or any other desired shape. Under the present invention, any suitable combination of carrier frequency, shape and duration may be chosen for a prototype signal to achieve desired spectral characteristics so long as it has spectral energy across the frequency band of interest.

Figure 3:
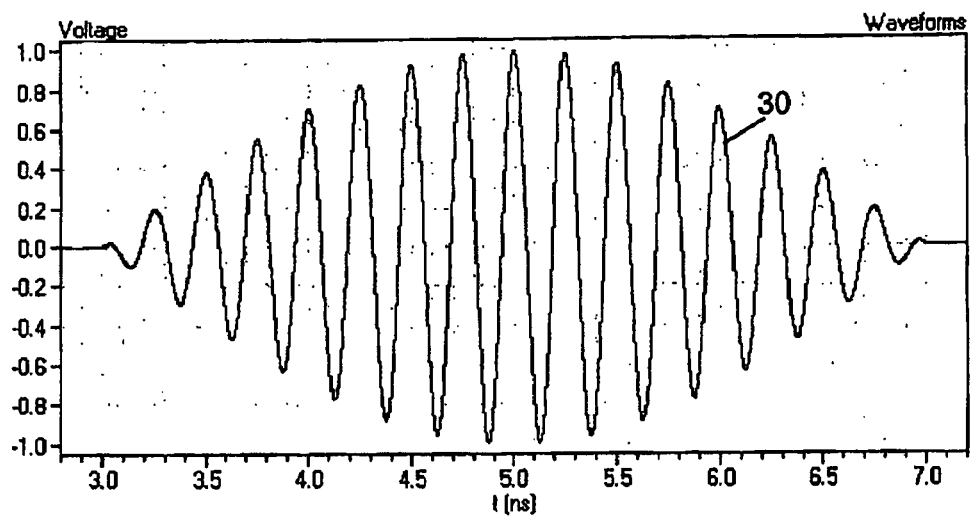
FIG. 3 depicts a time profile of an exemplary prototype signal in accordance with the invention.

In one exemplary embodiment of the invention, the prototype signal 30 comprises a sine wave signal as shown in FIG. 3, which has a 4 GHz carrier and is amplitude-modulated by a raised half cosine envelope. This envelope can be chosen for its optimization of burst brevity in the time domain and narrow bandwidth in the frequency domain. To achieve an exemplary frequency profile having a −10 dB bandwidth of 500 MHz, the duration, or width, of the raised half cosine envelope is chosen to be 4 ns. One skilled in the art will recognize that the prototype signal 30 of FIG. 3 is representative of the main lobe 10 of FIG. 2 and that the prototype signal 30 could alternatively be the same as the main lobe 10 of FIG. 2 or be otherwise representative of the main lobe 10 of FIG. 2. One skilled in the art will recognize that the prototype signal of FIG. 3 varies from −1.0 v to 1.0 v about a 0.0 v reference value and will understand that these values were chosen merely to simplify presenting the invention. Generally, the time profile of the prototype signal can have whatever values are desirable, and characteristics such as symmetry or normalization of the example prototype signals provided herein are not intended to limit the scope of the invention. For example, the prototype signal shown in FIG. 3 could be shifted such that it varies from 0.0 v to 2.0 v about a 1.0 v reference value and the prototype signal could also resemble a noise signal or have any other desired shape.

Figure 4:
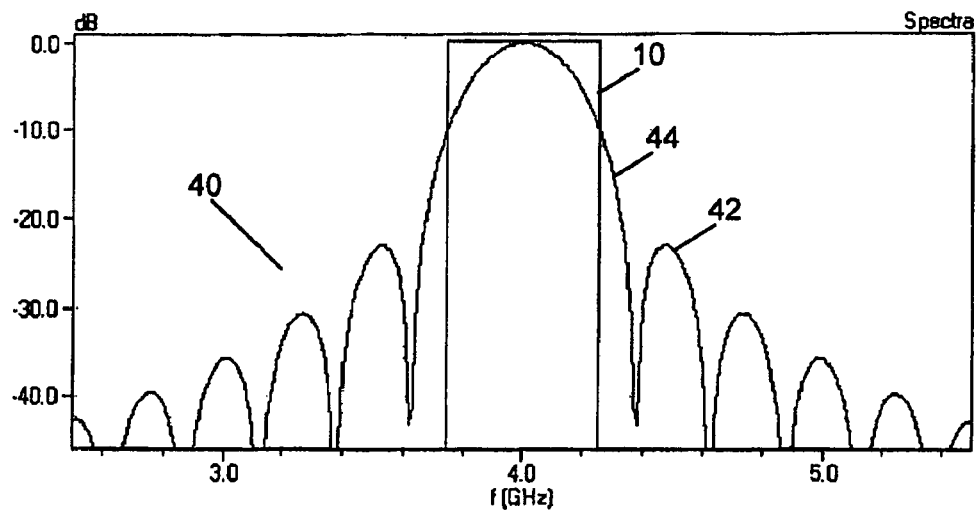
FIG. 4 depicts the frequency profile of the exemplary prototype signal of FIG. 3.

FIG. 4 depicts the frequency profile 40 for the prototype signal 30 of FIG. 3. For comparison purposes, a 500 MHz wide frequency band of interest 10 centered at 4 GHz of FIG. 1 overlies the frequency profile 40. By comparing the frequency profile 40 to the frequency band of interest 10 it is clear that the prototype signal of FIG. 3 substantially fills the frequency band of interest 10, where only the upper left and upper right corners of the frequency band of interest 10 are not filled. One skilled in the art will also recognize that the −10 dB bandwidth of the prototype signal 30 is 500 MHz, which defines an UWB waveform according to FCC rules. The frequency profile in FIG. 4 also shows the peak power of the largest side lobe 42 to be approximately 23 dB below the peak power of the main lobe 44.

Figure 5:
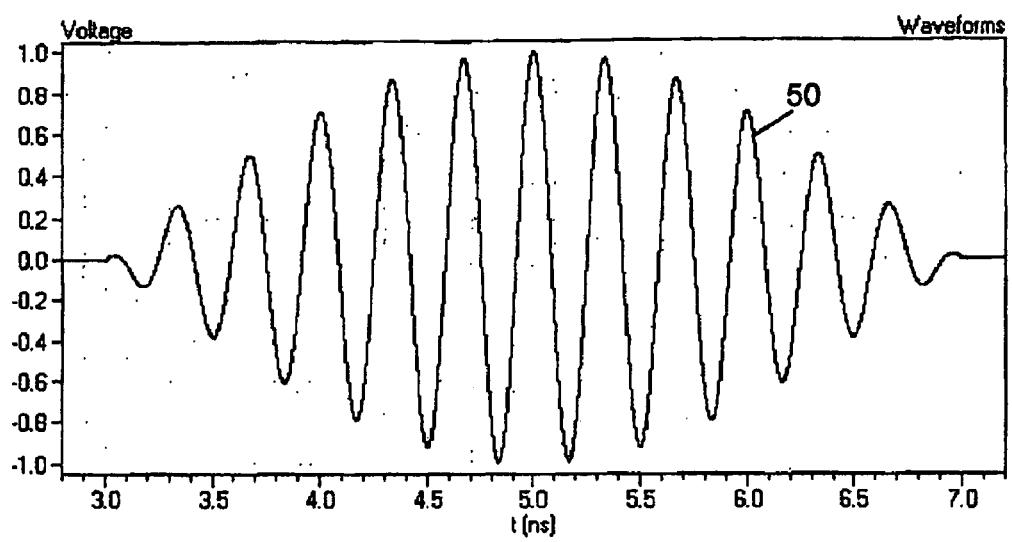
FIG. 5 shows a time profile of another exemplary prototype signal.
Figure 6:
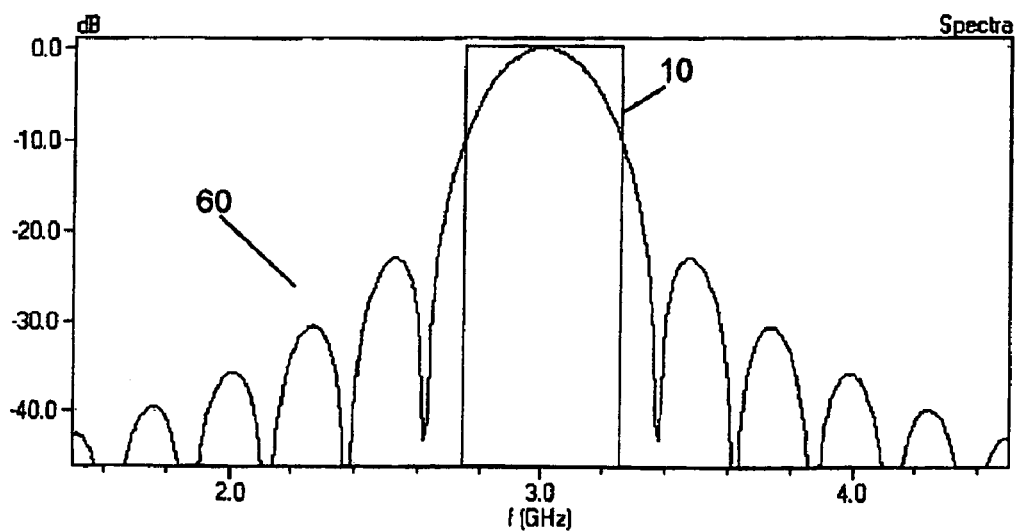
FIG. 6 depicts the frequency profile of the exemplary prototype signal of FIG. 5.
Figure 7:
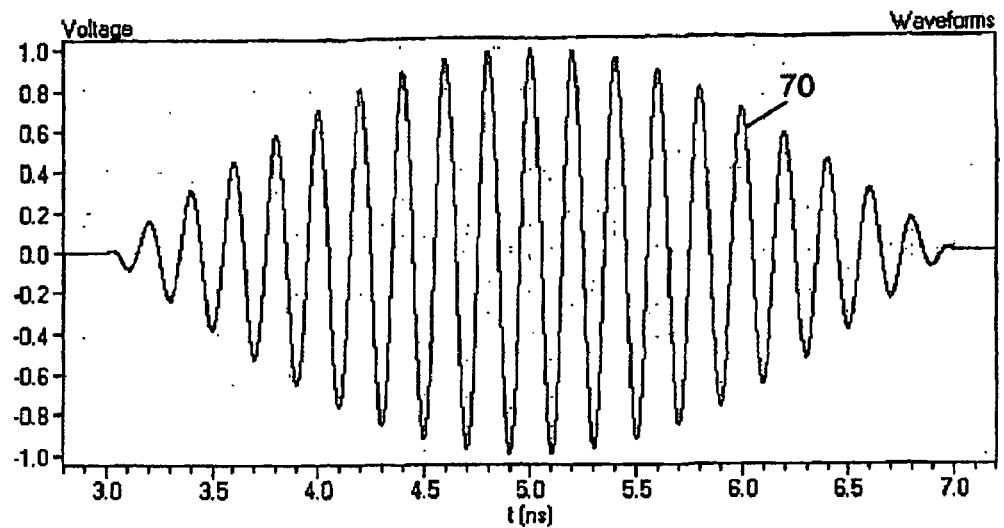
FIG. 7 shows a time profile of still another exemplary prototype signal.
Figure 8:
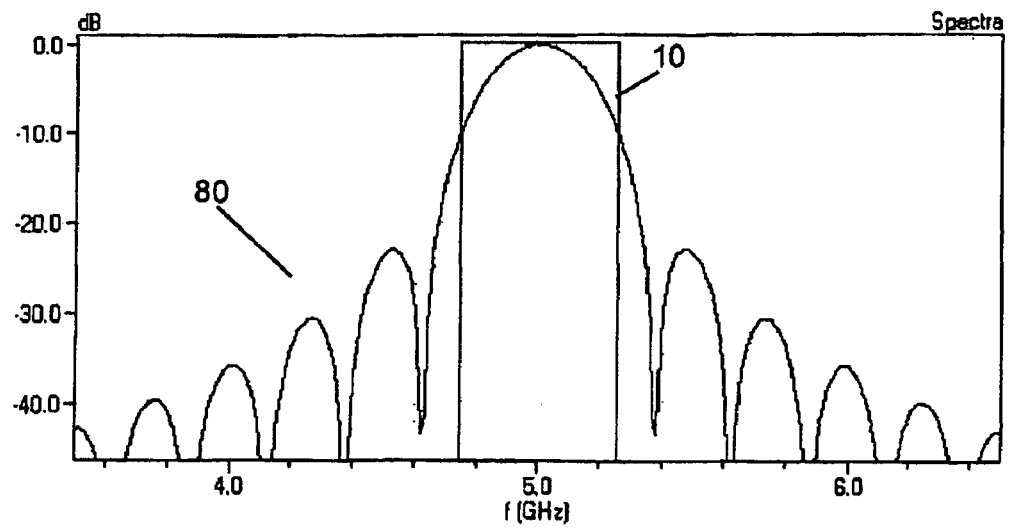
FIG. 8 is a diagram of the frequency profile of the exemplary prototype signal of FIG. 6.

FIG. 5 shows another example of a raised half cosine-enveloped sine wave prototype signal 50 having the same 4 ns duration as the prototype signal 30 of FIG. 3, but having a carrier frequency of 3 GHz. FIG. 6 presents the frequency profile 60 of the prototype signal 50 of FIG. 5, which has a −10 dB bandwidth of 500 MHz and a center frequency of 3 GHz. By comparing FIG. 4 and FIG. 6 it can be seen that the frequency profiles 40, 60 of the prototype signals of FIG. 3 and FIG. 5 are the same except for their center frequencies. Similarly, FIG. 7 provides a third example of a raised half cosine-enveloped sine wave prototype signal 70 having the same 4 ns duration as the prototype signals 30, 50 of FIG. 3 and FIG. 5, but having a carrier frequency of 5 GHz. FIG. 8 presents the frequency profile 80 of the prototype signal of FIG. 7, which has a −10 dB bandwidth of 500 MHz and a center frequency of 5 GHz. By comparing FIG. 4, FIG. 6 and FIG. 8 it is evident that the frequency profiles 40, 60, 80 of the prototype signals 30, 50, 70 of FIG. 3, FIG. 5 and FIG. 7 are the same except for their center frequencies. Therefore, in the above examples, the aggregate energy of the RF waveforms that emulates the energy of a corresponding prototype signal substantially fills a 500 MHZ band of interest centered at a center frequency defined by the carrier frequency of the prototype signal.

Figure 9:
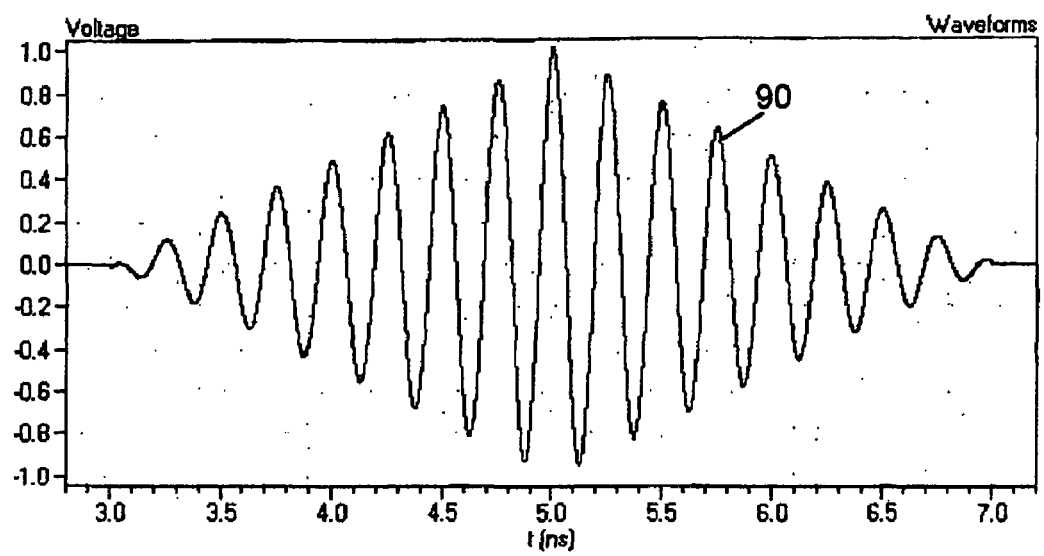
FIG. 9 illustrates an exemplary trapezoid enveloped prototype signal.
Figure 10:
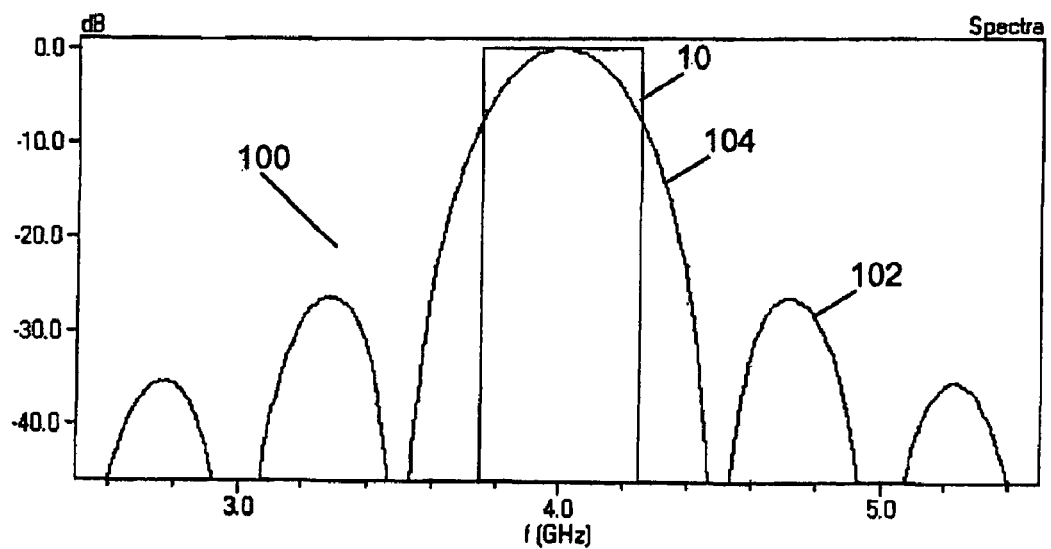
FIG. 10 depicts the frequency profile of the exemplary trapezoid enveloped prototype signal of FIG. 9.

FIG. 9 depicts an exemplary embodiment of a prototype signal 90 comprising a trapezoid-enveloped sine wave having a carrier frequency of 4 GHz. For comparison purposes, the duration of the envelope is 4 ns, which is the same duration as the raised half cosine envelope 30 of FIG. 3. FIG. 10 presents the frequency profile 100 of the prototype signal 90 of FIG. 9, which has a center frequency of 4 GHz, a −10 dB bandwidth of about 600 MHz, and a largest side lobe 102 having peak power approximately 26 dB below the peak power of the main lobe 104. When comparing frequency profile 100 to the frequency profile 40 of FIG. 4, it is evident that the trapezoid envelope results in a somewhat more desirable carrier-to-noise ratio than the raised half cosine envelope but has a greater tendency to overlap into adjoining bands. One skilled in the art will also recognize that to achieve a 500 MHz bandwidth at −10 dB, the duration of the envelope could be increased, which could reduce channelization.

Figure 11:
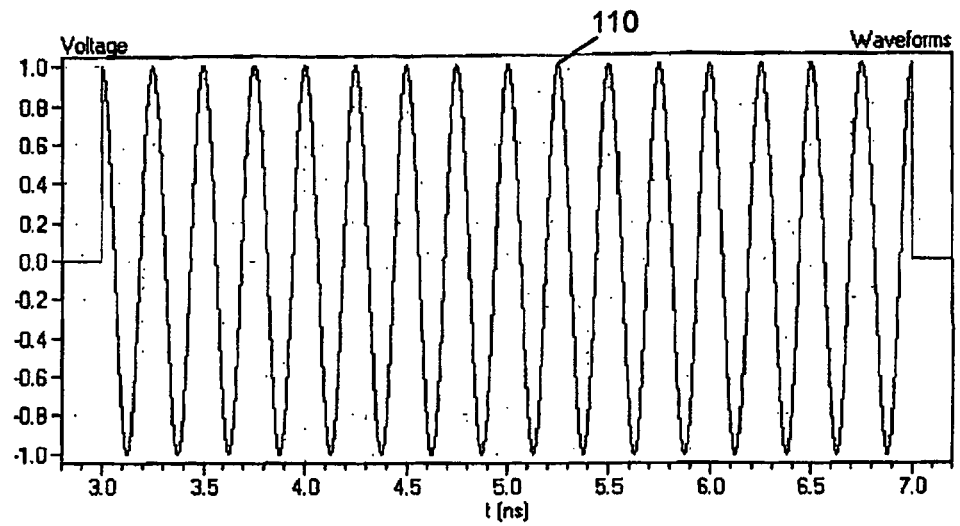
FIG. 11 shows an exemplary rectangle enveloped prototype signal.
Figure 12:
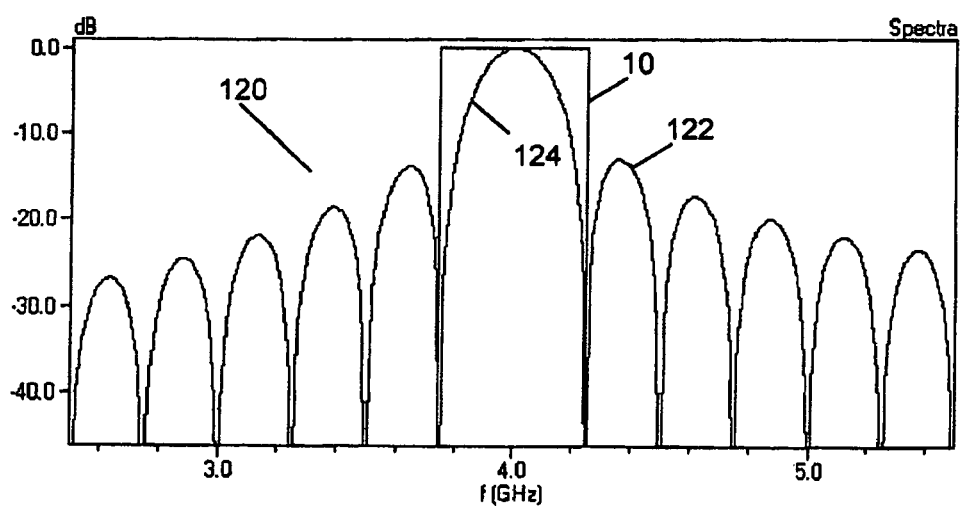
FIG. 12 shows the frequency profile of the exemplary rectangle enveloped prototype signal of FIG. 11.

FIG. 11 depicts an exemplary embodiment of a prototype signal 110 comprising a rectangle-enveloped sine wave having a carrier frequency of 4 GHz. Again, for comparison purposes, the duration of the envelope is 4 ns, which is the same duration as the raised half cosine enveloped prototype signal 30 of FIG. 3 and the trapezoid enveloped prototype signal 90 of FIG. 9. FIG. 12 presents the frequency profile 120 of the prototype signal 110 of FIG. 11, which has a center frequency of 4 GHz, a −10 dB bandwidth of about 400 MHz, and a largest side lobe 122 having peak power approximately 13 dB below the peak power of the main lobe 124. When comparing FIG. 12 to FIG. 4 and FIG. 10 it is evident that the rectangle envelope results in a less desirable carrier-to-noise ratio but has a lesser tendency to overlap into adjoining bands. One skilled in the art will also recognize that to achieve a 500 MHz bandwidth at −10 dB, the duration of the envelope could be decreased, which could improve channelization.

Thus, FIGS. 3 through 12 illustrate the time and frequency profiles of alternative prototype signals that can produced that are representative of a desired waveform corresponding to the main lobe 20 of the ideal waveform of FIG. 2 to appropriately fill the frequency band of interest 10 of FIG. 1 and to meet other desired spectral requirements such as a desired carrier-to-noise ratio or a requirement to minimize overlapping into adjoining bands. Generally, in accordance with the invention, a prototype signal can be defined having desired spectral characteristics.

In one embodiment of the invention, the time profile of the prototype signal has a shifted average DC level such that the average DC level is non-zero. Under one arrangement, the average DC level can be shifted such that samples of the time profile of the prototype signal have the same polarity. Then, a DC component can be removed from the aggregate RF energy by a filter.

Sampling the Time Profile

According to the invention, a plurality of RF waveforms is defined by corresponding samples of the time profile of the prototype signal, which corresponds to the desired waveform, where the polarity, relative energy, and timing of each of the plurality of RF waveforms corresponds to the polarity, relative magnitude, and timing of a corresponding sample of the time profile.

Figure 13:
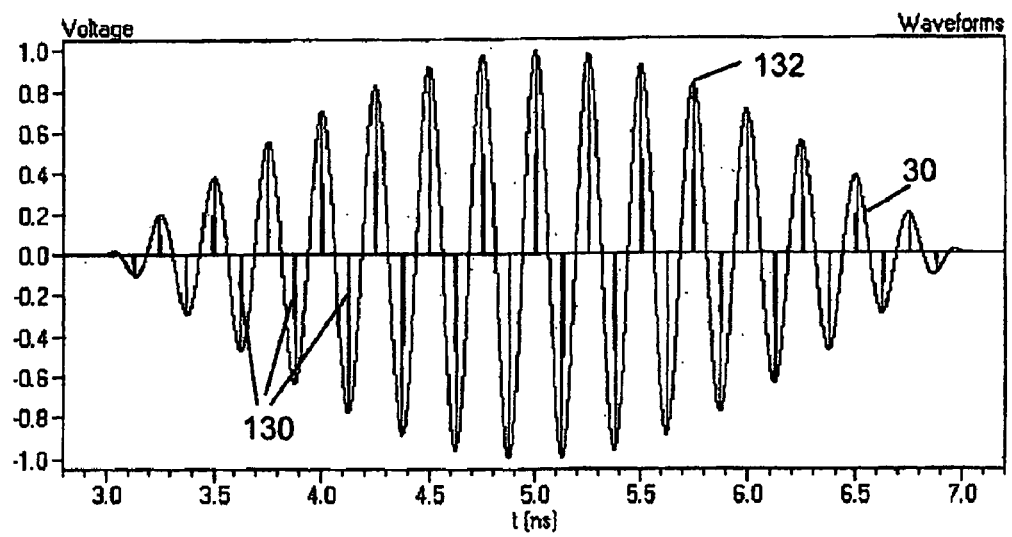
FIG. 13 presents sampling of the prototype signal of FIG. 3 at the Nyquist rate.

In one embodiment of the invention, the time profile of the prototype signal is sampled at the Nyquist rate, which is twice the carrier frequency. FIG. 13 depicts sampling of the time profile of the prototype signal 30 of FIG. 3 at the Nyquist rate of 8 GHz. In FIG. 13, the samples 130 are shown to coincide with the crests 132 of the prototype signal 30. However, this alignment is not required. The samples can be shifted forward or backward in time to align at any location on the time profile to produce substantially the same result as long as the samples do not all coincide with zero crossings. Furthermore, it is not necessary that the sampling be done at a constant rate. Although several examples provided herein involve samples equally spaced apart in time, sampling of the time profile can be done with unequal time spacing between samples. Additionally, one skilled in the art will recognize that the samples in FIG. 13 are relative to a 0.0 v reference chosen to simplify the example prototype signals provided herein and will understand that a 0.0 v reference is not a requirement of the invention.

Figure 14:
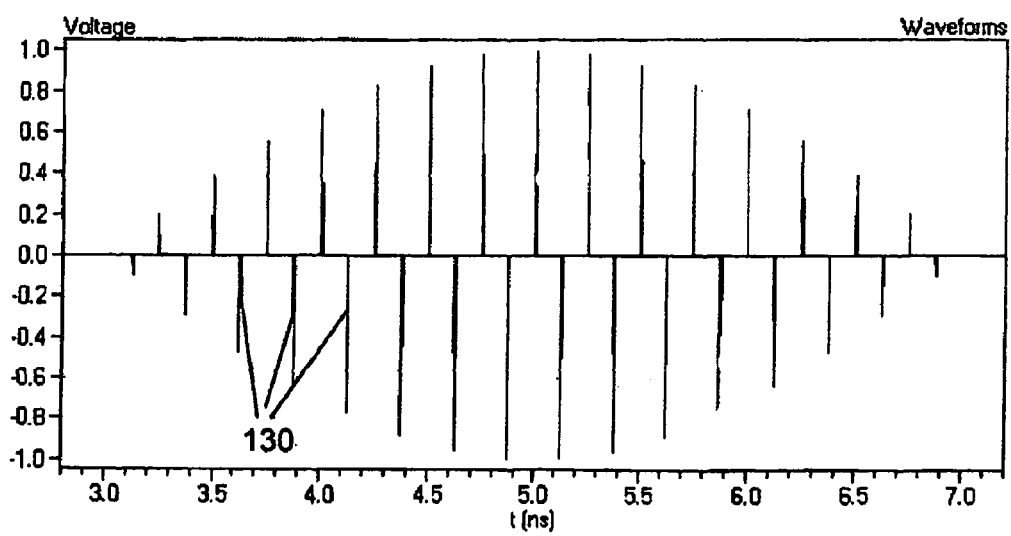
FIG. 14 presents the samples of FIG. 13 without the prototype signal.
Figure 15:
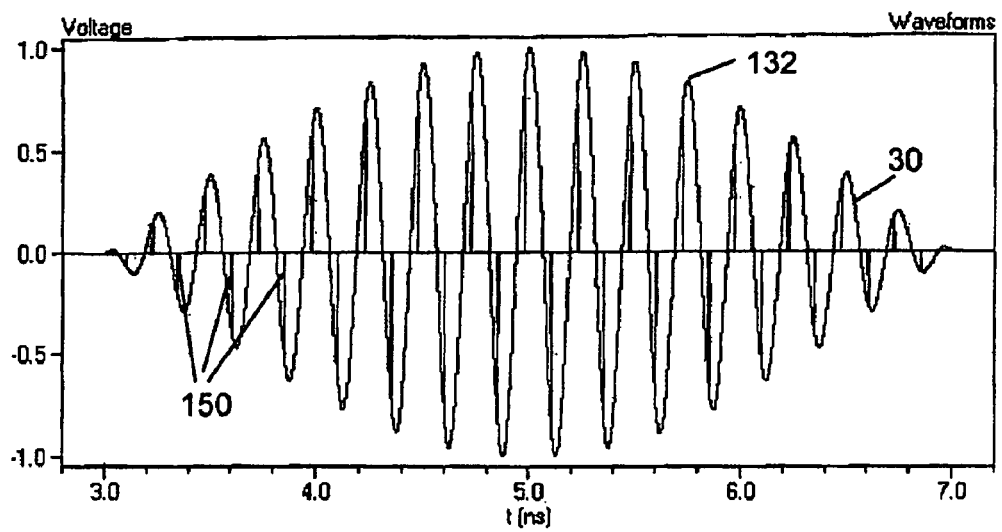
FIG. 15 presents sampling of the prototype signal of FIG. 3 at the Nyquist rate with a different sample alignment than shown in FIG. 13.
Figure 16:
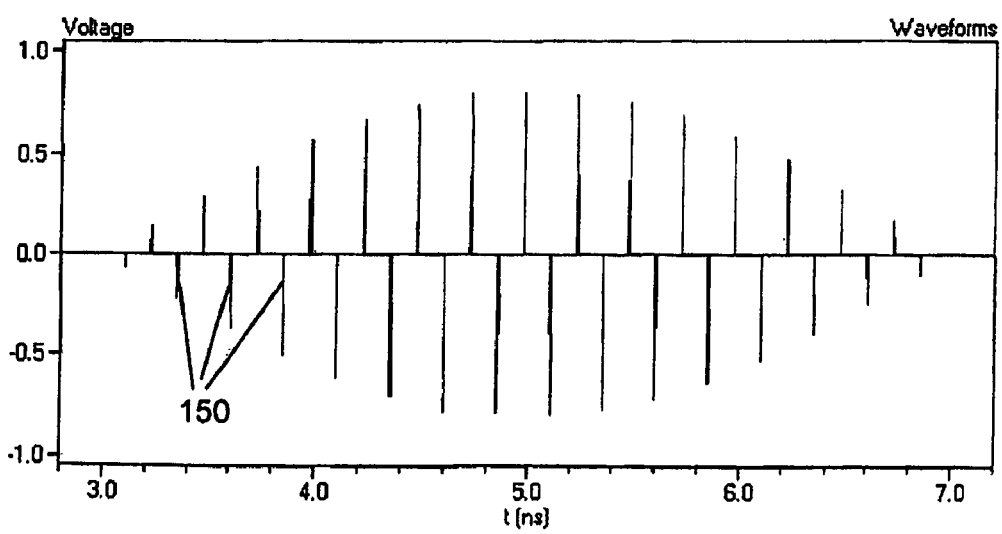
FIG. 16 presents the samples of FIG. 15 without the prototype signal.

FIG. 14 depicts the samples 130 of FIG. 13 without the prototype signal 30. Depending on the sampling rate and the alignment of the samples 130 to the prototype signal 30, the silhouette, or outline, of the samples 130 may be substantially similar to the shape of the envelope of the prototype signal 30 or may otherwise resemble the prototype signal 30. In FIG. 14, for example, the silhouette of the samples 130 appears to be the same as the shape of the envelope of the prototype signal 30. However, it is not necessary for the silhouette of the samples to be the same as the shape of the envelope or otherwise resemble the prototype signal 30 to practice the invention. In FIG. 15, for example, the prototype signal 30 of FIG. 3 is also shown being sampled at the 8 GHz rate, but the samples 150 are shifted so they no longer coincide with the crests 132 of the prototype signal 30. FIG. 16 shows the samples 150 of FIG. 15 without the prototype signal 30. In FIG. 16, it is apparent that the silhouette of the samples 150 has the same duration as the silhouette of the samples 130 in FIG. 14. It is also apparent that the silhouette of the samples 150 is not the same as the shape of the envelope of the prototype signal 30.

Figure 17:
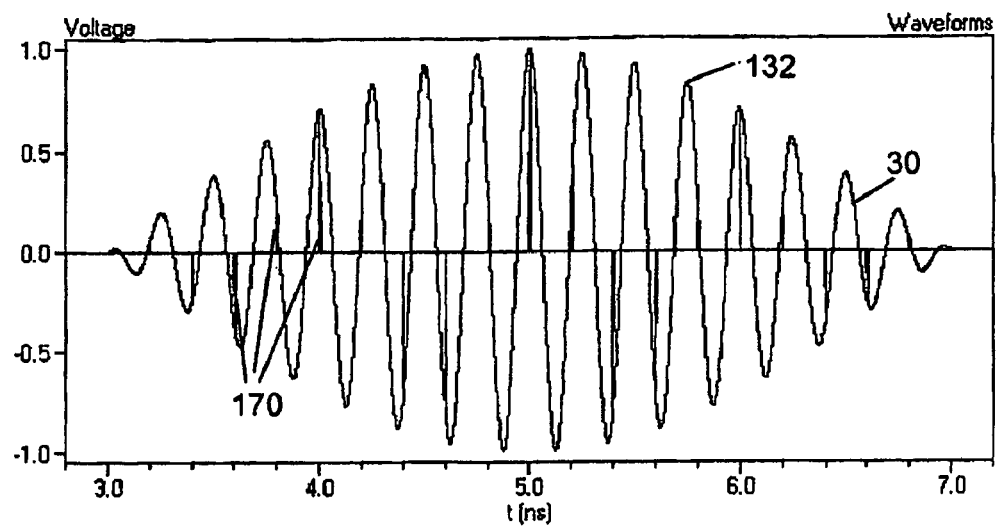
FIG. 17 illustrates sampling of the prototype signal of FIG. 3 at a rate that is less than the Nyquist rate.
Figure 18:
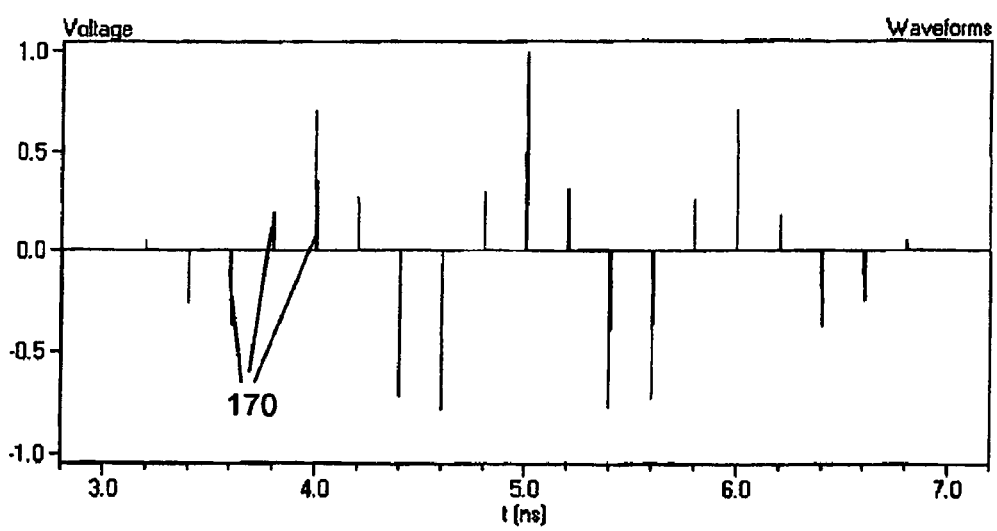
FIG. 18 shows the samples of FIG. 17 without the prototype signal.
Figure 19:
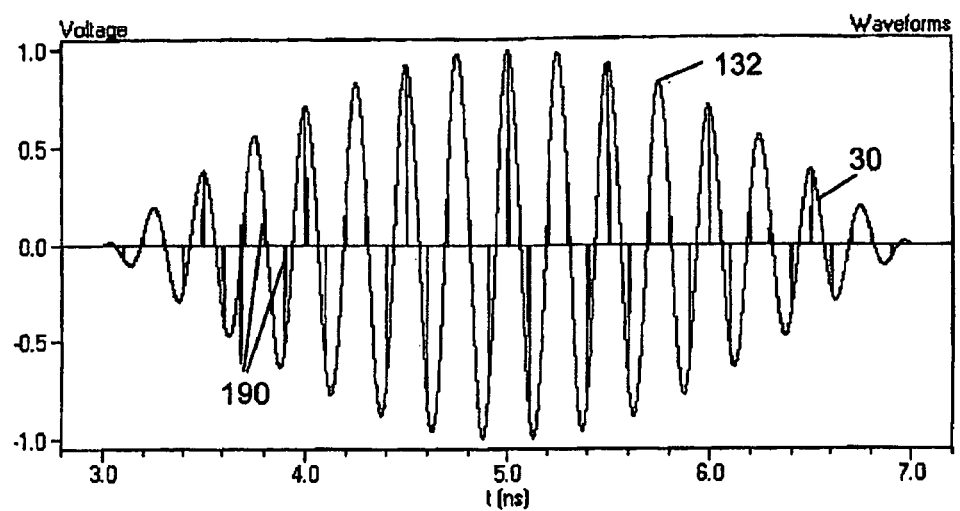
FIG. 19 depicts sampling of the prototype signal of FIG. 3 at a rate that is greater than the Nyquist rate.
Figure 20:
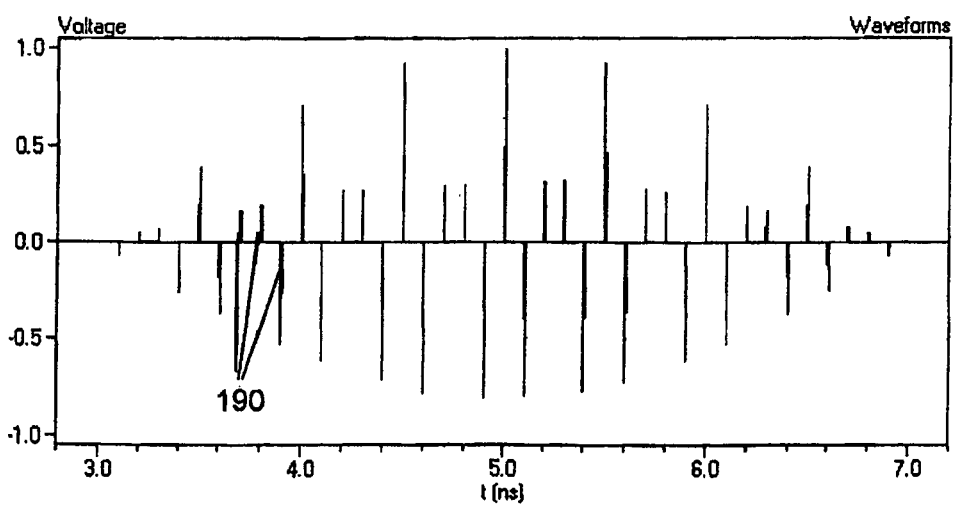
FIG. 20 presents the samples of FIG. 18 without the prototype signal.

To practice the invention, it is not necessary to sample the prototype signal at the Nyquist rate. In an alternative embodiment, the prototype signal is sampled at a rate that is less than the Nyquist rate. In other words, the prototype signal is sampled at a rate that is less than twice its carrier frequency. FIG. 17 depicts the prototype signal 30 of FIG. 3 being sampled at 5 GHz. The samples 170 are aligned so as to coincide with every eighth crest 132, although such alignment is arbitrary. FIG. 18 shows the samples 170 of FIG. 17 without the prototype signal 30. In another alternative embodiment, the prototype signal is sampled at a rate that is greater than the Nyquist rate. In other words, the prototype signal is sampled at a rate that is more than twice its carrier frequency. FIG. 19 shows the prototype signal 30 of FIG. 3 being sampled at 10 GHz. The samples 190 are aligned so as to coincide with every fourth crest 132, although such alignment is arbitrary. FIG. 20 shows the samples 190 of FIG. 19 without the prototype signal 30.

Thus, in accordance with the invention, the prototype signal can be sampled at different rates and with different sample alignments.

Generated RF Waveforms

Under the present invention, a plurality of RF waveforms is generated in accordance with the polarity, timing, and magnitude of corresponding samples of the time profile. An RF waveform generated in accordance with one embodiment of the present invention can be an impulse, doublet, triplet, gaussian, step, triangle, sawtooth, burst of cycles, or any other suitable type of RF waveform having an instantaneous bandwidth that is greater than or equal to the instantaneous bandwidth of the prototype signal and having an average bandwidth that is greater than or equal to the average bandwidth of the prototype signal. In a further embodiment, each of the plurality of RF waveforms is the same type as the other RF waveforms. For example, all of the RF waveforms could be impulses. In an alternative embodiment, the plurality of RF waveforms includes two or more different types of RF waveforms. For example, the plurality of RF waveforms could include a combination of doublets and triplets or the plurality of RF waveforms could involve bursts having different numbers of cycles.

Polarity of the RF Waveforms

In accordance with the invention, the polarity of each generated RF waveform of the plurality of RF waveforms is in accordance with the polarity of a corresponding sample of the prototype signal. In one embodiment, the polarity of each generated RF waveform of the plurality of RF waveforms is the same as the polarity of a corresponding sample of the prototype signal. In an alternative embodiment, the polarity of selected generated RF waveforms is opposite the polarity of corresponding samples of the prototype signal.

Relative Timing of the RF Waveforms

In accordance with the invention, the timing of the RF waveforms corresponds to the timing of the samples of the time profile. Like the samples of the time profile, the time spacing between the generated RF waveforms can be equal (or substantially equal) or unequal. In other words, the generated RF waveforms may be equally (or substantially equally) spaced in time or unequally spaced in time. Generally, whether the RF waveforms are equally or unequally spaced in time depends on whether the samples are equally or unequally spaced.

In one embodiment, the relative timing of the plurality of the RF waveforms is equal to the relative timing of the samples of the time profile of the prototype signal. Under this arrangement, the time spacing between a given RF waveform and the following RF waveform is the same (or substantially the same) as the time spacing between the two samples corresponding to those RF waveforms. In an alternate embodiment, the timing of RF waveforms is based upon by somewhat different than the timing of the samples. Under this arrangement, the timing of the samples of the prototype signal corresponds to the nominal time positioning of the generated RF waveforms but the actual time positions of the generated RF waveforms are dithered, or otherwise shifted, relative to the nominal time positions. By dithering the actual time positions of the generated RF waveforms, higher harmonics may be suppressed that might otherwise be present in the frequency profile of RF waveforms depending on the rate at which the time profile of the prototype signal is sampled. Further discussion of the relationship of harmonics to the rate of sampling of the time profile of the prototype signal is provided below. In a further embodiment, the dithering of the time positions of the generated RF waveforms is performed pseudorandomly. In still another embodiment, the dithering of the time positions of the generated RF waveforms is in accordance with a code. In another exemplary embodiment of the present invention, the timing of the plurality of RF waveforms may be programmable.

In one embodiment, the relative time positions of the generated RF waveforms correspond to the zero crossings of the generated RF waveforms. In another embodiment, the relative time positions of the generated RF waveforms correspond to the crests of the generated RF waveforms. For example, in doublet pulses, the timing of the plurality of RE waveforms can correspond to a zero crossing or a crest of each RF waveform. Alternatively, the timing of the plurality of RF waveforms can correspond to an arbitrarily selected location of each RF waveform, for example, the beginning of each RF waveform. As such, the time spacing between the generated RF waveforms corresponds to the time spacing between the samples of the time profile.

The timing of the plurality of RF waveforms can define the center frequency of main lobes present in the frequency profile of the generated plurality of RF waveforms, where the frequency profile has a plurality of main lobes corresponding to a fundamental spectra, harmonics of the fundamental spectra, and possibly fold images of the fundamental spectra and harmonics that may or may not exist depending on the rate at which the RF waveforms are generated. One skilled in the art will recognize that one or more of these main lobes may or may not reside within the frequency band of interest depending on the selected generation rate and the selected frequency band of interest. As such, the timing of the plurality of RF waveforms may correspond to a desired center frequency within the frequency band of interest. Further discussion of the generation rate, fundamental spectra, harmonics, and fold images is provided below.

Scaling of the RF Waveforms

In accordance with the invention, the energy contained in each generated RF waveform of the plurality of RF waveforms is scaled in accordance with a corresponding sample of the prototype signal to produce aggregate RF energy having spectral characteristics substantially similar to, or emulating, those of the desired waveform.

Scaling, in accordance with the present invention, is to pattern, make, set, regulate, or estimate the energy of each RF waveform of the plurality of RF waveforms according to a corresponding sample value of the plurality of sample values relative to a reference value. In one embodiment, the reference value corresponds to the maximum sample value. In an alternative embodiment, the reference value is the maximum value of the time profile of the prototype signal. As previously shown, the maximum sample value may or may not equal the maximum value of the time profile depending on the alignment of the samples.

In accordance with the invention, the energy of each RF waveform of the plurality of RF waveforms is scaled by varying at least one of amplitude, width or waveform type based on the value of a corresponding one of the plurality of samples relative to a reference value. In one embodiment, each RF waveform of the plurality of RF waveforms can have substantially the same width, with the amplitude of each RF waveform being determined based on the value of a corresponding one of the plurality of sample values relative to the reference value. In an alternative embodiment, each of the plurality of RF waveforms can have substantially the same amplitude, with their widths being determined based on the value of a corresponding one of the plurality of sample values relative to the reference value. In another alternative embodiment, the widths and amplitudes of each of the plurality of RF waveforms can be varied to scale the energy of the RF waveforms. In a further embodiment, both the width and amplitude are varied such that a defined amplitude/width ratio is maintained for each RF waveform of the plurality of RF waveforms. In still another embodiment, the waveform type, or shape, of each RF waveform can be varied in order to achieve the appropriate energy scaling. For example, the number of cycles in RF waveforms comprising bursts of cycles can be varied.

The sample values depicted in FIG. 13 and FIG. 14 correspond to the scaling factors listed in Table. 1.

TABLE 1

| 1.  | 1.  | 0.000  |
|-----|-----|--------|
| 2.  | 2.  | -0.096 |
| 3.  | 3.  | 0.193  |
| 4.  | 4.  | -0.288 |
| 5.  | 5.  | 0.381  |
| 6.  | 6.  | -0.469 |
| 7.  | 7.  | 0.554  |
| 8.  | 8.  | -0.632 |
| 9.  | 9.  | 0.704  |
| 10. | 10. | -0.770 |
|     | 11. | 0.829  |
|     | 12. | -0.879 |
|     | 13. | 0.922  |
|     | 14. | -0.955 |
|     | 15. | 0.979  |
|     | 16. | -0.993 |
|     | 17. | 1.000  |
|     | 18. | -0.993 |
|     | 19. | 0.979  |
|     | 20. | -0.955 |
|     | 21. | 0.922  |
|     | 22. | -0.879 |
|     | 23. | 0.829  |
|     | 24. | -0.770 |
|     | 25. | 0.704  |
|     | 26. | -0.632 |
|     | 27. | 0.554  |
|     | 28. | -0.469 |
|     | 29. | 0.381  |
|     | 30. | -0.288 |
|     | 31. | 0.193  |
|     | 32. | -0.096 |
|     | 33. | 0.000  |

When generating the plurality of RF waveforms in accordance with the samples of Table 1, the $17^{th}$ RF waveform corresponds to the reference value. Therefore, the $17^{th}$ RF waveform has some predetermined maximum amount of energy and the other RF waveforms are scaled relative to it. The $3^{rd}$ RF waveform, for example, would have 19.3% of the energy of the $17^{th}$ RF waveform. Thus, in accordance with the invention, a plurality of generated RF waveforms spaced apart by 0.125 ns and having polarity and scaled energy based on the samples of Table 1 produce aggregate energy substantially similar to and thereby emulating the energy of the prototype signal and thus the desired waveform. One skilled in the art will recognize that the prototype signal of FIG. 13 has 33 samples aligned with the crests resulting in the first and last samples being zero thereby eliminating the first RF waveform and last RF waveform. In accordance with the invention, samples could be aligned differently to prevent elimination of the first and last RF waveforms. In particular, the first and last samples could be shifted as required to achieve non-zero sample values. Alternatively, samples can be purposely aligned to coincide with an optimal number of zero crossings (or near zero crossings) so as to minimize the number of generated RF waveforms and thereby reduce the costs of defining and generating them (i.e., memory requirements, power requirements, etc.).

In one embodiment of the invention, the RMS amplitudes and polarities of the generated RF waveforms are scaled in accordance with sample values of the time profile of the desired signal. The RMS amplitudes of the RF waveforms can be scaled by varying or otherwise modulating the amplitudes of the RF waveforms, the widths of the RF waveforms, the types of the RF waveforms, or some combination thereof based on the value of a corresponding one of the plurality of sample values relative to a reference value. The reference value can correspond to the maximum value of the plurality of sample values and can correspond to the maximum value of the time profile. In Table 1, for example, the maximum value corresponds to sample value 17. The sample values can be normalized for signal processing in accordance with the present invention.

Each RF waveform of the plurality of RF waveforms can have substantially the same width, with the amplitude of each RF waveform being determined based on the value of a corresponding one of the plurality of sample values relative to the maximum value. In an alternative embodiment, each of the plurality of RF waveforms can have substantially the same amplitude, with their widths being determined based on the value of a corresponding one of the plurality of sample values relative to the maximum value. Both the width and amplitude can be determined such that a defined amplitude/width ratio is maintained for each RF waveform of the plurality of RF waveforms. The waveform type, or shape, of each RF waveform can be varied in order to achieve the appropriate energy scaling. For example, the number of cycles in RF waveforms comprising bursts of cycles can be varied. The present invention can also use waveforms of different shapes having different RMS amplitudes.

In an exemplary embodiment, generated RF waveforms are impulses having amplitudes scaled in accordance with the invention, which could be depicted in the same manner as the samples shown in FIGS. 13 through 20. FIGS. 21 through 24 compare the frequency profiles of impulses generated based on the samples of FIGS. 13, 15, 17, and 19, respectively, to the frequency profile 40 shown in FIG. 4 of the prototype signal 30 of FIG. 3.

Figure 21:
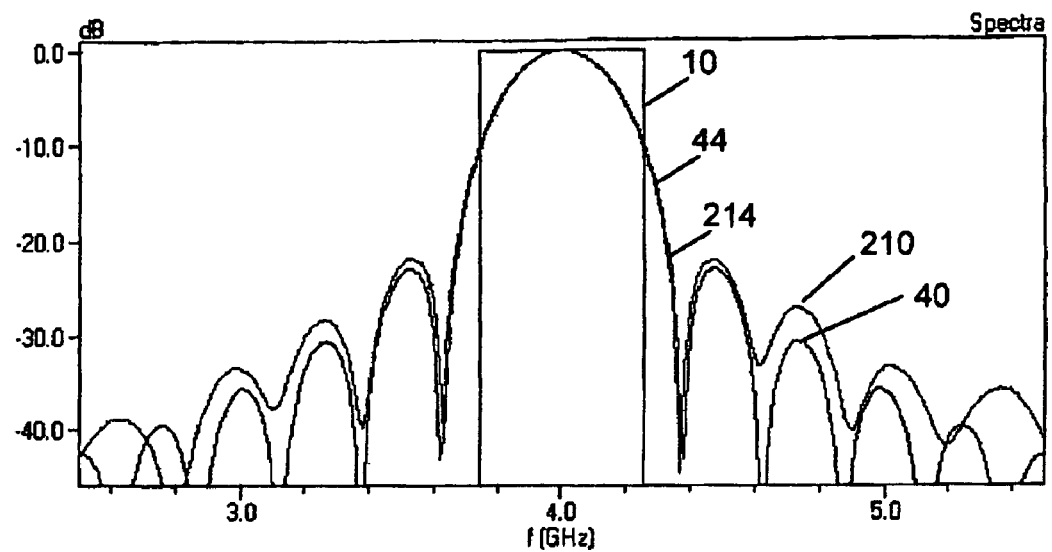
FIG. 21 presents a comparison of the frequency profile of FIG. 4 to the frequency profile of RF waveforms generated in accordance with the samples of FIGS. 13 and 14.

FIG. 21 overlays the frequency profile 40 of FIG. 4 and the frequency profile 210 of impulses generated based on the samples 130 of FIG. 13. In FIG. 21, it is evident that the frequency profile 210 of the impulses is substantially similar to the frequency profile 40 of the prototype signal 30. In particular, the main lobe 214 of frequency profile 210 appears to be about the same as the main lobe 44 of frequency profile 40, especially within the frequency band of interest 10.

Figure 22:
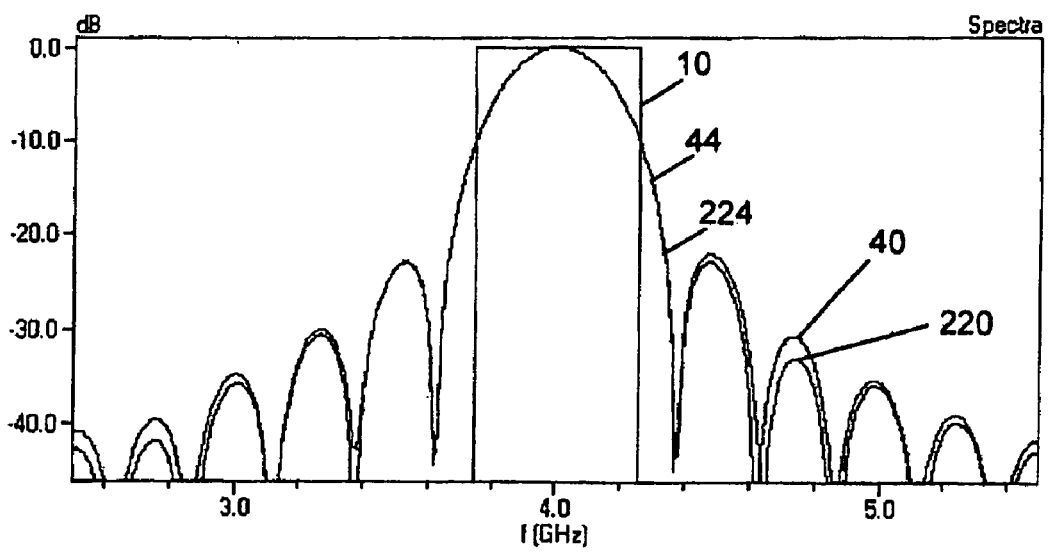
FIG. 22 presents a comparison of the frequency profile of FIG. 4 to the frequency profile of RF waveforms generated in accordance with the samples of FIGS. 15 and 16.

FIG. 22 overlays the frequency profile 40 of FIG. 4 and the frequency profile 220 of impulses generated based on the samples 150 of FIG. 15. As previously described, the samples 150 of FIG. 15 have the same Nyquist sampling rate of the samples 130 of FIG. 13 except they have been shifted off the crests 132. In FIG. 22, it is evident that the frequency profile 220 of the impulses is substantially similar to the frequency profile 40 of the prototype signal 30. In particular, the main lobe 224 of frequency profile 220 appears to be about the same as the main lobe 44 of frequency profile 40, especially within the frequency band of interest 10.

Figure 23:
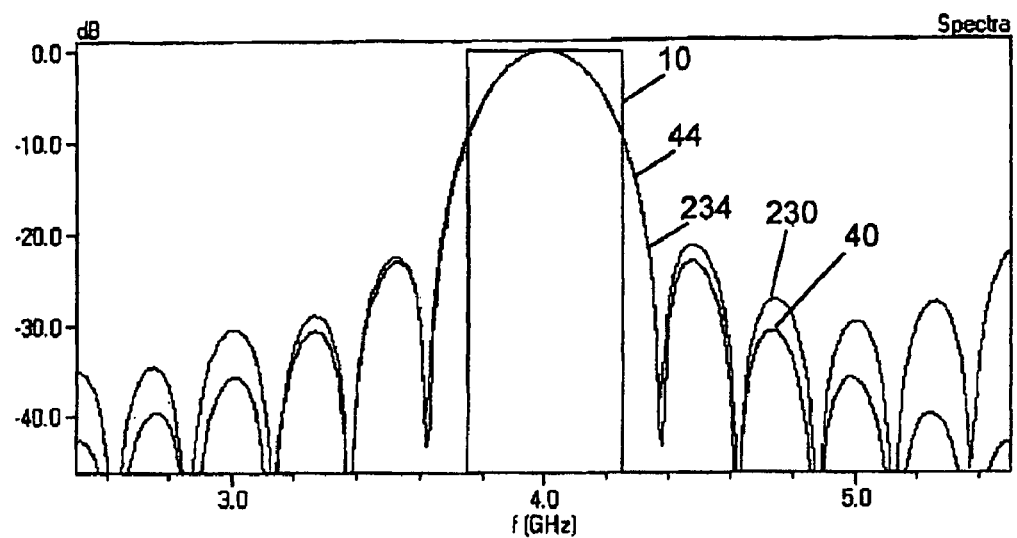
FIG. 23 presents a comparison of the frequency profile of FIG. 4 to the frequency profile of RF waveforms generated in accordance with the samples of FIGS. 17 and 18.

FIG. 23 overlays the frequency profile 40 of FIG. 4 and the frequency profile 230 of impulses generated based on the samples 170 of FIG. 17. As previously described, the samples 170 of FIG. 17 have a sampling rate that is less than the Nyquist rate, specifically 5 GHz. In FIG. 23, it is evident that the frequency profile 230 of the impulses is substantially similar to the frequency profile 40 of the prototype signal 30. In particular, the main lobe 234 of frequency profile 230 appears to be about the same as the main lobe 44 of frequency profile 40, especially within the frequency band of interest 10.

Figure 24:
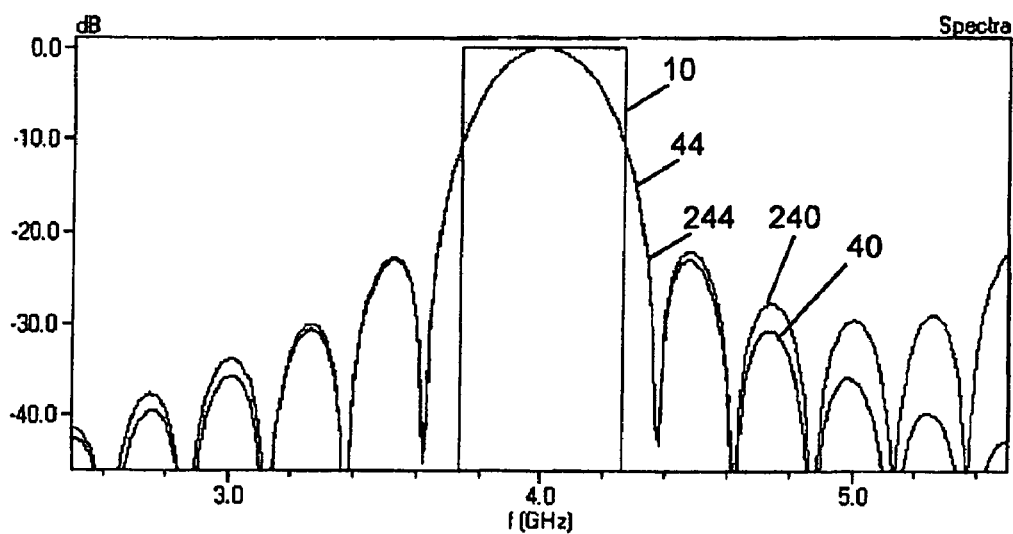
FIG. 24 presents a comparison of the frequency profile of FIG. 4 to the frequency profile of RF waveforms generated in accordance with the samples of FIGS. 19 and 20.

FIG. 24 overlays the frequency profile 40 of FIG. 4 and the frequency profile 240 of impulses generated based on the samples 190 of FIG. 19. As previously described, the samples 190 of FIG. 19 have a sampling rate that is greater than the Nyquist rate, specifically 10 GHz. In FIG. 24, it is evident that the frequency profile 240 of the impulses is substantially similar to the frequency profile 40 of the prototype signal 30.

In particular, the main lobe 244 of frequency profile 240 appears to be about the same as the main lobe 44 of frequency profile 40, especially within the frequency band of interest 10.

Thus, FIGS. 21 through 24 provide four examples of a plurality of impulses generated based on samples of the prototype signal 30 of FIG. 3 emulating the prototype signal 30 such that the frequency profile of the impulses is substantially similar to the frequency profile 40 of the prototype signal 30. Furthermore, FIGS. 21 through 24 also provide four examples of a plurality of impulses generated based on samples of the prototype signal 30 of FIG. 3 emulating the desired waveform comprising the main lobe 20 of FIG. 2, where the spectral characteristics of the plurality of impulses substantially meet desired spectral requirements FIGS. 25 through 34 present examples of alternative RF waveforms generated in accordance with the invention having constant widths and amplitudes scaled based on the same plurality of samples of the time profile of the prototype signal 30 of FIG. 3. For clarity, the time profile of the prototype signal is sampled at 2 GHz for these examples to space the RF waveforms sufficiently apart so that they don't overlap, which one skilled in the art will understand can occur for non-impulse RF waveforms depending on the spacing of the samples and the width of the RF waveforms.

Figure 25:
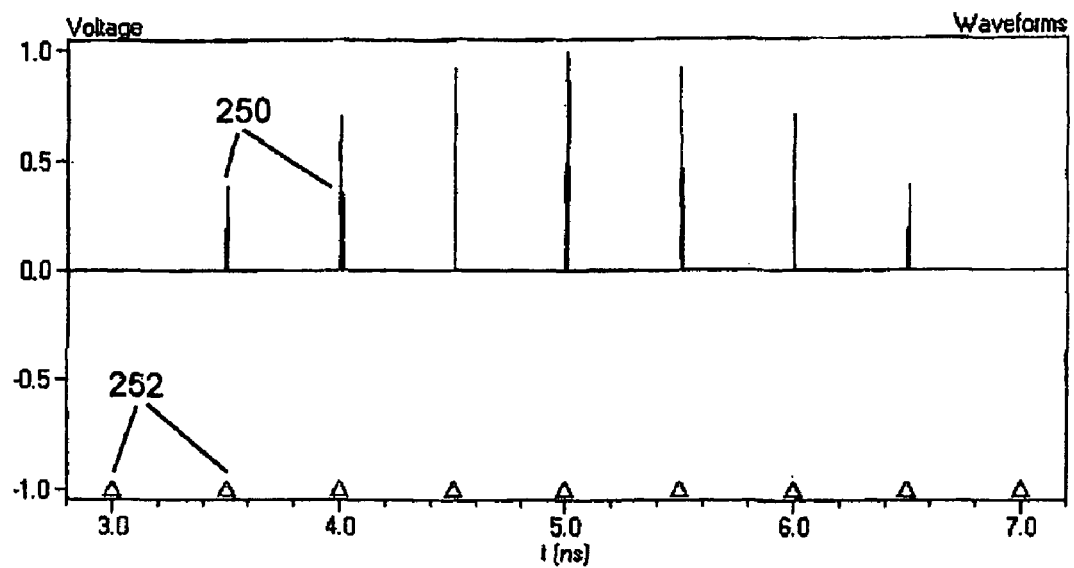
FIG. 25 illustrates exemplary impulses generated in accordance with samples of the prototype signal at a 2 GHz sampling rate.
Figure 26:
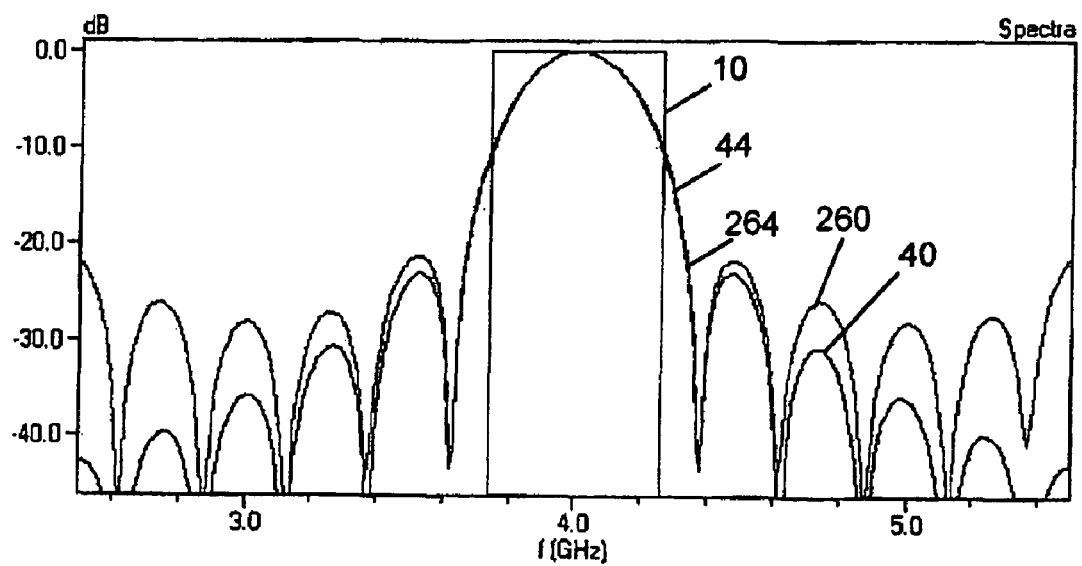
FIG. 26 shows the frequency profile of the impulses of FIG. 25.

FIG. 25 depicts impulses 250 scaled in accordance with samples of the time profile of the prototype signal 30 of FIG. 3. For additional clarity, the prototype signal 30 is not shown, nor the sampling of it. Instead, markers 252 denote the time locations of the samples. FIG. 26 illustrates the frequency profile 260 of the impulses overlaid upon the frequency profile 40 of the prototype signal 30 of FIG. 3. It is evident that the frequency profile 260 of the impulses is substantially similar to the frequency profile 40 of the prototype signal 30. In particular, the main lobe 264 of frequency profile 260 appears to be about the same as the main lobe 44 of frequency profile 40, especially within the frequency band of interest 10.

Figure 27:
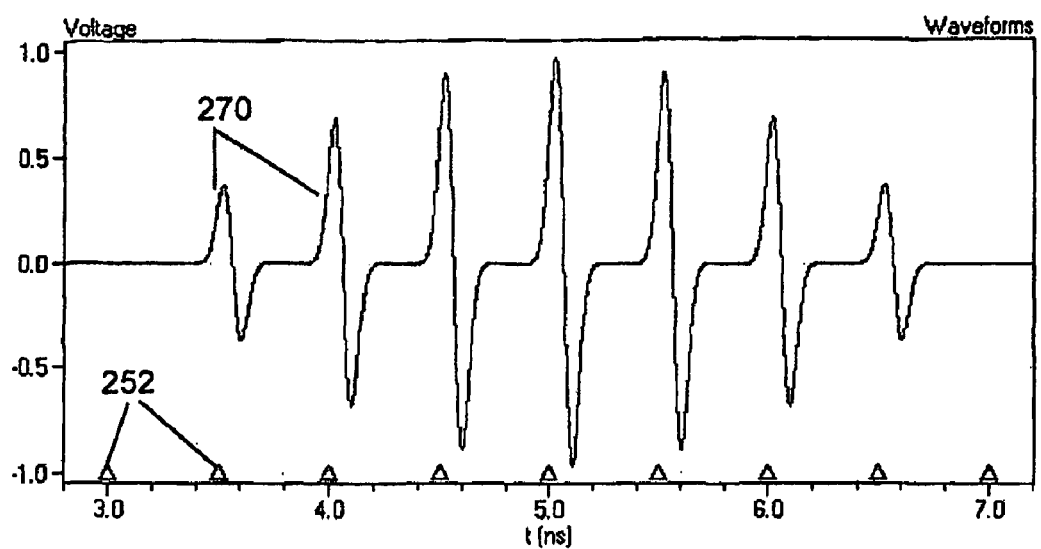
FIG. 27 depicts exemplary doublets generated in accordance with samples of the prototype signal at a 2 GHz sampling rate.
Figure 28:
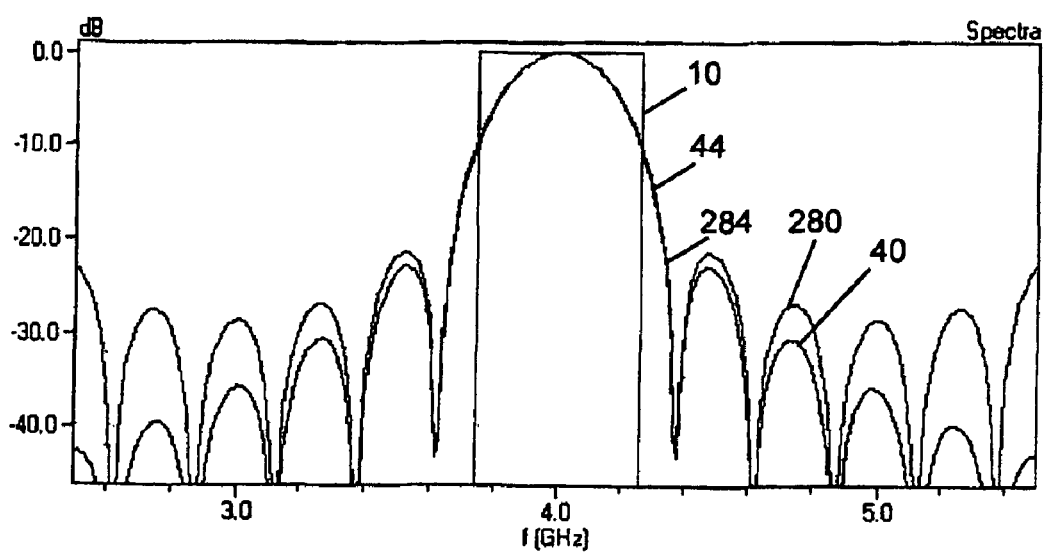
FIG. 28 shows the frequency profile of the doublets of FIG. 27.

FIG. 27 depicts doublets 270 scaled in accordance with samples of the time profile of the prototype signal 30 of FIG. 3. Markers 252 denote the time locations of the samples. In FIG. 27, the location of the doublets 270 was arbitrarily selected such that a point to the left of their first (positive lobe) coincides with the time of each sample. As explained earlier, the doublets could be shifted such that the sample times coincide with their crests, zero crossings, or some other arbitrary selected location. FIG. 28 illustrates the frequency profile 280 of the doublets overlaid upon the frequency profile 40 of the prototype signal 30 of FIG. 3. As is the case with the previous examples involving impulses, it is evident that the frequency profile 280 of the doublets is substantially similar to the frequency profile 40 of the prototype signal 30. In particular, the main lobe 284 of frequency profile 280 appears to be about the same as the main lobe 44 of frequency profile 40, especially within the frequency band of interest 10.

Figure 29:
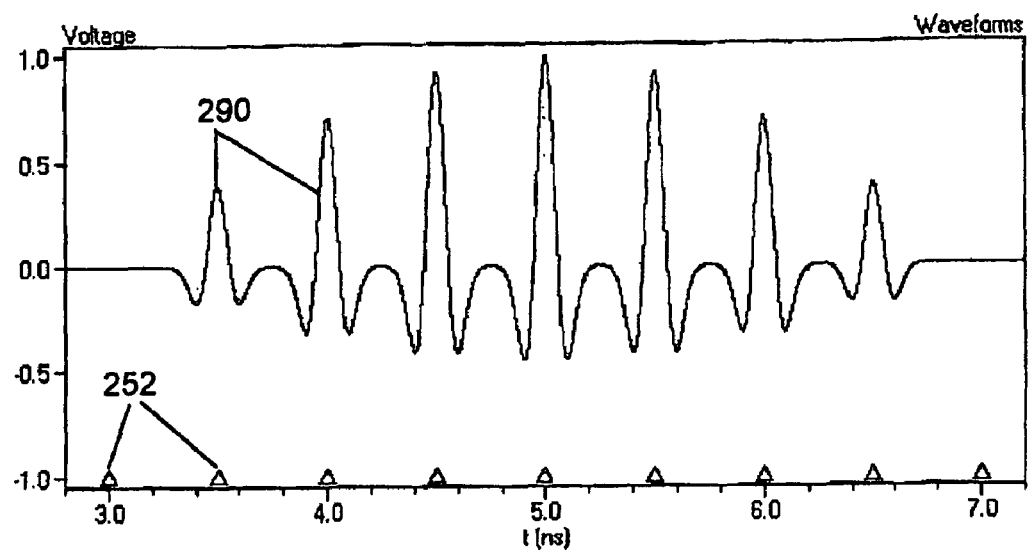
FIG. 29 illustrates exemplary triplets generated in accordance with samples of the prototype signal at a 2 GHz sampling rate.
Figure 30:
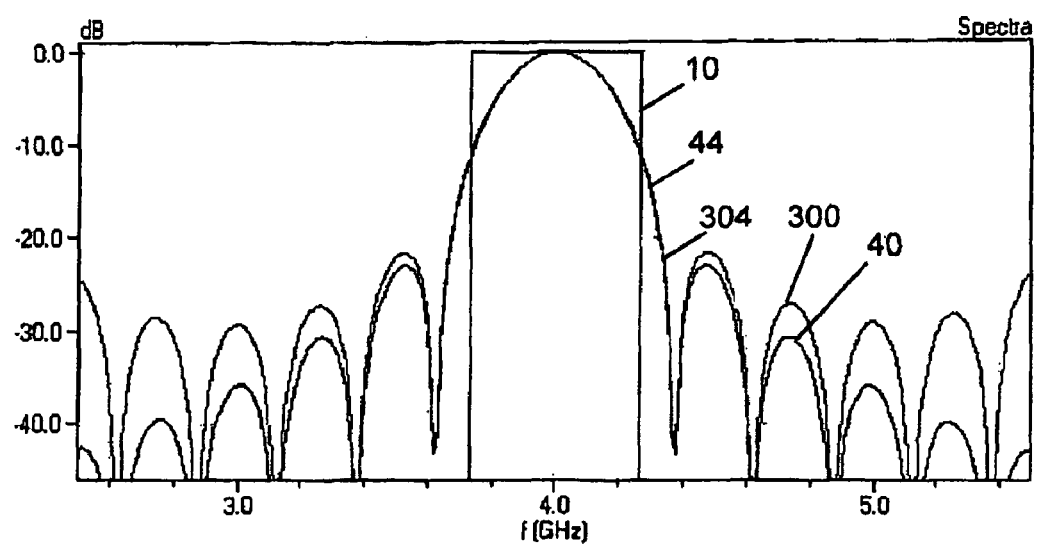
FIG. 30 shows the frequency profile of the triplets of FIG. 29.

FIG. 29 depicts triplets 290 scaled in accordance with samples of the time profile of the prototype signal 30 of FIG. 3. In FIG. 29, the location of the triplets 290 was arbitrarily selected such that main lobe of the triplets aligns with the sample times. FIG. 30 illustrates the frequency profile 300 of the triplets overlaid upon the frequency profile 40 of the prototype signal 30 of FIG. 3. Again, markers 252 indicate the time locations of the samples. It is evident that the frequency profile 300 of the triplets is substantially similar to the frequency profile 40 of the prototype signal 30. In particular, the main lobe 304 of frequency profile 300 appears to be about the same as the main lobe 44 of frequency profile 40, especially within the frequency band of interest 10.

Figure 31:
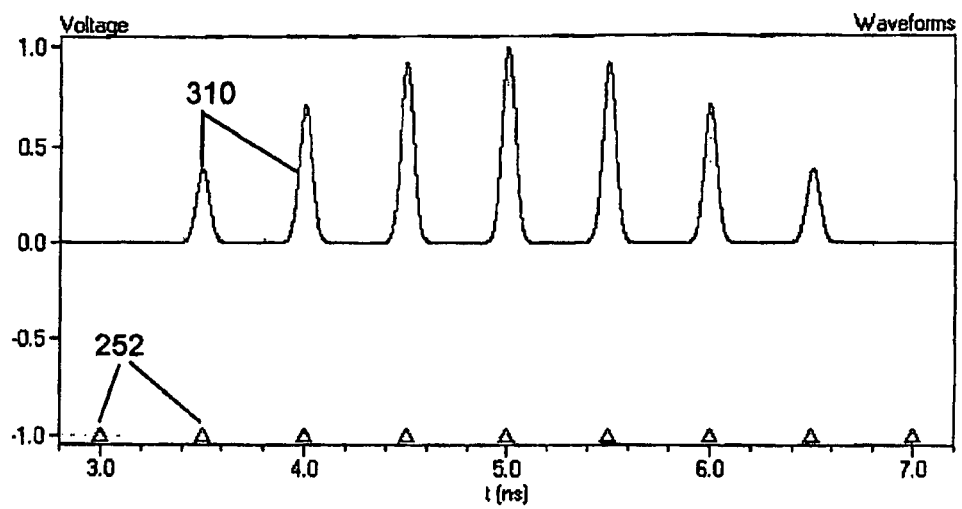
FIG. 31 illustrates exemplary gaussian pulses generated in accordance with samples of the prototype signal at a 2 GHz sampling rate.
Figure 32:
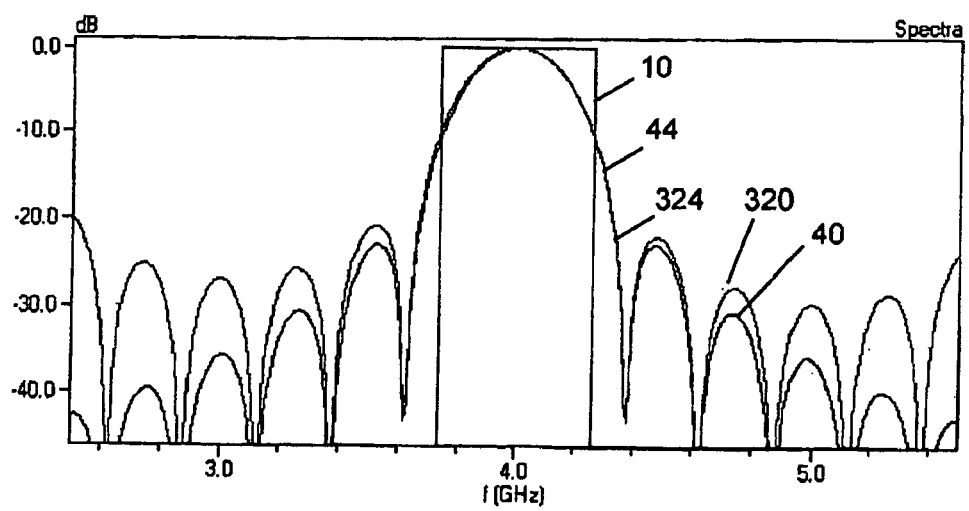
FIG. 32 shows the frequency profile of the gaussian pulses of FIG. 31.

FIG. 31 depicts Gaussian pulses 310 scaled in accordance with samples of the time profile of the prototype signal 30 of FIG. 3. In FIG. 31, the location of the Gaussian pulses 310 was arbitrarily selected such that the pulses are centered about the sample times. FIG. 32 illustrates the frequency profile 320 of the Gaussian pulses overlaid upon the frequency profile 40 of the prototype signal 30 of FIG. 3. Again, markers 252 indicate the time locations of the samples. It is evident that the frequency profile 320 of the Gaussian pulses is substantially similar to the frequency profile 40 of the prototype signal 30. In particular, the main lobe 324 of frequency profile 320 appears to be about the same as the main lobe 44 of frequency profile 40, especially within the frequency band of interest 10.

Figure 33:
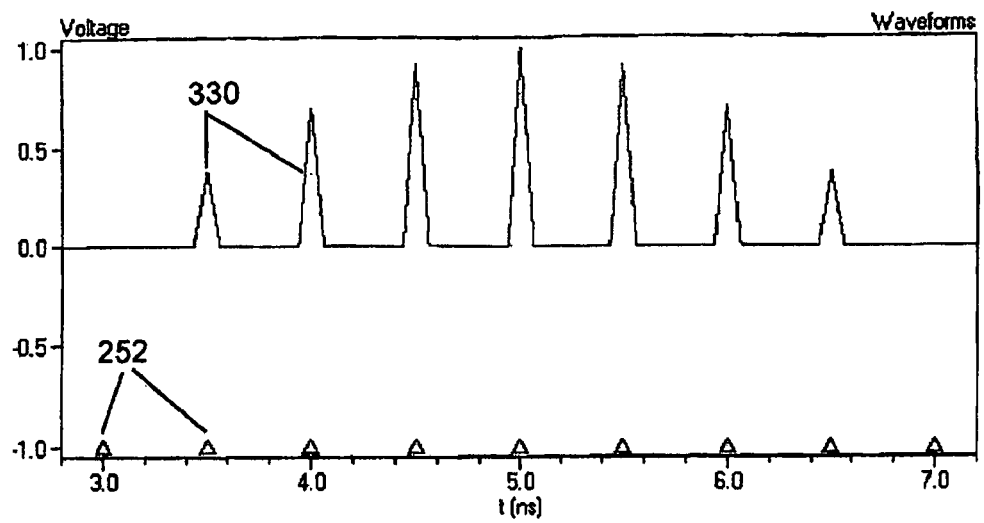
FIG. 33 depicts exemplary triangle pulses generated in accordance with samples of the prototype signal at a 2 GHz sampling rate.
Figure 34:
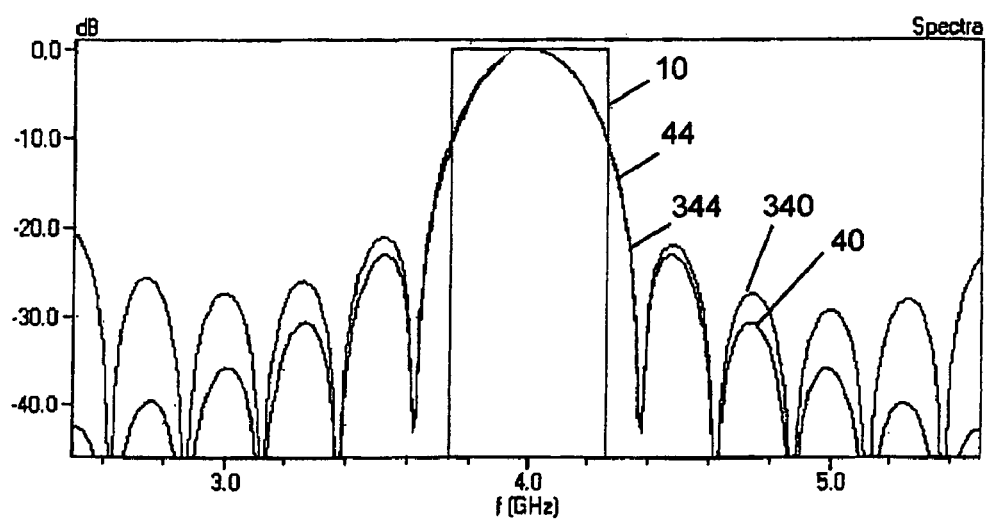
FIG. 34 shows the frequency profile of the triangle pulses of FIG. 33.

FIG. 33 depicts triangle waveforms 330 scaled in accordance with samples of the time profile of the prototype signal 30 of FIG. 3. In FIG. 33, the location of the triangle waveforms 330 was arbitrarily selected such that the triangle waveforms are centered about the sample times. FIG. 34 illustrates the frequency profile 340 of the triangle waveforms overlaid upon the frequency profile 40 of the prototype signal 30 of FIG. 3. Again, markers 252 indicate the time locations of the samples. It is evident that the frequency profile 340 of the triangle waveforms is substantially similar to the frequency profile 40 of the prototype signal 30. In particular, the main lobe 344 of frequency profile 340 appears to be about the same as the main lobe 44 of frequency profile 40, especially within the frequency band of interest 10.

Thus, FIGS. 25 through 34 provide examples of a pluralities of impulse, doublet, triplet, Gaussian, and triangle waveforms respectively, generated based on samples of the prototype signal 30 of FIG. 3 emulating the prototype signal 30 such that their frequency profiles are substantially similar to the frequency profile 40 of the prototype signal 30. Furthermore, FIGS. 25 through 34 also provide examples of a pluralities of impulse, doublet, triplet, Gaussian, and triangle waveforms respectively, generated based on samples of the prototype signal 30 of FIG. 3 emulating the desired waveform comprising the main lobe 20 of FIG. 2, where the spectral characteristics of the various RF waveforms substantially meet desired spectral requirements.

By comparing FIGS. 26, 28, 30, 32, and 34 it is apparent that the example frequency profiles of the pluralities of impulse, doublet, triplet, Gaussian, and triangle waveforms generated in accordance with the invention are substantially the same, especially within the frequency band of interest 10.

Figure 35:
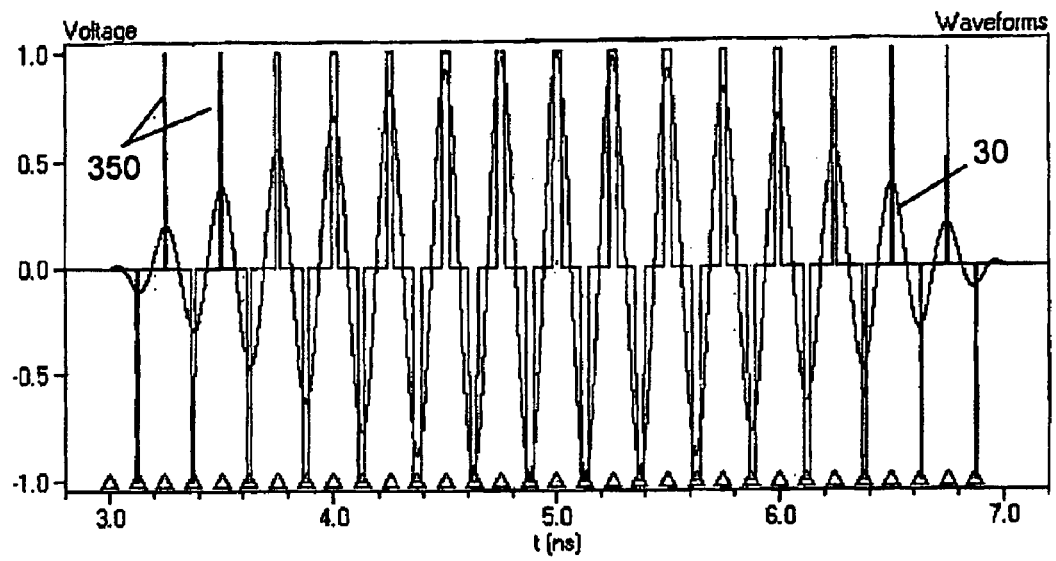
FIG. 35 depicts width modulated square wave pulses in accordance with an embodiment of the invention.
Figure 36:
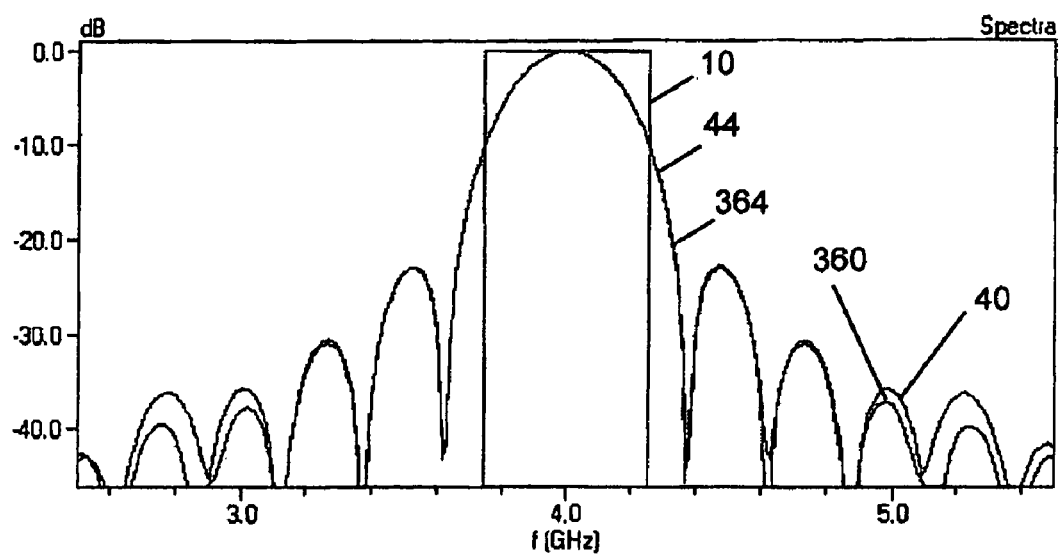
FIG. 36 shows the frequency profile of the width modulated square wave pulses of FIG. 35.

As discussed previously, under one embodiment of the invention, the amplitude of each generated RF waveform of the plurality of RF waveforms is held constant (or substantially constant) and the widths of the RF waveforms are scaled based on corresponding samples of the prototype signal. FIG. 35 presents square wave pulses 350 having the same amplitude and having widths scaled in accordance with the samples shown in FIGS. 13 and 14. In FIG. 35, the location of the square wave pulses 350 was arbitrarily selected such that the pulses are centered about the sample times. FIG. 36 illustrates the frequency profile 360 of the square wave pulses overlaid upon the frequency profile 40 of the prototype signal 30 of FIG. 3. Again, markers 252 indicate the time locations of the samples. It is evident that the frequency profile 360 of the square wave pulses is substantially similar to the frequency profile 40 of the prototype signal 30. In particular, the main lobe 364 of frequency profile 360 appears to be about the same as the main lobe 44 of frequency profile 40, especially within the frequency band of interest 10.

In accordance with the invention, the amplitudes of the other types of RF waveforms can also be held constant (or substantially constant) and their widths varied to scale their energy based on samples of the time profile of the prototype signal. Furthermore, one skilled in the art will recognize that the energy of any one RF waveform of the plurality of RF waveforms can be scaled by varying the amplitude or width or both the amplitude and width. In other words, the amplitude and width of any RF waveform of the plurality of RF waveforms can be allowed to vary. Additionally, when amplitudes and widths are allowed to vary, a constant (or substantially constant) ratio of amplitude to width can be maintained such that the waveforms have the same general appearance but are scaled proportionally.

Filtering

Figure 37:
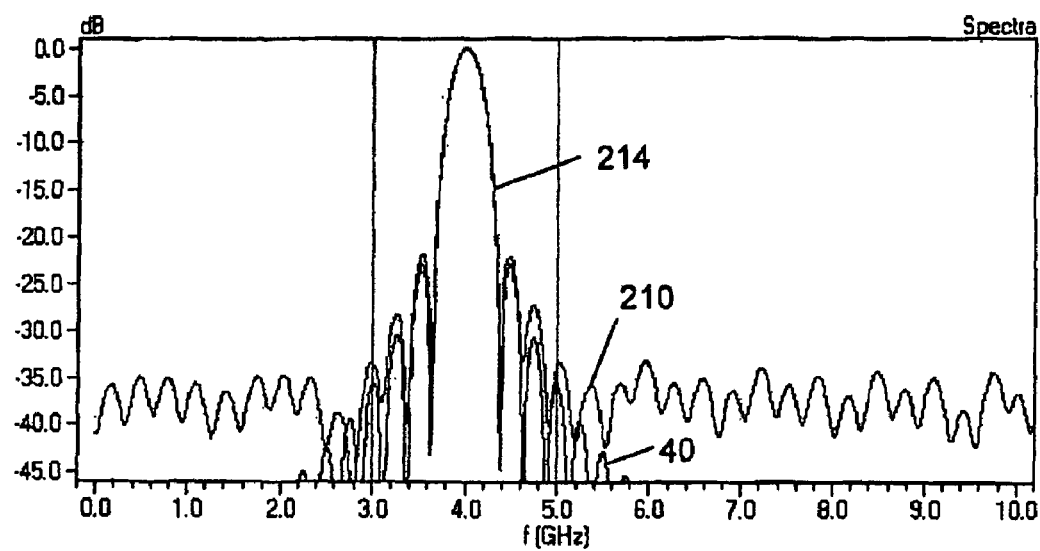
FIG. 37 presents the 'zoomed out' frequency profile of FIG. 21.

In one embodiment of the invention, the aggregate energy spectra of the plurality of RF waveforms can optionally be limited to the frequency band of interest or to some other frequency band. One skilled in the art will recognize that a lowpass filter, highpass filter, bandpass filter, or a combination of a lowpass filter and a highpass filter can be used to remove frequencies below and/or above a frequency band of interest. FIG. 37, for example, depicts the frequency profile 210 of impulses generated based on the samples 130 of FIG. 13 overlaid on the frequency profile 40 of the prototype signal 30 as previously shown in FIG. 21, except FIG. 37 is 'zoomed out' to show frequencies from 0 to 10 GHz. In FIG. 37, a larger frequency band of interest than the one previously shown has been selected, which is from 3 to 5 GHz. One skilled in the art will recognize that the frequency profile 210 of the plurality of impulses generated in accordance with the invention includes low frequency and high frequency spectral artifacts not present in frequency profile 40 of the prototype signal 30. These 'out of band' spectral artifacts that can be produced in accordance with the invention may or may not be significant. For certain applications of the invention, such spectral artifacts may simply be ignored while in other applications it may be desirable to filter out the spectral artifacts. Accordingly, in an optional embodiment of the invention, such spectral artifacts can be filtered using conventional filtering techniques.

Figure 38:
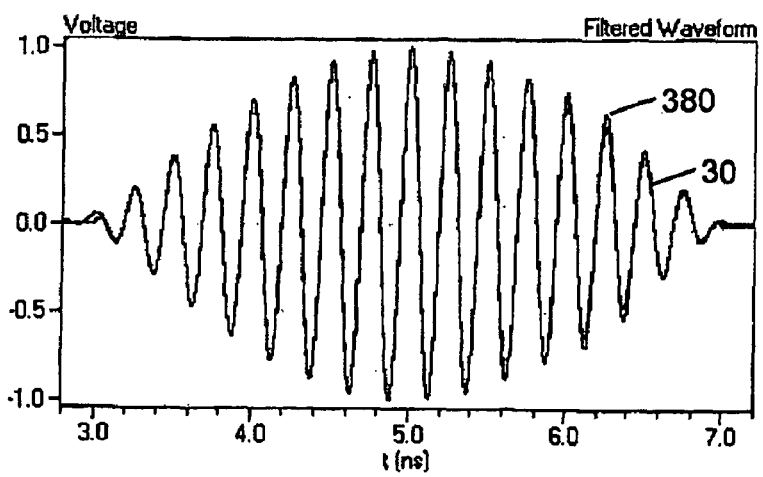
FIG. 38 presents the filtered waveform produced by limiting the energy of the frequency profile of FIG. 37 to the frequency band of interest.

FIG. 38 presents the time profile of a filtered waveform 380 produced by bandpass filtering out of band spectral artifacts of the aggregate energy of the plurality of impulses generated in accordance with the invention, where the time profile of the filtered waveform 380 is overlaid upon the time profile of the prototype signal 30. From FIG. 38 it is evident that the filtered waveform 380 is substantially the same as the prototype signal 30.

One skilled in the art will also understand that electronic components can be selected that do not respond to certain low and/or high frequencies and therefore effectively filter them in a manner similar to a filter device.

RF Waveform Generator

According to another aspect of the invention, a method for generating waveforms includes generating the plurality of RF waveforms at a waveform generation rate that is selected in accordance with a center frequency within a frequency band of interest. Each RF waveform of the plurality of RF waveforms is modulated in accordance with the time profile of the desired waveform to produce an aggregate RF energy that approximates the spectral characteristics of the desired waveform. The plurality of RF waveforms can be amplitude and/or width modulated in accordance with the sample values of the time profile to produce the desired aggregate RF energy.

Figure 39:
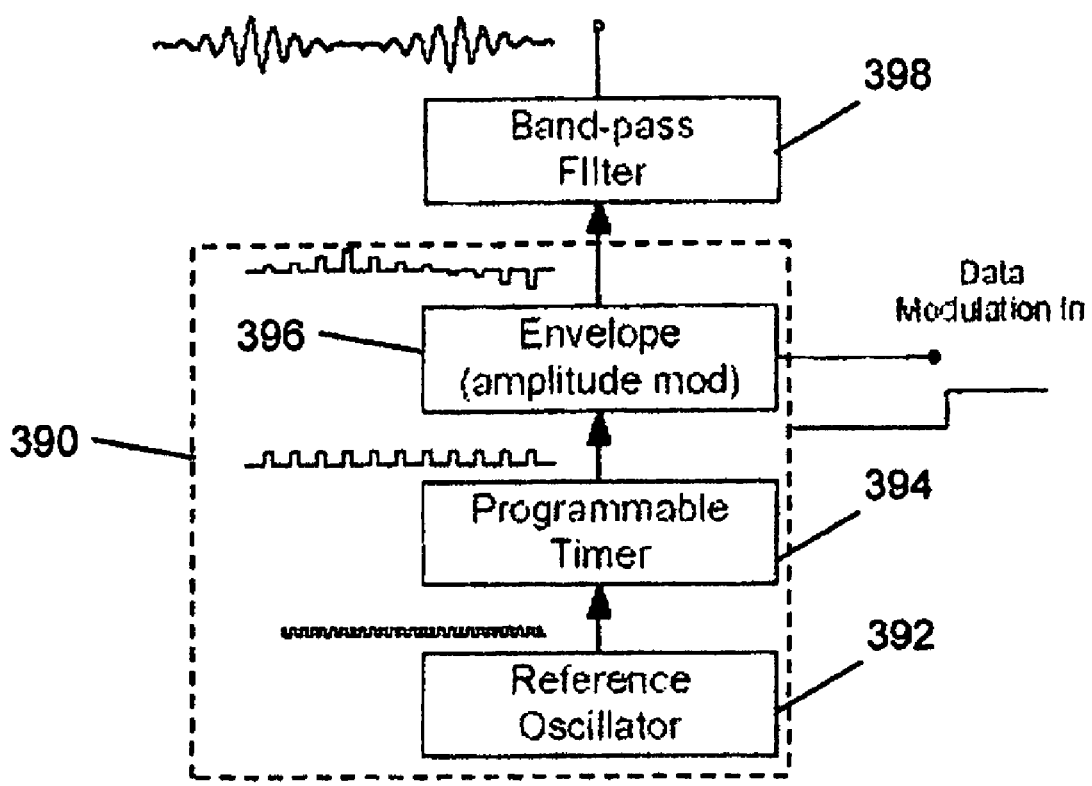
FIG. 39 presents an exemplary waveform generator in accordance with an embodiment of the invention.

FIG. 39 shows a block diagram of a waveform generator 390 in accordance with one embodiment of the present invention. In its simplest form, the waveform generator 390 of the invention generates a plurality of RF waveforms in accordance with samples of the prototype signal to produce aggregate energy with a desired PSD within a frequency band of interest, e.g., 3 GHz to 5 GHz.

In accordance with one embodiment, the timing between each of the plurality of RF waveforms is substantially the same. The waveform generator 390 of the present invention includes an oscillator 392, a timer 394 that generate the plurality of RF waveforms at a waveform generation rate. Under one embodiment, the waveform generator 390 has a variable rate controlled by a variable timer 394, which may be programmable for setting the time spacing between RF waveforms, thereby changing the center frequency of the generated waveform. In accordance with an alternative embodiment, the variable timer 394 can also be used to produce RF waveforms having non-uniform time spacing.

The waveform generator 390 includes an envelope modulator 396 that amplitude modulates the generated plurality of RF waveforms in accordance with sample values of a time profile of a prototype signal having a desired envelope. Thus, the waveform generator 390 generates a plurality of RF waveforms each having energy scaled in accordance with the invention to produce aggregate energy that emulates the prototype signal and thus the desired waveform. As explained above, amplitude, width or a combination of both can be varied to scale the energy of the RF waveforms. Accordingly, envelope modulator 396 of FIG. 39 can alternatively be replaced by a width modulator or a modulator capable of varying both the width and amplitude of the RF waveforms in accordance with the present invention.

In accordance with one embodiment, the duration, shape and peak amplitude of the desired envelope can be programmable so as to vary the emulated prototype signal for data modulation and/or channelization purposes. The modulator can include an input for modulating the RF waveforms and/or an input for defining a communications channel. The plurality of RF waveforms and thus the emulated prototype signal may be modulated using various modulation techniques including, but not limited to, single or multi-level phase modulation (e.g., BPSK, QPSK, QAM, etc) as well as any differential variations thereof, e.g., DBPSK. Thus, the desired waveform can also be modulated by an information signal or in accordance with a code.

In FIG. 39, the envelope modulator 396 is shown to have an optional data modulation signal input that might cause it to affect the samples is some manner as to convey information. A 'channel code' signal could also be applied to the envelope modulator 396 in conjunction with or as an alternative to the data modulation signal. Alternatively, the optional data modulation signal and/or channel code signal could be input into the timer in order to affect the timing of the RF waveforms in some manner as to convey information and/or for channelization purposes. The data modulation and/or channel code signal could also be applied to both the envelope modulator 396 and the programmable timer 394. One skilled in the art will recognize that various methods could be applied to affect the plurality of RF waveforms as to convey information and/or to define a communications channel.

FIG. 39 also includes an optional filter 398 that limits the aggregate energy of the plurality of RF waveforms to the frequency band of interest. In the exemplary embodiment, filter 398 limits the aggregate energy of the plurality of RF waveforms to the exemplary frequency band of interest in the 3 GHz to 5 GHz range. As described below, filter 398 can also be used to select any harmonic of the plurality of harmonics in the spectra of the aggregate energy of the plurality of RF waveforms, which may exist depending on the waveform generation rate. In an alternative embodiment, each of the RF waveforms can be individually filtered as they are generated.

In the embodiment shown in FIG. 39, an oscillator 392 and programmable time 394 are used to establish the waveform generation rate, thereby the timing or time spacing between the RF waveforms. The timing corresponds to the center frequency of the main lobes of the aggregate energy of the RF waveforms. Under the exemplary embodiment shown in FIG. 39, oscillator 392 and programmable time 394 generate a plurality of constant amplitude RF waveforms, and an amplitude modulator 396 modulates such signals to produce the plurality of RF waveforms scaled in accordance with the invention. In another embodiment, each signal of the plurality of variable amplitude (or width) RF waveforms is digitally represented in terms of quantized amplitude (or width) representations. The quantized values correspond to the amplitude (or width) of each of the plurality of RF waveforms. Such quantized values can be stored in a memory (not shown). The stored quantized representations can then be retrieved and applied to a digital to analog converter (DAC) and input into the envelope modulator 396 to generate the RF waveforms at a generation rate defined by the oscillator 392 and time 394. As previously described, each RF waveform can be a wideband signal, including impulses, doublets, triplets, gaussian, or any other suitable type of waveform. Thus, the envelope modulator can include circuitry required to produce a desired shape of the RF waveforms (e.g., a doublet shape). Thus, each of the plurality of RF waveforms can be separately generated as one of a plurality of digital waveforms or a plurality of analog waveforms. The plurality of analog waveforms can be generated in response to one or more digital signals of a plurality of digital signals that are stored in a memory.

The Nyquist Theorem

The Nyquist Theorem, also known as the sampling theorem, is a principle that relates to digitization of waveforms. The theorem, developed by H. Nyquist, states that an analog signal waveform may be uniquely reconstructed, without error, from samples taken at equal time intervals at a sampling rate that is equal to or greater than twice the highest frequency component in the waveform. According to the theorem, if a waveform is sampled at less than twice its highest frequency component, the reconstructed waveform effectively contributes only noise. This phenomenon is called "aliasing" (the high frequencies are "under an alias"). For example, according to the Nyquist Theorem, the faithful reproduction of a 4 GHz waveform requires a sampling rate equal to or greater than 8 GHz. Similarly, for faithful reproduction of a 5 GHz waveform, the Nyquist Theorem requires a sampling rate equal to or greater than 10 GHz. In practice, however, the sampling rate used to digitize waveforms is often set to 2.5 times the highest frequency.

Fundamental Spectra, Harmonics, and Fold Images

As previously described, the time profile of the prototype signal can be sampled in accordance with the invention at the Nyquist sampling rate or at a rate less than or greater than the Nyquist rate. A plurality of RF waveforms are then scaled in accordance with corresponding samples of the time profile of the prototype signal to produce aggregate energy emulating that of the prototype signal where the timing of the RF waveforms corresponds to the timing of the samples. Thus, the waveform generation rate corresponds to the sampling rate.

Figure 40:
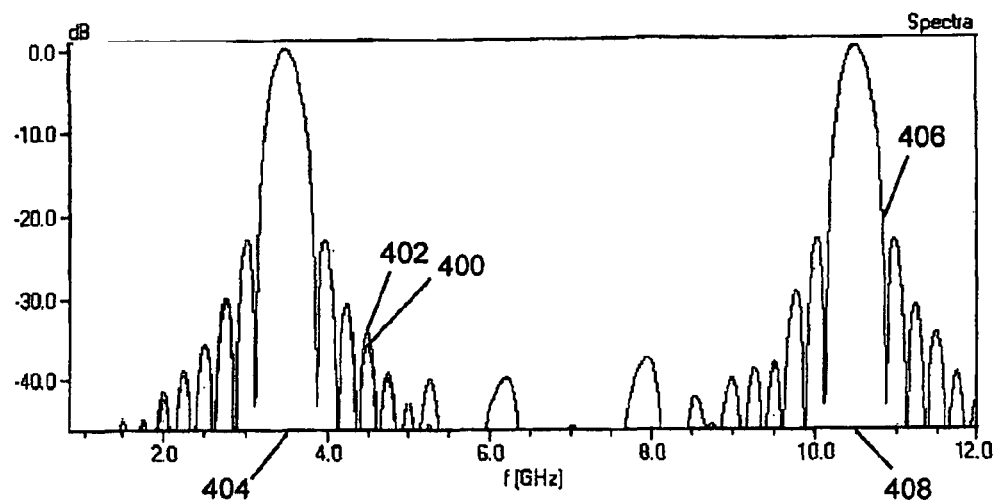
FIG. 40 depicts an exemplary harmonic of the fundamental spectra of RF waveforms generated in accordance with the invention.

The sampling rate and corresponding RF waveform generation rate used in accordance with the invention determines characteristics of the aggregate energy of the generated plurality of RF waveforms. As previously described, the carrier frequency of the prototype signal determines the center frequency of the fundamental spectra, and the envelope width and shape determines the bandwidth of the fundamental spectra. The sample/waveform generation rate determines the location of harmonics of the fundamental spectra relative to the center frequency of the fundamental spectra where each harmonic has the same bandwidth as the fundamental spectra. Specifically, harmonics of the fundamental spectra occur at even intervals of the generation rate relative to the center frequency of the fundamental spectra. For example, for a prototype signal having a 3.5 GHz carrier, the center frequency of the fundamental spectra of the plurality of RF waveforms generated in accordance with the invention is 3.5 GHz. If the prototype is sampled at 7 GHz and the plurality of RF waveforms generated at 7 GHz, harmonics of the fundamental spectra will occur at 10.5 GHz, 17.5 GHz, 24.5 GHz, etc., which corresponds to 3.5 GHz±N×7 GHz. FIG. 40 depicts the spectra of the prototype signal 400, the fundamental spectra 402 having a center frequency 404 of 3.5 GHz, and a harmonic 406 of the fundamental spectra 402 having a center frequency 408 at 10.5 GHz.

When the center frequency of the fundamental spectra is not a multiple of the sample/generation rate or vice versa, fold images will exist having fold frequencies at even multiples of the sample/generation rate. For example, in FIG. 41, the prototype signal 410 has a 3.5 carrier frequency and is sampled at 3 GHz. The alignment of the samples 412 was arbitrarily selected. FIG. 42 depicts the frequency profile of the plurality of RF waveforms generated in accordance with the samples of FIG. 41 overlaid upon the frequency profile 420 of the prototype signal 410. When impulses are scaled in accordance with the samples 412, the frequency profile of the plurality of RF waveforms shown in FIG. 42 includes fundamental spectra 421 with a center frequency of 3.5 GHz; harmonics 422 of the fundamental spectra 421 at 0.5 GHz, 6.5 GHz, 9.5 GHz, 12.5 GHz, 15.5 GHz, etc.; fold frequencies at 0 GHz, 3.0 GHz, 6.0 GHz, 9.0 GHz, 12.0 GHz, 15.0 GHz, etc.; and fold images 424 mirroring the fundamental spectra 421 and harmonics 422 that are centered at frequencies on the opposite side of the fold frequencies. Specifically, fold images 424 occur at 2.5 GHz, 5.5 GHz, 8.5 GHz, 11.5 GHz, 14.5 GHz, etc. FIG. 42 also shows a frequency band of interest 426 spanning from 3 GHz to 5 GHz.

Figure 42:
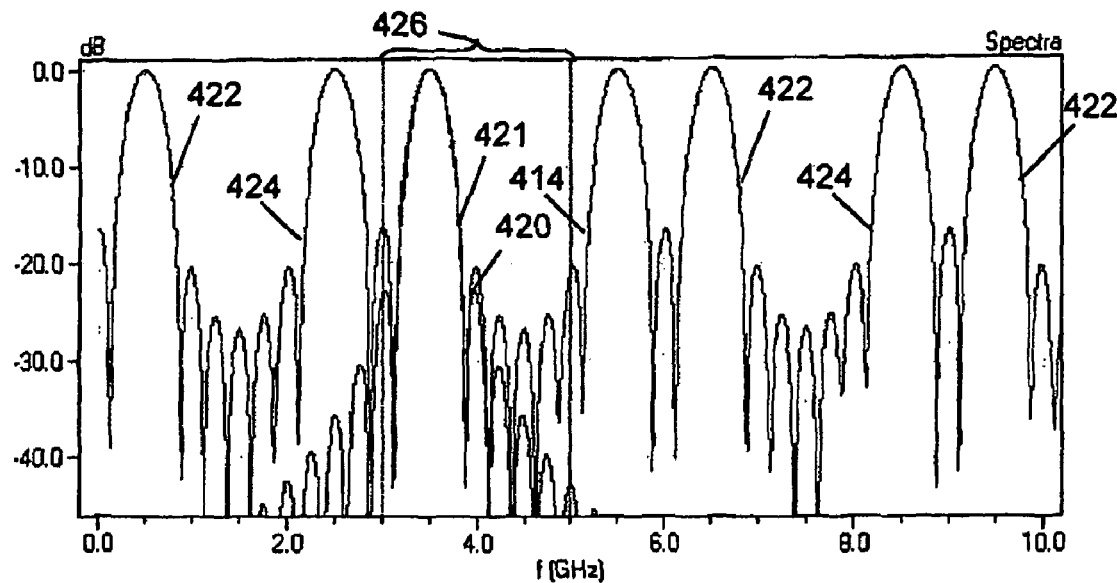
FIG. 42 depicts fundamental spectra, harmonics, and fold images in the frequency profile of RF waveforms generated in accordance with the samples shown in FIG. 41.
Figure 43:
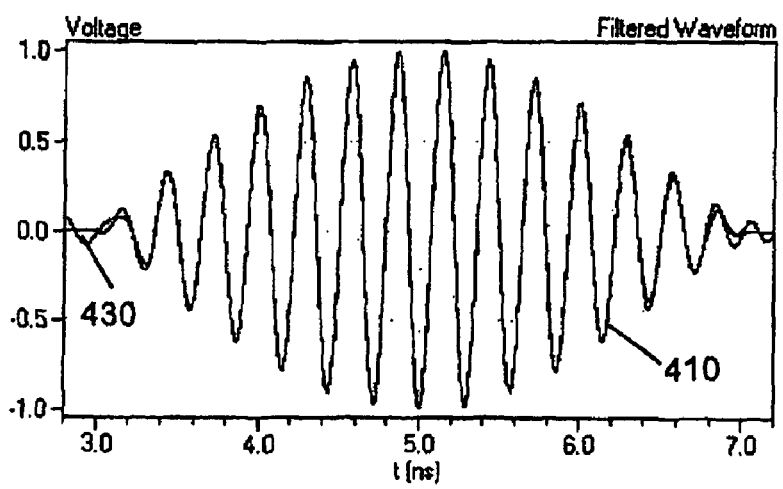
FIG. 43 presents the filtered waveform produced by limiting the energy of the frequency profile of FIG. 42 to the frequency band of interest.

As previously described, filtering can be used to remove out of band spectral artifacts. Referring again to FIG. 42, it is evident that the harmonics 422 and fold images 424 reside outside the frequency band of interest 426, which contains the fundamental spectra 421. FIG. 43 presents the filtered waveform 430 produced by using one or more filters to remove out of band frequencies from the aggregate energy spectra of the generated plurality of RF waveforms. In FIG. 43, filtered waveform 430 is substantially similar to the prototype signal 410 of FIG. 41. Thus, one or more filters may be used to limit the spectral energy of the plurality of RF waveforms to within a frequency band of interest.

Generally, one skilled in the art will recognize that one or more filters can be used to limit the spectral energy of the plurality of RF waveforms to one or more of the fundamental spectra, harmonics, and fold images. The one or more of the fundamental spectra, harmonics, and fold images can be selected in accordance with a code, which defines a communications channel, and can be selected in accordance with an information signal as a form of modulation.

Figure 41:
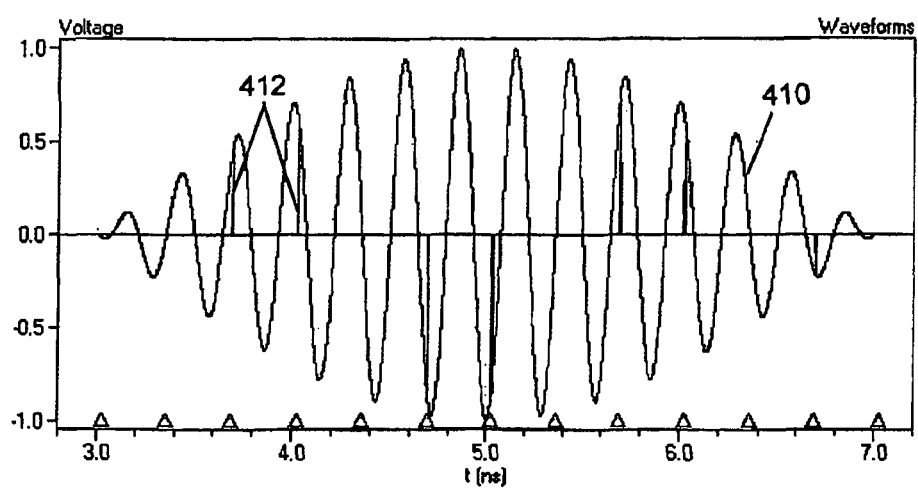
FIG. 41 illustrates sampling of an exemplary prototype signal.
Figure 44:
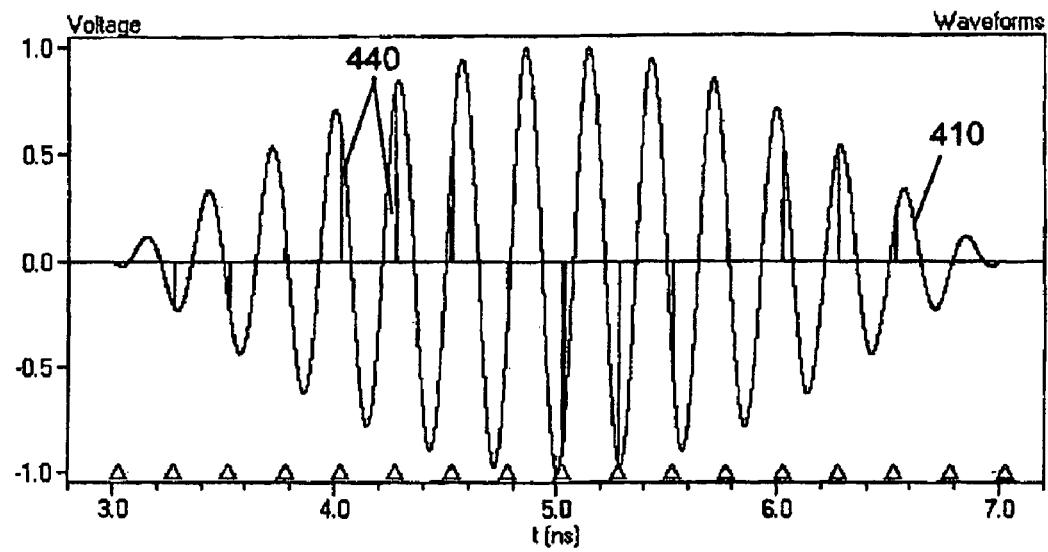
FIG. 44 illustrates sampling of the exemplary prototype signal of FIG. 41 at a different sampling rate.
Figure 45:
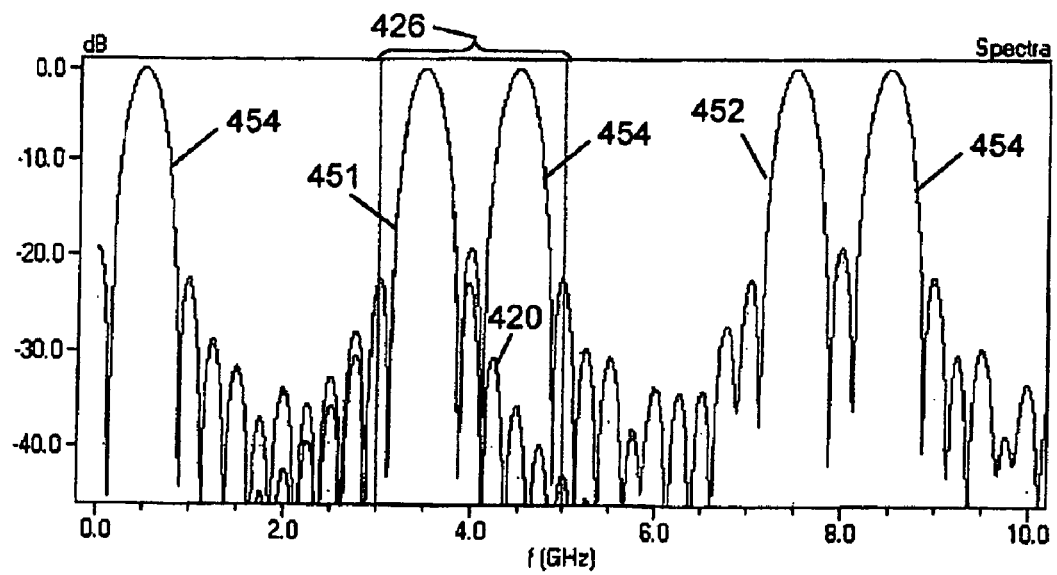
FIG. 45 depicts a fold image present inside the frequency band of interest.
Figure 46:
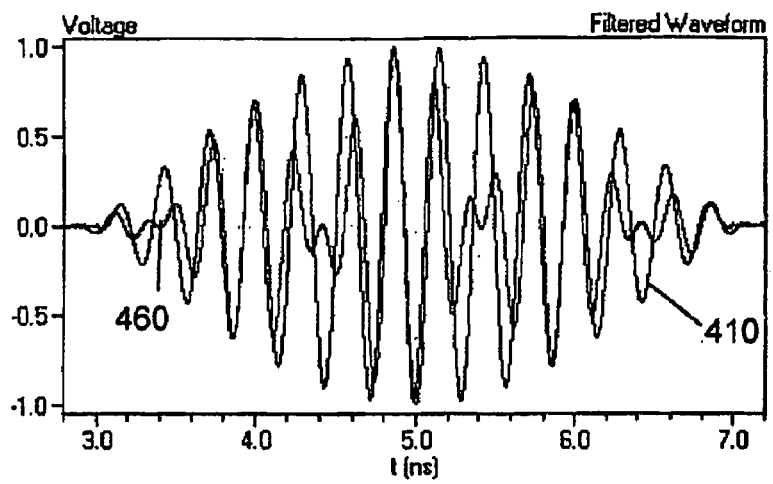
FIG. 46 illustrates the filtered waveform produced by limiting the energy of the frequency profile of FIG. 45 to the frequency band of interest.

In FIG. 44, the sample/generation rate used in the example of FIG. 41 has been changed from 3.0 GHz to 4.0 GHz. Thus, the prototype signal 410, which has a carrier frequency of 3.5 GHz, is now sampled at 4.0 GHz. The alignment of the samples 440 was arbitrarily selected. FIG. 45 depicts the frequency profile of the plurality of RF waveforms generated in accordance with the samples of FIG. 44 overlaid upon the frequency profile 420 of the prototype signal 410. When impulses are scaled in accordance with the samples 440, the frequency profile includes fundamental spectra 451 with a center frequency of 3.5 GHz and harmonics 452 of the fundamental spectra at 7.5 GHz, 11.5 GHz, 15.5 GHz, 19.5 GHz, etc.; fold frequencies at 0 GHz, 4.0 GHz, 8.0 GHz, 12.0 GHz, 16.0 GHz, 20.0 GHz, etc.; and fold images 454 mirroring the fundamental spectra 451 and harmonics 452 at frequencies that are on the opposite side of the fold frequencies. Specifically, fold images 454 occur at 0.5 GHz, 4.5 GHz, 8.5 GHz, 12.5 GHz, 16.5 GHz, etc. FIG. 45 also shows the frequency band of interest 426 spanning from 3 GHz to 5 GHz. Thus, it is apparent that using a filter to remove out of band frequencies will not remove the fold image 454 corresponding to the fundamental spectra 451 since it resides within the frequency band of interest 426. FIG. 46 presents the filtered waveform 460 produced by using one or more filters to remove out of band frequencies from the aggregate energy spectra of the generated plurality of RF waveforms. In FIG. 46, filtered waveform 460 is substantially different than the prototype signal 410 of FIG. 44 because of the fold image remaining within the frequency band of interest. One skilled in the art will recognize that if filtering were the only available means for removing undesirable spectral characteristics that a different prototype carrier frequency or sampling/generation rate might be used to cause the fold image to no longer reside within the frequency band of interest. An alternative means for removing fold images is provided below.

Group Sampling and RF Waveform Generation

Figure 47:
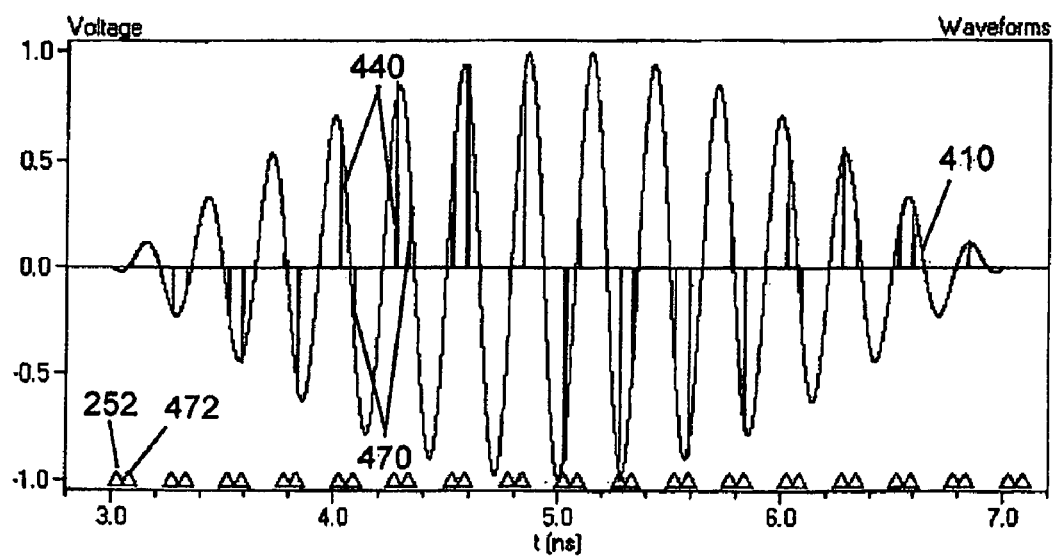
FIG. 47 presents sampling of the exemplary prototype signal of FIG. 41 using sample pairs.

In accordance with the invention, RF waveforms may be scaled and generated in one or more groups to eliminate a fold image. In one embodiment of the invention, the prototype signal is sampled and RF waveforms are generated in one or more groups, with each group comprising two or more RF waveforms having a predefined time spacing. In an exemplary embodiment, each group consists of a pair of RF waveforms having predefined time spacing corresponding to one fourth of the period of the fold frequency of a fold image to be eliminated. The inventors refer to the first pulse of each pulse pair as the I pulse and the second pulse of each pair as the Q pulse. For example, pairs of RF waveforms can be used to eliminate the fold image 454 residing within the frequency band of interest 426 of FIG. 45, which has a fold frequency of 4 GHz. As shown in FIG. 47, each of the samples 440 of the prototype signal 410, as previously shown in FIG. 44, is paired with another sample 470. The samples of each pair are spaced apart in time by one fourth of the period of the 4 GHz fold frequency of the fold image to eliminate, or 0.0625 ns. Markers 252 corresponding to the first sample of each sample pair and markers 472 corresponding to the second sample of each sample pair indicate the timing of the sample pairs.

Figure 48:
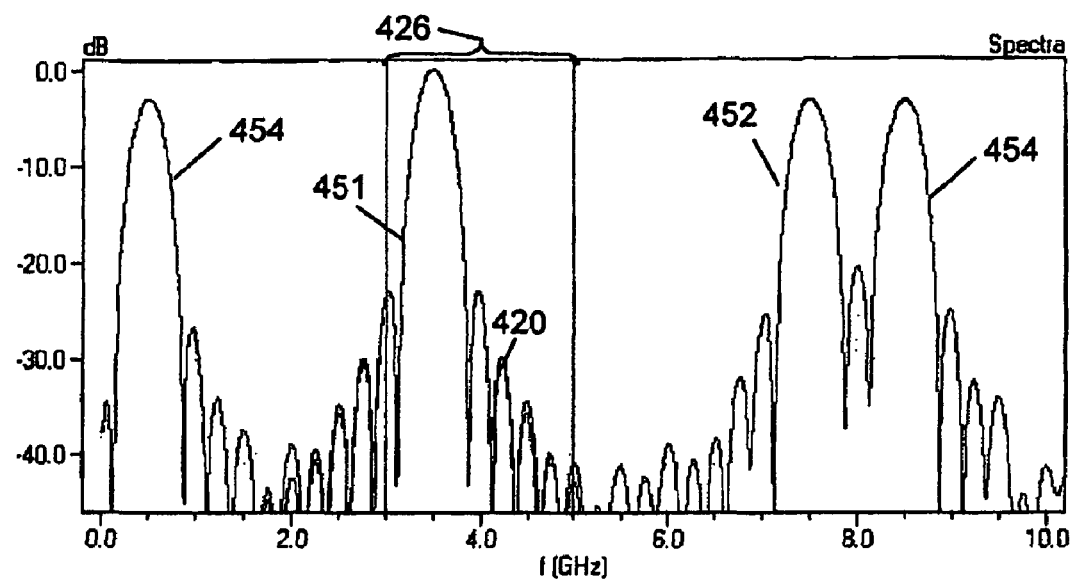
FIG. 48 illustrates the elimination of the fold image previously shown in FIG. 45 to be inside the frequency band of interest.
Figure 49:
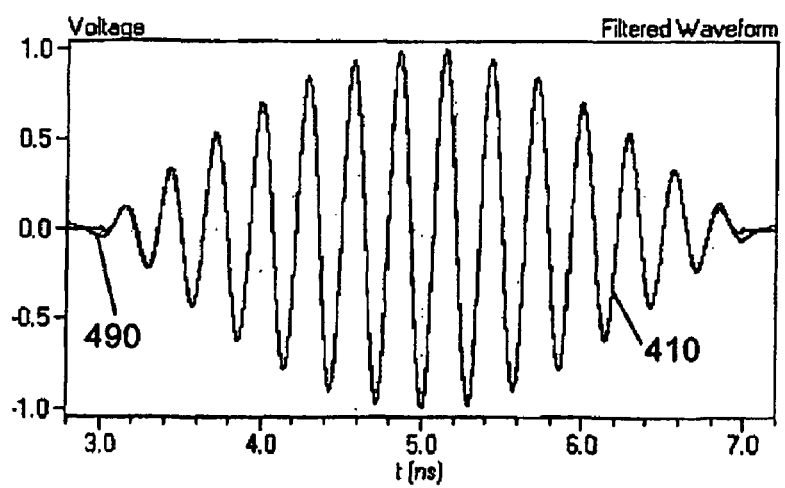
FIG. 49 presents the filtered waveform produced by limiting the energy of the frequency profile of FIG. 48 to the frequency band of interest.

FIG. 48 depicts the frequency profile 420 of the prototype signal 410 overlaid upon the frequency profile of a plurality of RF waveforms generated in accordance with the group sampling method of the invention. When comparing FIG. 48 to FIG. 45, it is evident that the fundamental spectra 451 remains within the frequency band of interest 426 and is substantially similar to the frequency profile of the prototype signal 420. The first harmonic 452 of the desired waveform 451 remains as well as the first and third fold images 454. However, the fold image 454, which had resided within the frequency band of interest 426 in FIG. 45, is no longer present in FIG. 48. FIG. 49 presents the filtered waveform 490 produced by using one or more filters to remove out of band frequencies from the aggregate energy spectra of the generated plurality of RF waveforms. In FIG. 49, filtered waveform 490 is substantially similar to the prototype signal 410 of FIG. 47.

In accordance with the invention, the fold image having a fold frequency of 8 GHz can be eliminated by changing the time spacing between samples to one fourth of the period of the 8 GHz fold frequency of the fold image to eliminate, or 0.0375 ns, and so forth. Furthermore, groups of two or more samples having a predefined time spacing (and corresponding RF waveforms) can also be used in accordance with the invention to eliminate fold images.

Figure 50:
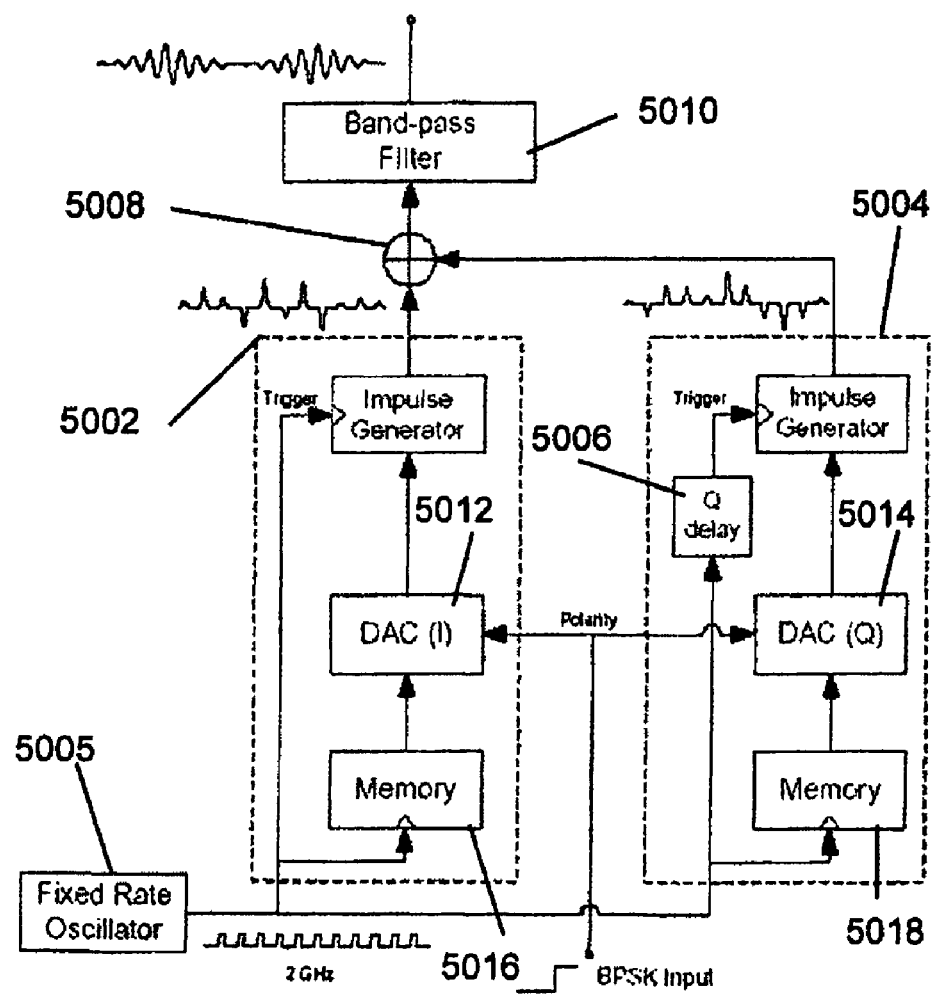
FIG. 50 presents waveform generators in accordance with one embodiment of the invention.

FIG. 50 shows a block diagram for implementing this aspect of the present invention. FIG. 50 includes first and second RF waveform generators, 5002 and 5004, respectively, that together generate pairs of RF waveforms in accordance with pairs of samples of the prototype signal. The first RF waveform generator 5002 generates a first plurality of RF waveforms in accordance with the first sample of each pair of samples of the prototype signal, and the second RF waveform generator 5004 generates a second plurality of RF waveforms in accordance with the second sample of each pair of samples of the prototype signal. Under this arrangement, a fixed rate oscillator 5005 corresponds to the waveform generation rate of both the first plurality of RF waveforms and second plurality of RF waveforms. As shown, the second RF waveform generator 5004 includes a delay element 5006 that establishes the time spacing between each of the second plurality of RF waveforms and a corresponding one of the first plurality of RF waveforms. In other words, delay element 5006 establishes the time spacing between the RF waveforms of each pair of RF waveforms. A combiner 5008 then combines the first plurality of RF waveforms and the second plurality of RF waveforms into a combined plurality of RF waveforms. Finally, an optional filter 5010 limits the spectral energy of the combined plurality of RF waveforms to within a frequency band of interest.

In one embodiment, the first and second waveform generators amplitude modulate their respective pluralities of RF waveforms. The first and second waveform generators 5002 and 5004 include corresponding first and second memories, 5016 and 5018, respectively, that store data representative of quantized amplitudes of each RF waveform. Corresponding first and second digital-to-analog converters (DACs) 5012 and 5014 convert the quantization data into analog signals used by impulse generators to generate first and second pluralities of RF waveforms.

As described previously, various methods can be used to modulate the combined plurality of RF waveforms in order to convey information. For example, the first and second DACs, or the first and second impulse generators, could optionally include corresponding inputs for modulating the RF waveforms to convey information. Modulation methods include, but are not limited to, single or multi-level phase modulation (e.g., BPSK, QPSK, QAM, etc.) as well as any differential variations thereof, e.g., DBPSK.

Of course, the impulse generators could be replaced with signal generators that generate other types of RF waveforms such as doublets, triplets, etc. It should be further noted that although this embodiment uses amplitude modulation, width modulation or a combination of both might also be used to scale the energy of the generated RF waveforms in accordance with the pairs of samples of the prototype signal.

Figure 51:
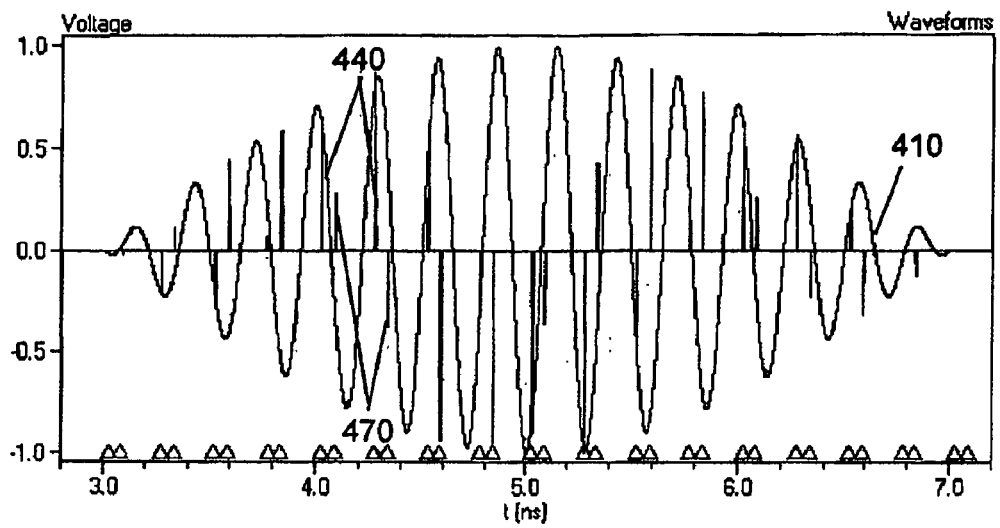
FIG. 51 illustrates the inverting of one sample of each of the sample pairs of FIG. 47.

The RF waveform grouping method can be used to select between the fundamental spectra and its corresponding fold image. As shown in FIGS. 47 through 49, samples having a time spacing of 0.0625 ns result in pairs of RF waveforms having energy spectra in which the fold image within the frequency band of interest has been eliminated. The inventors have determined that either the first RF waveform or the second RF waveform of each pair of RF waveforms can be inverted to cause the fundamental spectra to be eliminated instead of its corresponding fold image. This phenomenon can be seen in FIGS. 51 through 53. In FIG. 51, the prototype signal 410 is sampled in pairs where each pair comprises a first sample 440 and a second sample 470. When comparing FIG. 51 to FIG. 47 it can be seen that the second sample 470 of each pair has been inverted, which results in the second RF waveform being inverted of each RF waveform pair.

Figure 52:
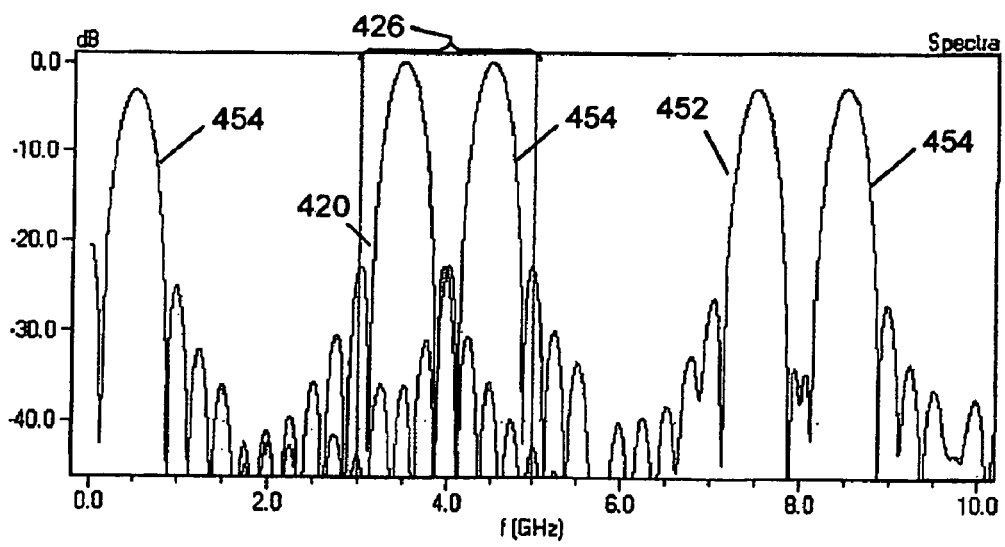
FIG. 52 depicts the elimination of the fundamental spectra in accordance with one embodiment of the invention.

The frequency profile of the plurality of RF waveforms generated in accordance with the samples of FIG. 51 is provided in FIG. 52. In FIG. 52, it is apparent that the fold image 454 previously eliminated from FIG. 48 is again present and instead the fundamental spectra 451 of FIG. 48 has been eliminated. The same result occurs when the first RF waveform of each RF waveform pair is inverted instead of the second RF waveform.

Figure 53:
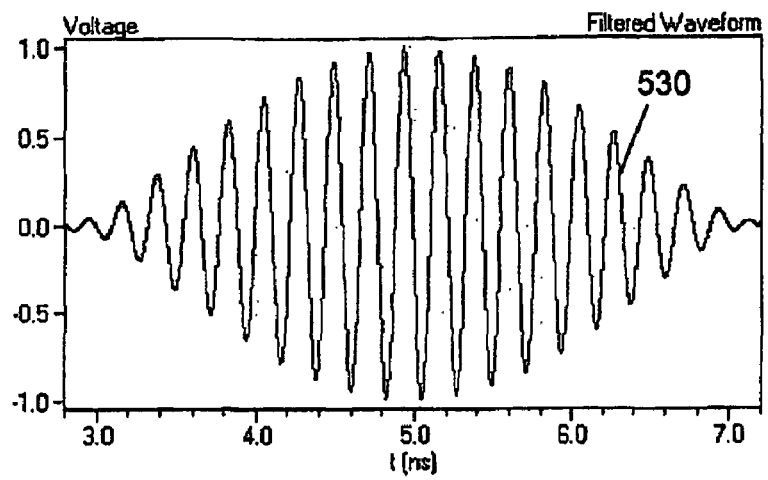
FIG. 53 presents the filtered waveform produced by limiting the energy of the frequency profile of FIG. 52 to the frequency band of interest.

FIG. 53 presents the filtered waveform produced by using one or more filters to remove out of band frequencies from the aggregate energy spectra of the generated plurality of RF waveforms. In FIG. 53, filtered waveform 530 has the same envelope shape as the prototype signal 410 of FIG. 51 except the carrier frequency is now that of the fold image present within the frequency band of interest. Thus, one skilled in the art will recognize that either the first or second RF waveform of each pair of RF waveforms generated in accordance with the invention can be selectively inverted to toggle between emulation of a first prototype signal having a first carrier frequency and a second prototype signal having a second carrier frequency.

The sample inverting technique can be useful for modulation, channelization, or other purposes. Another benefit of the technique is that it can be used to lower system costs. For example, the technique could be used to produce a dual band communications system where only the sample pairs needed to define a signal transmitted in a first band are stored in memory and the signal transmitted in a second band is defined by inverted one of the samples of the stored sample pairs. Similarly, a multi-band communications system involving N bands could use the technique so only the samples that define N/2 bands are stored and the remaining bands are produced by inverting one of the samples of each stored pair of samples. Thus, system costs related to storage of sample values in memory can be reduced. Use of the invention in Multi-band communications systems is discussed further below.

Additional Aspects of the Desired Waveform

Under one aspect of the invention, the desired waveform can correspond to a plurality of orthogonal waveforms. Thus, the time profile of the desired waveform can correspond to the time profile of a plurality of orthogonal waveforms. In one embodiment, the desired waveform corresponds to a plurality of orthogonal waveforms that are orthogonal when arriving at different times at a receiver. In another embodiment, the desired waveform corresponds to a plurality of orthogonal waveforms having the same power spectral density profile, but their phase profiles across a frequency span cause the plurality of orthogonal waveforms to be orthogonal. For example, the phase of a first orthogonal waveform can correspond to the phase of a second orthogonal waveform rotated an even multiple of $2\pi$ radians across its bandwidth. Alternatively, the plurality of orthogonal waveforms can have phase shifts in accordance with a plurality of Walsh functions. The plurality of orthogonal waveforms can also comprise n orthogonal waveforms phase shifted by 0 or $\pi$ radians in accordance with a plurality of n-bit Walsh functions. Additionally, a first orthogonal waveform of the plurality of orthogonal waveforms can be the Hilbert transform of a second orthogonal waveform of the plurality of orthogonal waveforms. Each orthogonal waveform of the plurality of orthogonal waveforms can also be an $n^{th}$ order derivative of a first orthogonal waveform of the plurality of orthogonal waveforms.

In another exemplary embodiment, the desired waveform can be modulated in accordance with at least one of an information signal and a code. Thus, the time profile of the desired waveform can be modulated in accordance with at least one of an information signal and a code. The time profile can be time limited and/or frequency limited.

Multi-Band Signals

The waveform generator of the present invention may produce aggregate RF energy confined to a one or more frequency bands within a larger frequency band of interest. In one exemplary embodiment, the larger frequency band of interest may be subdivided into a plurality of bands each having the same bandwidth, e.g., 500 MHz, which corresponds to the bandwidth of aggregate RF energy that may be present within each band. As such, the larger frequency band of interest encompasses multiple bands.

In one embodiment of the invention, signals corresponding to each band are individually defined by a different plurality of sample values. For example, a larger frequency band of interest may include four bands each having a 500 MHz bandwidth at −10 dB that have center frequencies at 3.5 GHz, 4 GHz, 4.5 GHz, and 5 GHz. In accordance with the invention, a prototype signal could be defined for each band. The prototype signal corresponding to the first band could have a 3.5 GHz carrier frequency and could be sampled at 7.0 GHz. The prototype signal corresponding to the second band could have a 4.0 GHz carrier frequency and could be sampled at 8.0 GHz. The prototype signal corresponding to the third band could have a 4.5 GHz carrier frequency and could be sampled at 9.0 GHz and the prototype signal corresponding to the fourth band could have a 5.0 GHz carrier frequency and could be sample at 10.0 GHz. Under this arrangement, a bandpass filter could optionally be used to limit energy of the transmitted signal to frequencies in a frequency band of interest between 3 GHz and 5.5 GHz. Because of the sampling rates used, harmonics would fall outside the frequency band of interest and fold images would not be produced. Thus, sample values corresponding to the four frequency bands could be used selectively by the multi-band system to switch from band to band.

Figure 54:
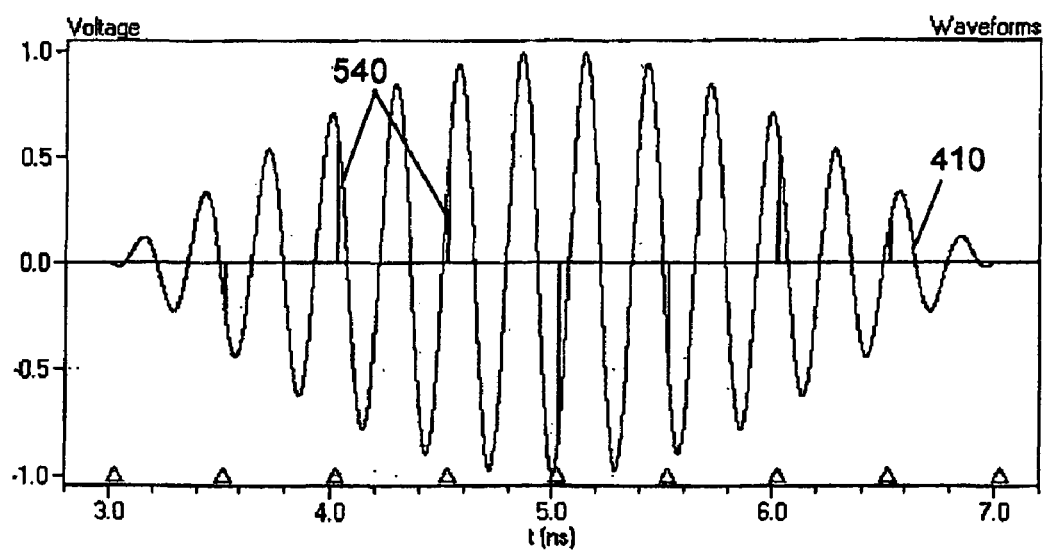
FIG. 54 depicts sampling of the prototype signal of FIG. 41 at the 2 GHz rate.
Figure 55:
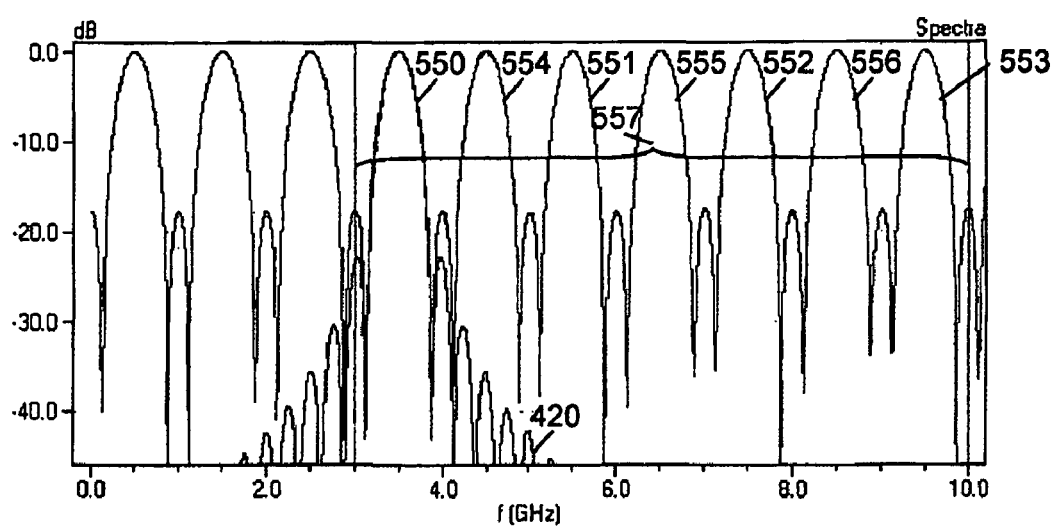
FIG. 55 shows uses of fundamental spectra, harmonics, and fold images to produce multi-band signals.

In another embodiment of the invention, fundamental spectra, harmonics of the fundamental spectra, and fold images of the fundamental spectra and of the harmonics are purposely produced to occur in the various bands used by a multi-band system and filters are used to limit transmitted energy to selected bands. For example, in FIG. 54, the prototype signal 410 of FIG. 41 is shown sampled at a 2 GHz sampling rate. Impulses generated in accordance with the samples 540 of FIG. 54 have the frequency profile depicted in FIG. 55. In FIG. 55, fundamental spectra 550 of the generated impulses is substantially the same as the frequency profile 420 of the prototype signal 410. Fundamental spectra 550 as well as harmonics 551, 552, and 553 of the fundamental spectra and fold images 554, 555, and 556 are within an exemplary frequency band of interest 557 from 3 GHz to 10 GHz. Harmonics of the fundamental spectra and fold images that are outside of the frequency band of interest 557 are ignored since they are to be removed by filtering. The fundamental spectra 550, harmonics 551, 552, and 553, and fold images 554, 555, and 556 can correspond to seven multi-band signals each having a 500 MHz bandwidth at −10 dB. One skilled in the art will recognize that one or more of the seven multi-band signals can be selected for transmission by using filters to eliminate those signals not selected for transmission. The filtering can be varied over time to switch from band to band. In one embodiment, filters are employed in accordance with a frequency band hopping code that defines a communications channel.

Communication Systems

Transmitters, Receivers, and Transceivers

Figure 56:
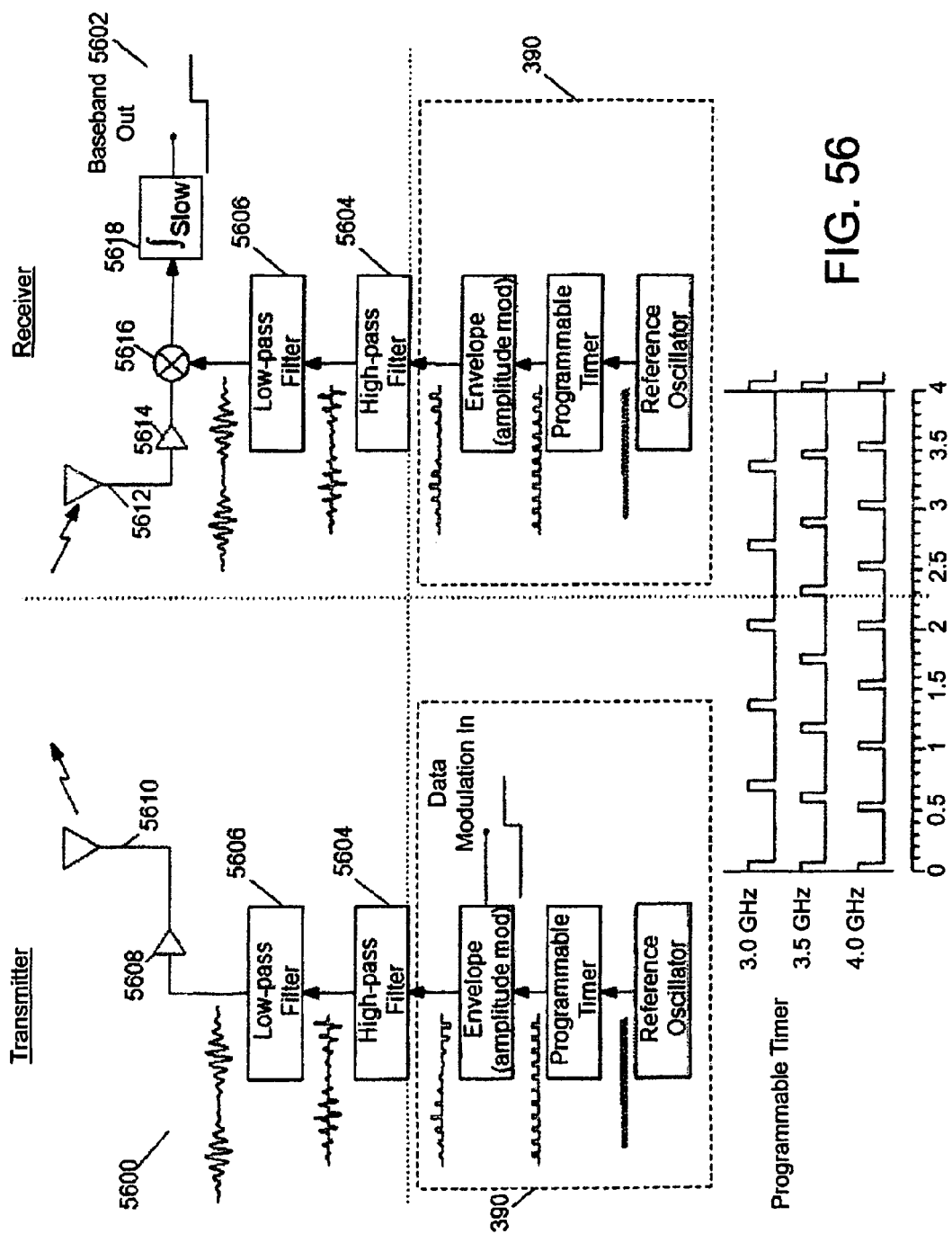
FIG. 56 is an exemplary transmitter and direct conversion receiver.

The present invention can be used in systems comprising a transmitter and a direct conversion receiver. FIG. 56 depicts a transmitter 5600 and a direct conversion receiver 5602 each including the waveform generator 390 previously described in relation to FIG. 39. It should be noted that the optional bandpass filter 398 of FIG. 39 has been replaced with optional high-pass filter 5604 and low-pass filter 5606. The transmitter 5600 of FIG. 56 produces a plurality of RF waveforms scaled in accordance with an envelope and modulated by a data signal. The plurality of RF waveforms is filtered to remove frequencies below and above a desired frequency band, the filtered waveform is amplified by operational amplifier 5608, and it is then transmitted using transmit antenna 5610. The transmitted signal is received at receive antenna 5612, amplified with operational amplifier 5614 and the received signal is correlated with a template signal in mixer 5616. The template signal can be the substantially similar to the filtered waveform produced by the transmitter or may be somewhat different to account for expected changes between the transmitted signal and the received signal resulting from the transmit antenna 5610, receive antenna 5612, the multipath environment, etc. Integrator 5618 then integrates the output of mixer 5616 and its output is demodulated to produce a baseband output corresponding to the data signal. The correlation of the received signal with the template signal can be described as a direct conversion process since the received signal is converted directly from a received signal to a baseband signal. One skilled in the art will understand that the timing of RF waveforms generated in the receiver 5602 must be adjusted so that the template signal and received signal substantially coincide in mixer 5616. In other words, the programmable timer of waveform generator 390 of receiver 5602 would be affected as to acquire and track the received signal.

Figure 57:
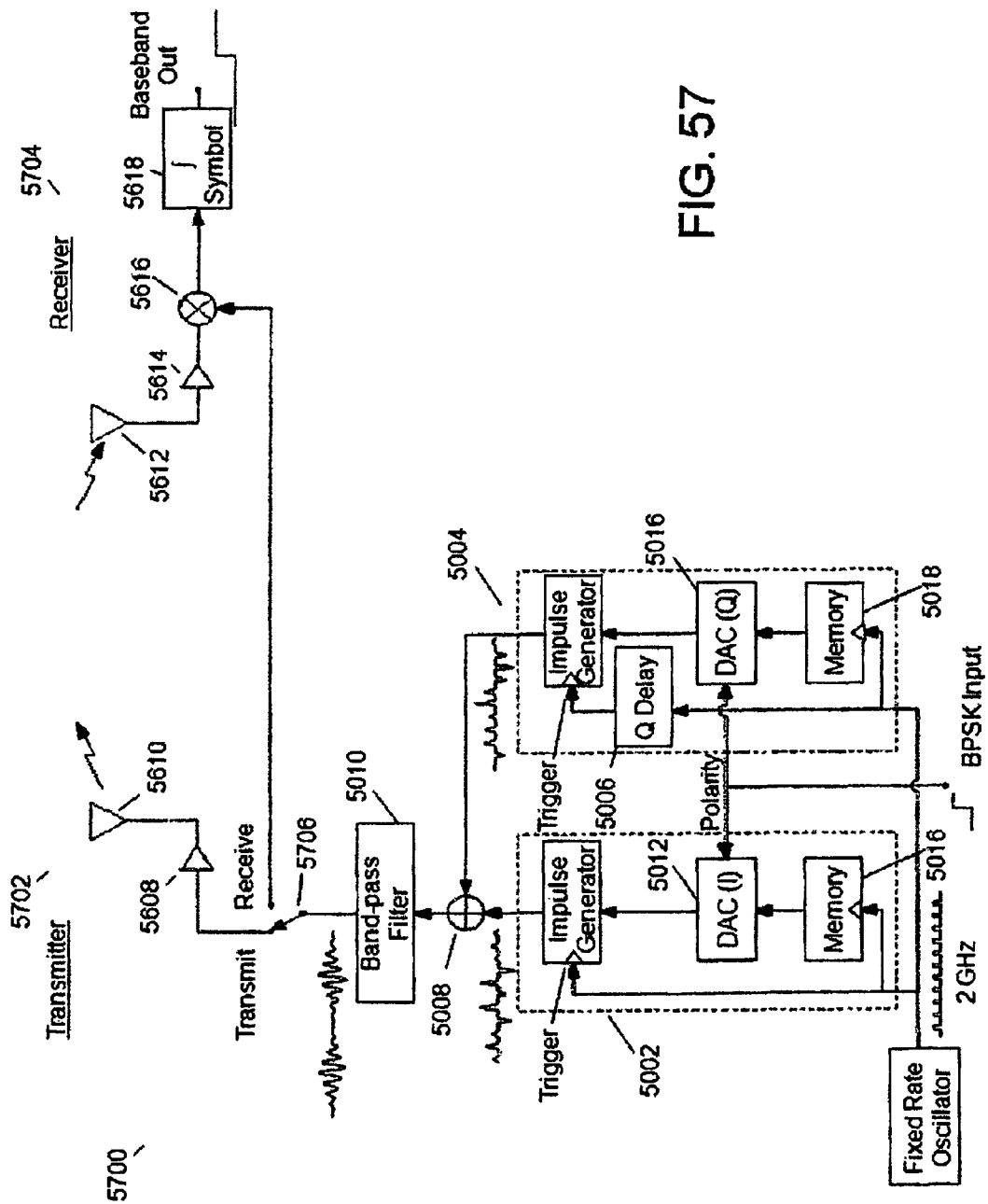
FIG. 57 depicts an exemplary transceiver.

FIG. 57 shows a transceiver 5700 including a transmitter 5702 and a receiver 5704 that use the waveform generation method described previously in relation to FIG. 50. The transmitter 5702 transmits a filtered waveform produced by combining and filtering two pluralities of RF waveforms where the a first waveform generator 5002 generates a first plurality of RF waveforms and the second waveform generator 5004 generates a second plurality of RF waveforms offset in time from the first plurality of RF waveforms by a defined delay. A first memory 5016 and a second memory 5018 store the first sample and second sample, respectively, of sample pairs determined in accordance with one embodiment of the invention. DACs 5012 and 5014 produce analog signals scaled in accordance with the stored sample values and thereby determine the amplitude of impulses generated by the waveform generators. A combiner 5008 combines the two pluralities or RF waveforms into a single plurality of RF waveforms that is optionally filtered by bandpass filter 5010. The filtered waveform (or optionally, the unfiltered plurality of RF waveforms) is directed by transmit/receive switch 5706 to the either operational amplifier 5608 and transmit antenna 5610 of transmitter 5702 for transmission or to mixer 5616 of receiver 5704 for use as a template signal to correlate with the received signal. The direct conversion operation of the receiver 5704 is the same as previously described for the receiver 5602 of FIG. 56.

Figure 58:
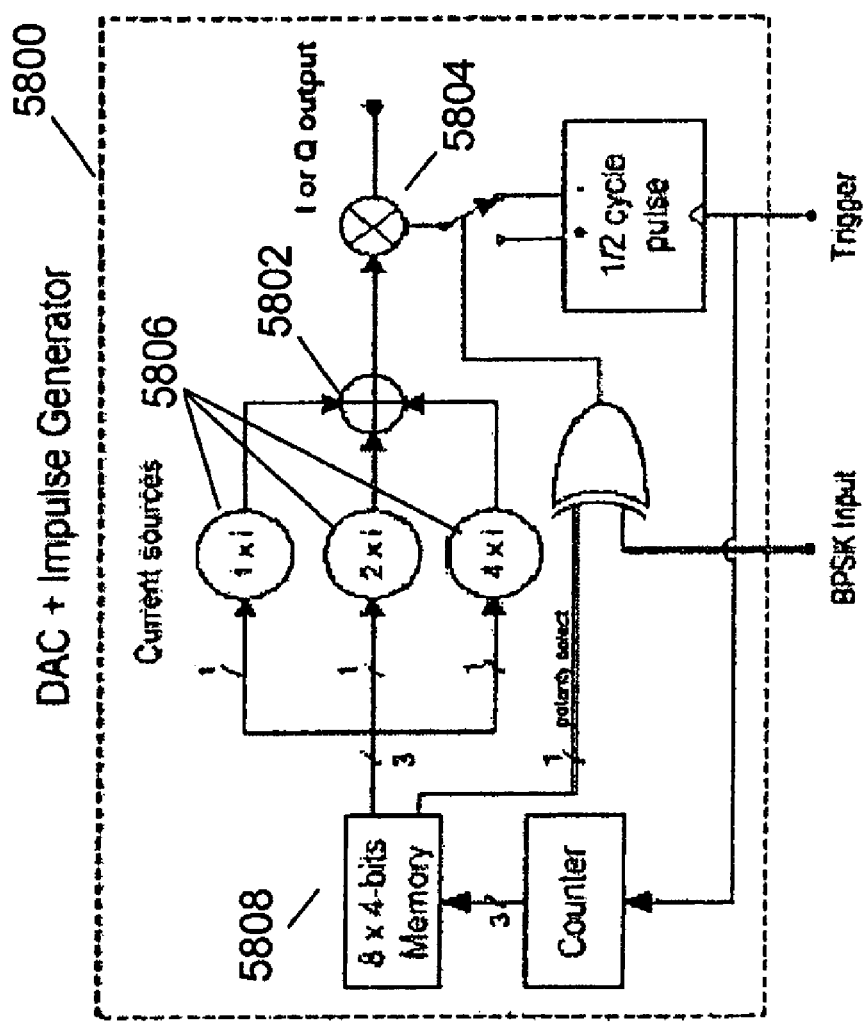
FIG. 58 shows an alternative waveform generator in accordance with an embodiment of the invention.

FIG. 58 presents an alternative waveform generator 5800 that can be used in place of the waveform generators 5002 and 5004 of FIG. 57, where delay 5006 will continue to determine a time offset between the first plurality of RF waveforms generated by a first waveform generator 5800 and the second plurality of RF waveforms generated by a second waveform generator 5800. Each waveform generator 5800 uses a summer 5802 to combine the output of three current sources 5806 that, when driven by positive bits from 8×4 bit memory 5808, output 1×i, 2×i, and 4×i currents, where i is some current amount. Thus, depending on the bits output by memory 5808, the output of summer 5802 can be 0×i, 1×2×i, 3×i, 4×i, 5×i, 6×i, or 7×i. The output of summer 5802 is mixed by mixer 5804 with either a positive or negative ½ cycle pulse depending on the polarity determined by the polarity select bit output by memory 5808 and the BPSK input. Thus, mixer 5804 outputs the first plurality (or second) plurality of RF waveforms scaled in accordance with the invention. One skilled in the art will recognize that memory 5808 is sized to define eight different impulses and that the memory can be sized differently depending on the number of RF waveforms to be generated.

Figure 59:
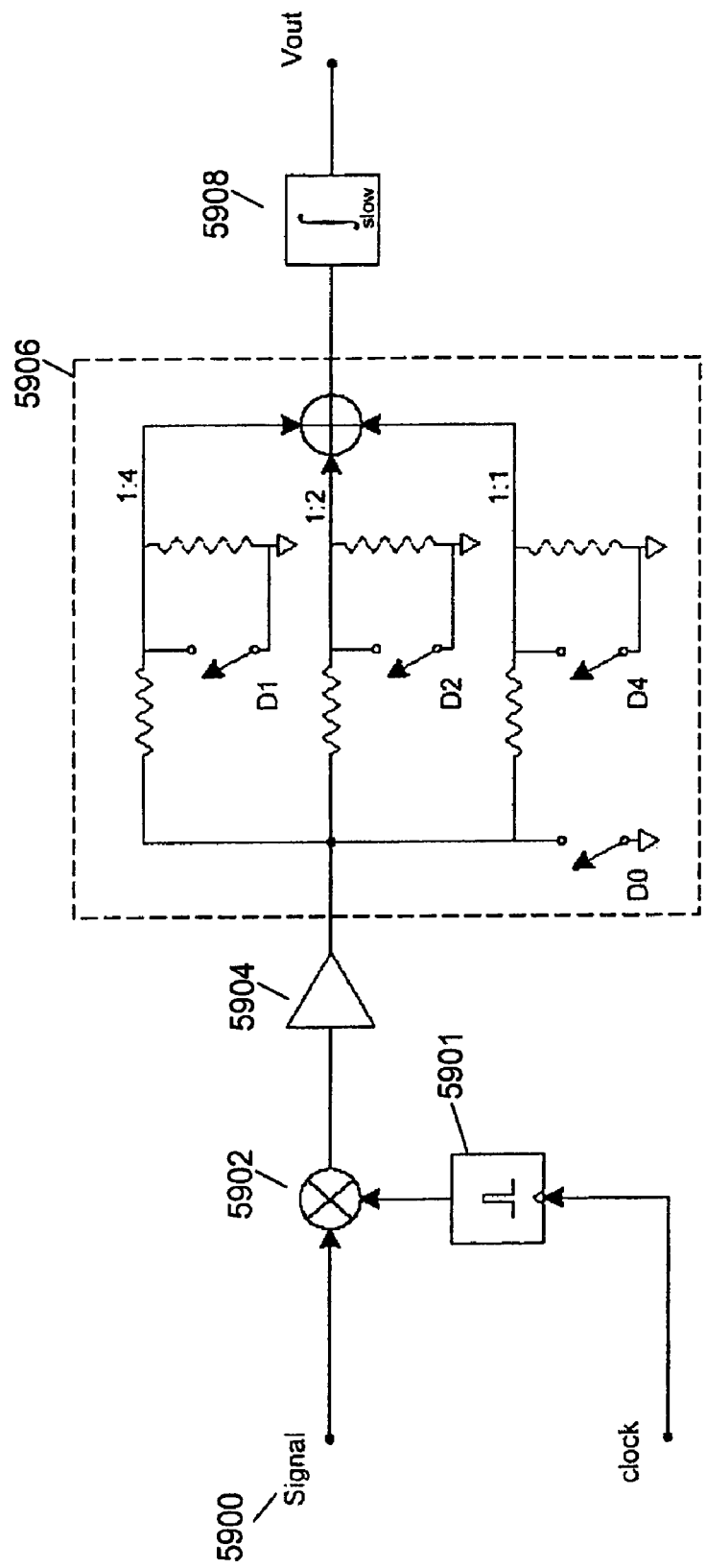
FIG. 59 presents a receiver in accordance with an embodiment of the invention.

FIGS. 59 through 62 present four alternative direct conversion receivers having alternative circuits for generating scaled RF waveforms based on stored data bits D0, D1, D2, and D4, which define sample values in accordance with the invention. In FIG. 59, a received signal 5900 and an impulse produced by impulse generator 5901 is mixed in mixer 5902. After amplification by operational amplifier 5904, the output of mixer 5902 may be attenuated by resistance ladder 5906 depending on data bits D0, D1, D2, and D4 before being integrated by integrator 5908.

Figure 60:
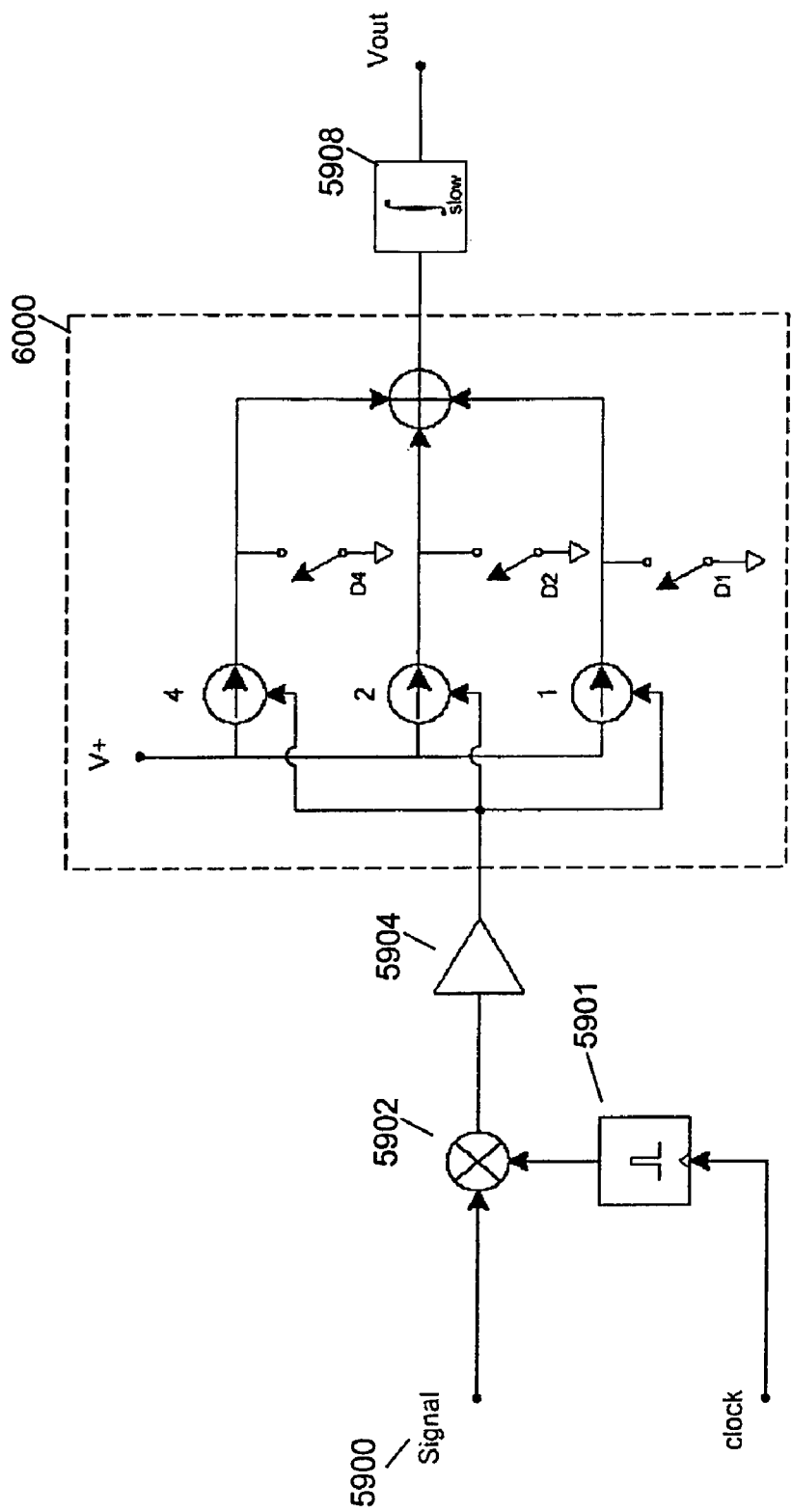
FIG. 60 present another receiver in accordance with another embodiment of the invention.

The receiver of FIG. 60 is similar to the receiver of FIG. 59 except that it uses a network 6000 of three current sources that are or are not shorted depending on data bits D1, D2, and D4 in order to attenuate the output of the operational amplifier 5904. When D0 is low, the current sources are shorted out to produce a zero output voltage. This arrangement could alternatively be implemented by selectively enabling each current source.

Figure 61:
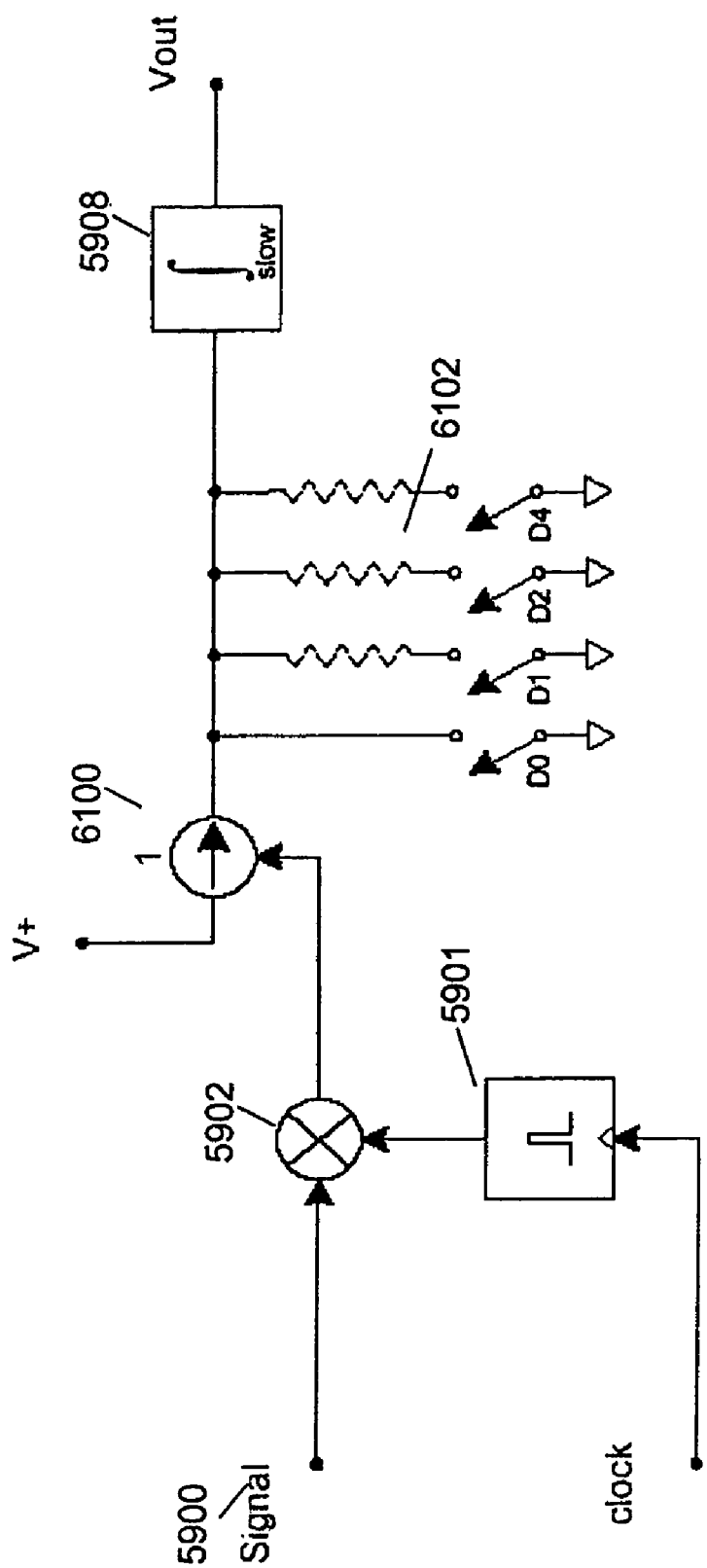
FIG. 61 illustrates a receiver in accordance with an embodiment of the invention.

The receiver of FIG. 61 operates in a manner similar to the receivers of FIGS. 59 and 60, but has a single current source 6100 that is attenuated using shunts 6102 based on data bits D0, D1, D2, and D4.

Figure 62:
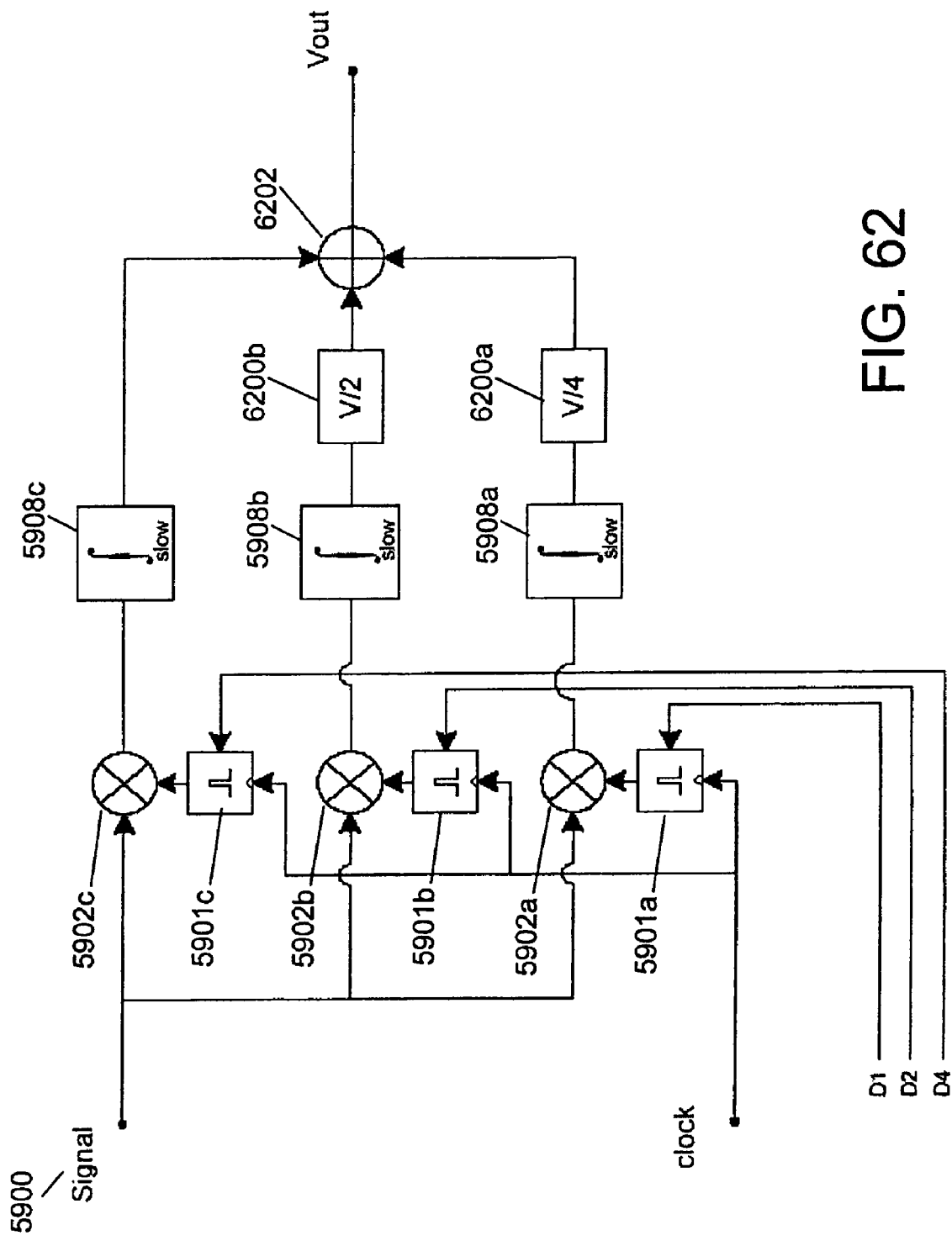
FIG. 62 depicts a receiver in accordance with an embodiment of the invention.

The receiver of FIG. 62 separately mixes received signal 5900 with up to three impulses having the same voltage that are enabled based on bits D1, D2, and D4. Impulse generators 5901a, 5901b, and 5901c are individually enabled by bits D1, D2, and D4, respectively, and their output is mixed with received signal 5900 in mixers 5902a, 5902b, and 5902c. The outputs of mixers 5902a, 5902b, and 5902c are separately integrated in integrators 5908a, 5908b, and 5908c. The outputs of integrators 5908a, 5908b are then weighted by weighting elements 6200a and 6200b and then weighted outputs are summed by summer 6202. The receiver of FIG. 62 has the advantage of analog processing at the maximum level.

Figure 63:
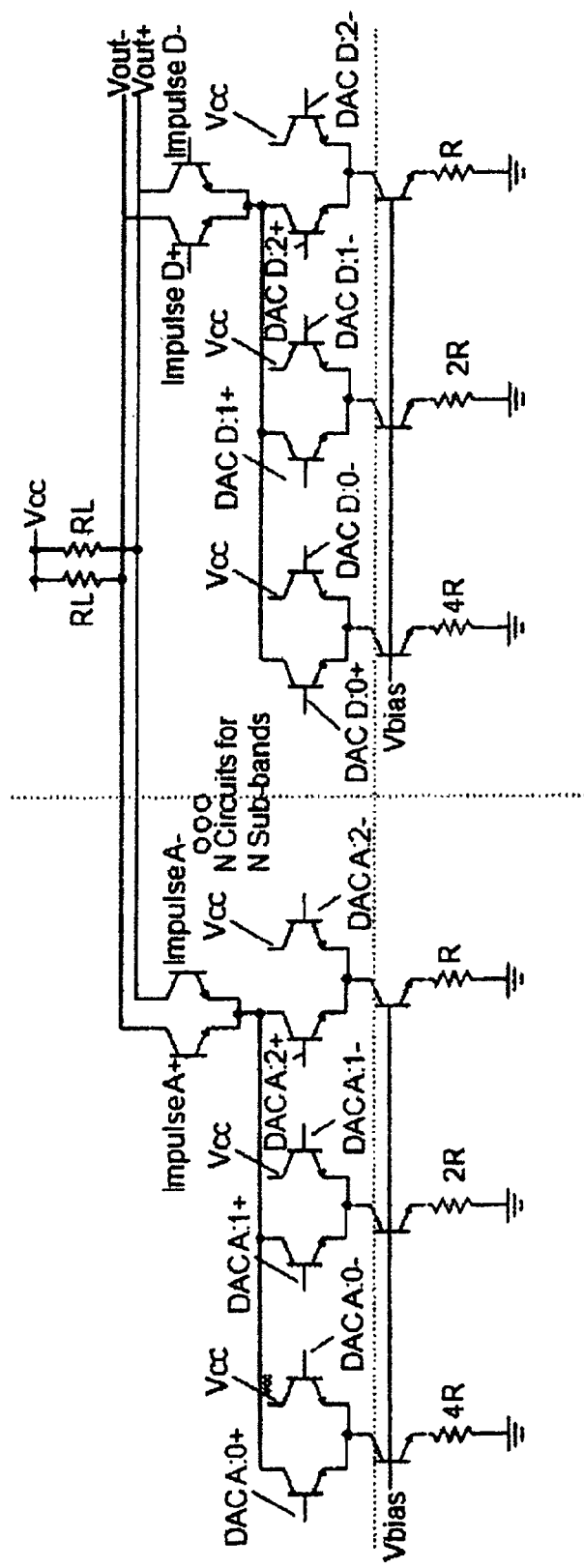
FIG. 63 depicts a circuit in accordance with an embodiment of the invention.
Figure 64:
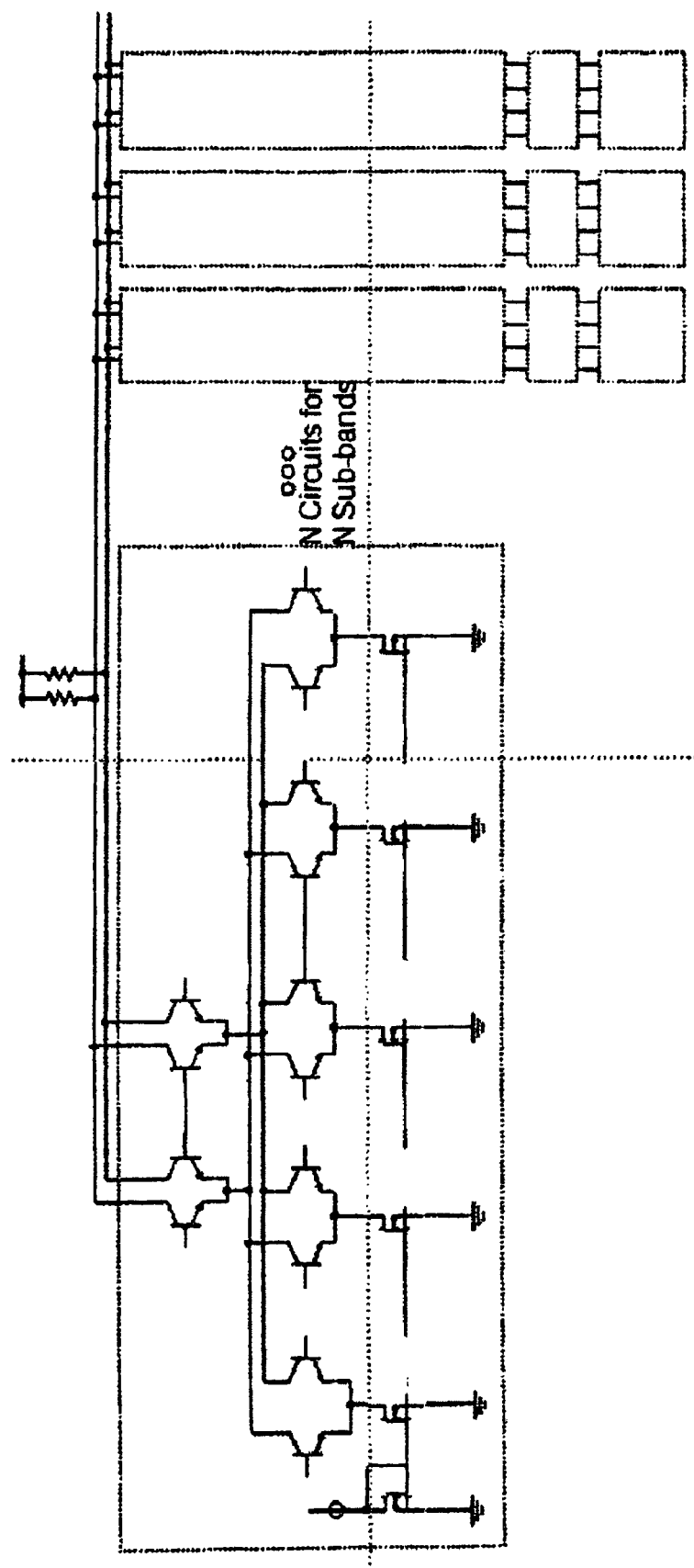
FIG. 64 depicts another circuit in accordance with another embodiment of the invention.

FIG. 63 depicts a circuit implementing a weighted summer with an embedded 3-bit DAC, while FIG. 64 shows a circuit implementing a differentially weighted summer with a 4-bit DAC.

Multi-Band Communication Systems

Figure 65:
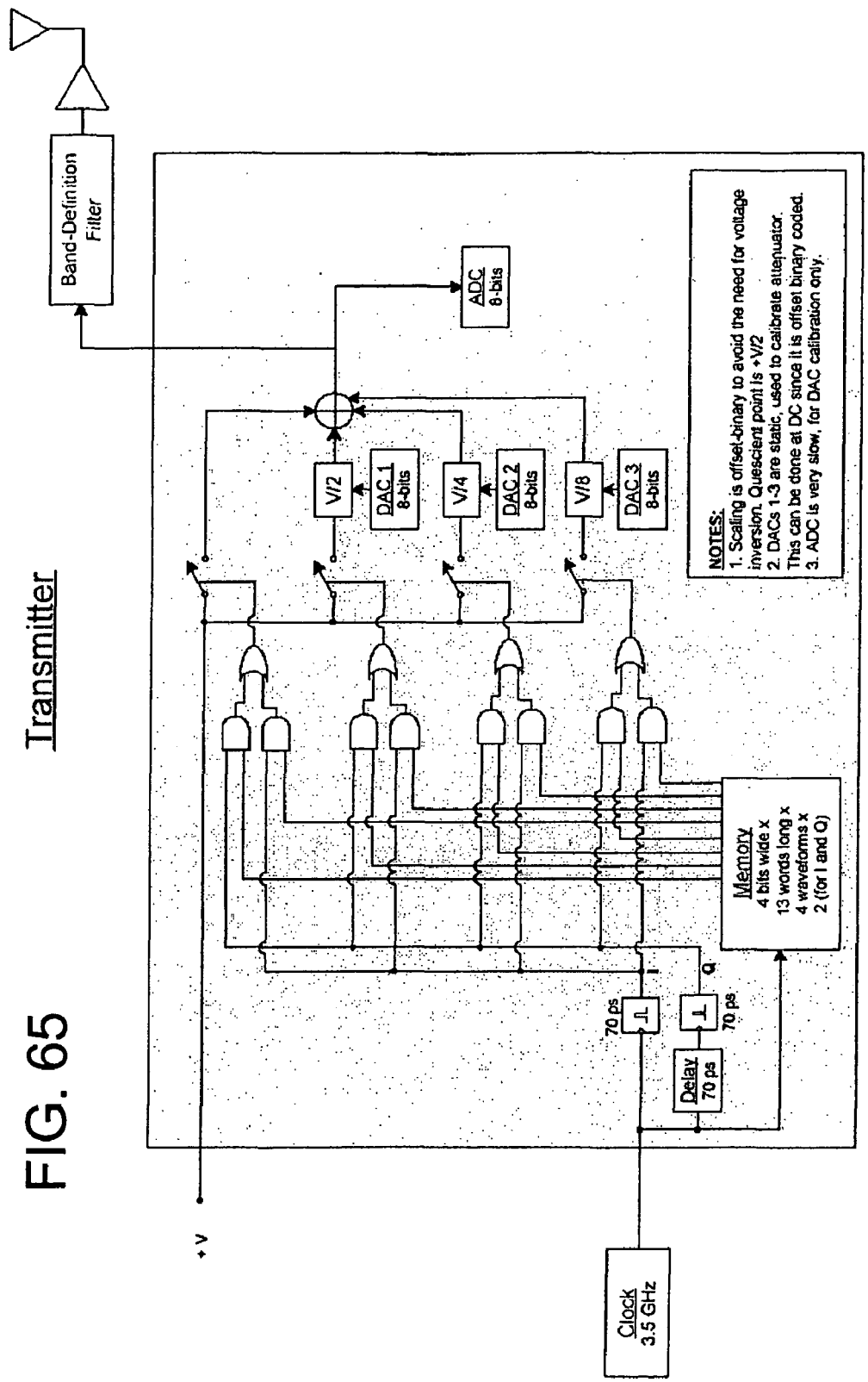
FIG. 65 presents a multi-band transmitter embodiment of the invention.
Figure 66:
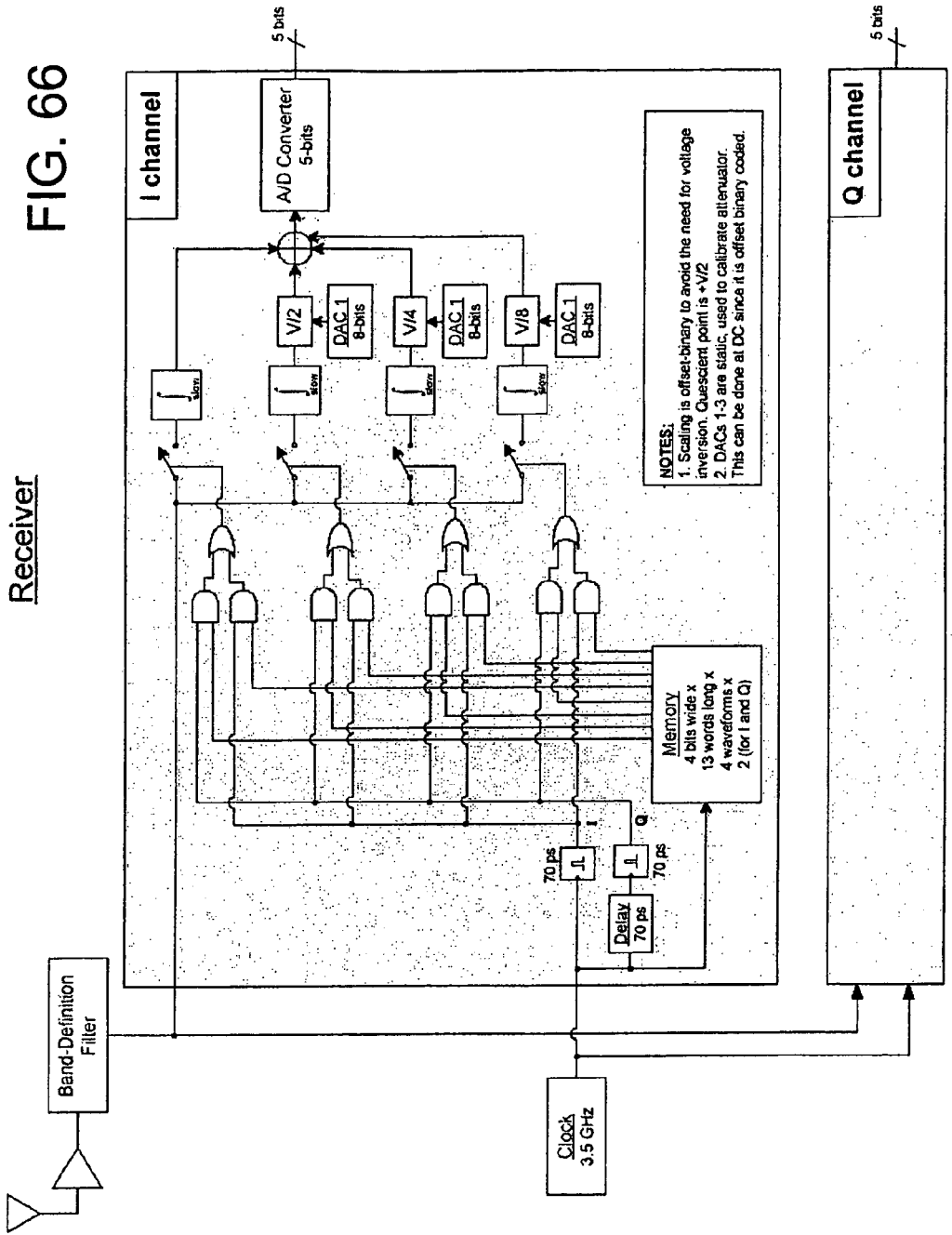
FIG. 66 illustrates a multi-band receiver embodiment of the invention.

FIG. 65 presents a multi-band transmitter embodiment of the invention employing a memory sized to define signals for four bands. The transmitter uses the sample pair approach as described in relation to FIG. 50 and weighted DAC summer approach. FIG. 66 presents a multi-receiver embodiment intended to complement the 4 band transmitter of FIG. 65. The receiver of FIG. 65 has four separate integrators having outputs that are weighted and then summed.

Figure 67:
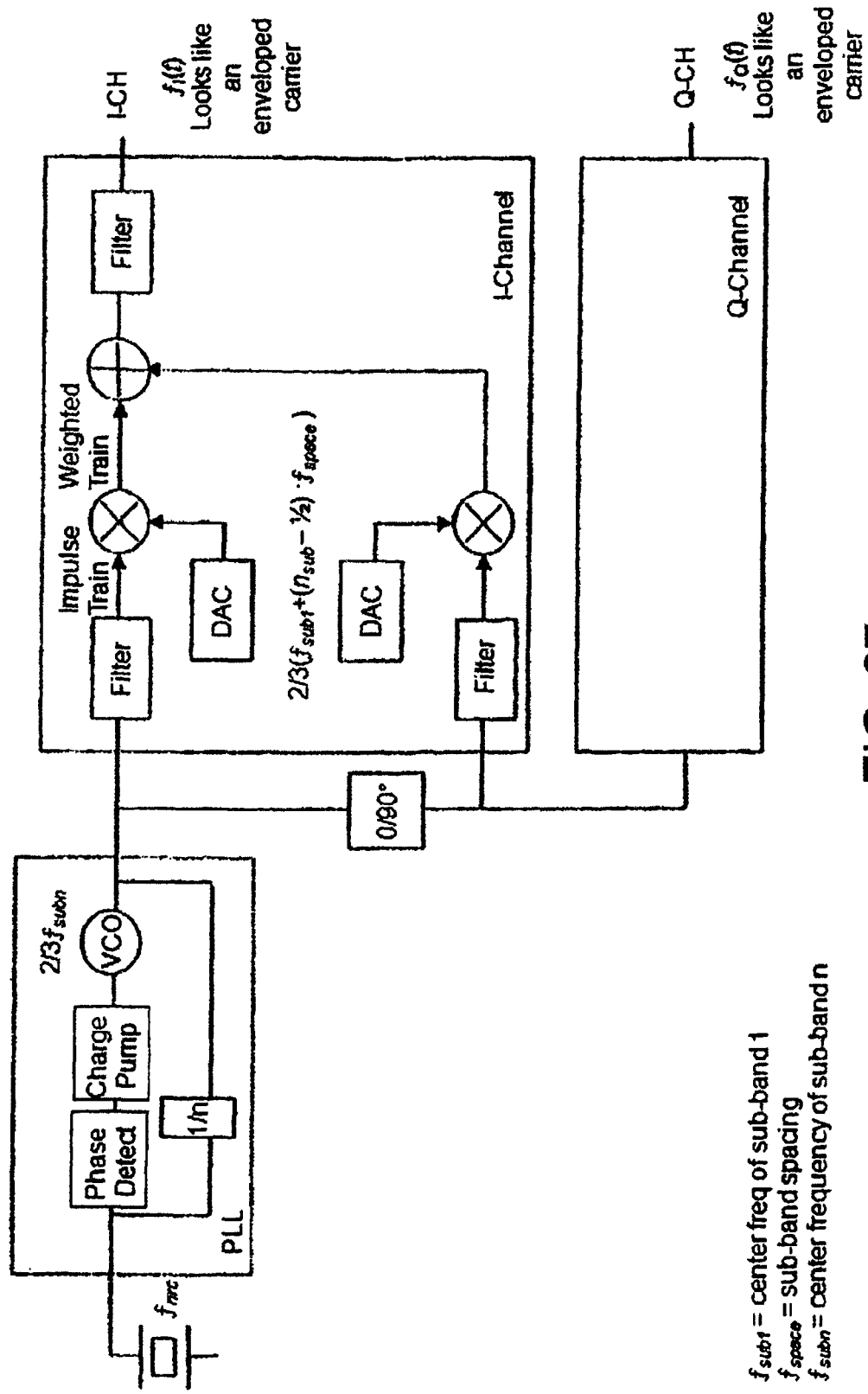
FIG. 67 shows a multi-band waveform generator in accordance with an alternative embodiment of the invention.

FIG. 67 presents an alternative waveform generator that can be used in a multi-band transmitter or receiver. It involves a phase lock loop-based waveform generator used to produce a train of impulses that are amplitude modulated by mixing them with the output of a DAC. The resultant weighted train is filtered to produce a waveform resembling an enveloped carrier having a center frequency within the appropriate band.

Figure 68:
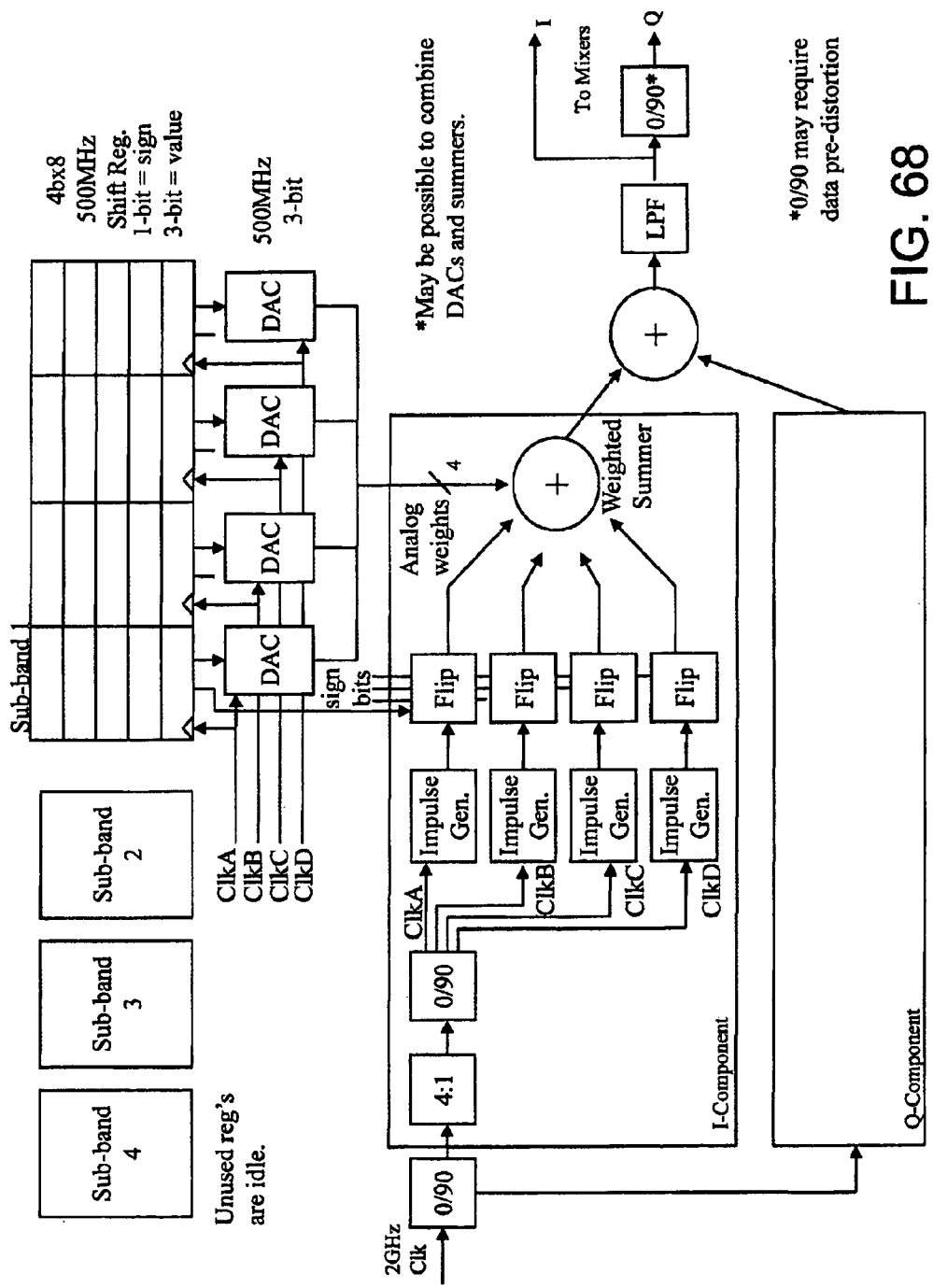
FIG. 68 presents another multi-band waveform generator in accordance with the invention.

FIG. 68 presents another waveform generator approach that can be used in a multi-band transmitter or receiver. It involves separately clocked impulse generators that are weighted in accordance with DACs and the summed impulses are then summed.

Waveform Synthesis Analyzer Software

Figure 69:
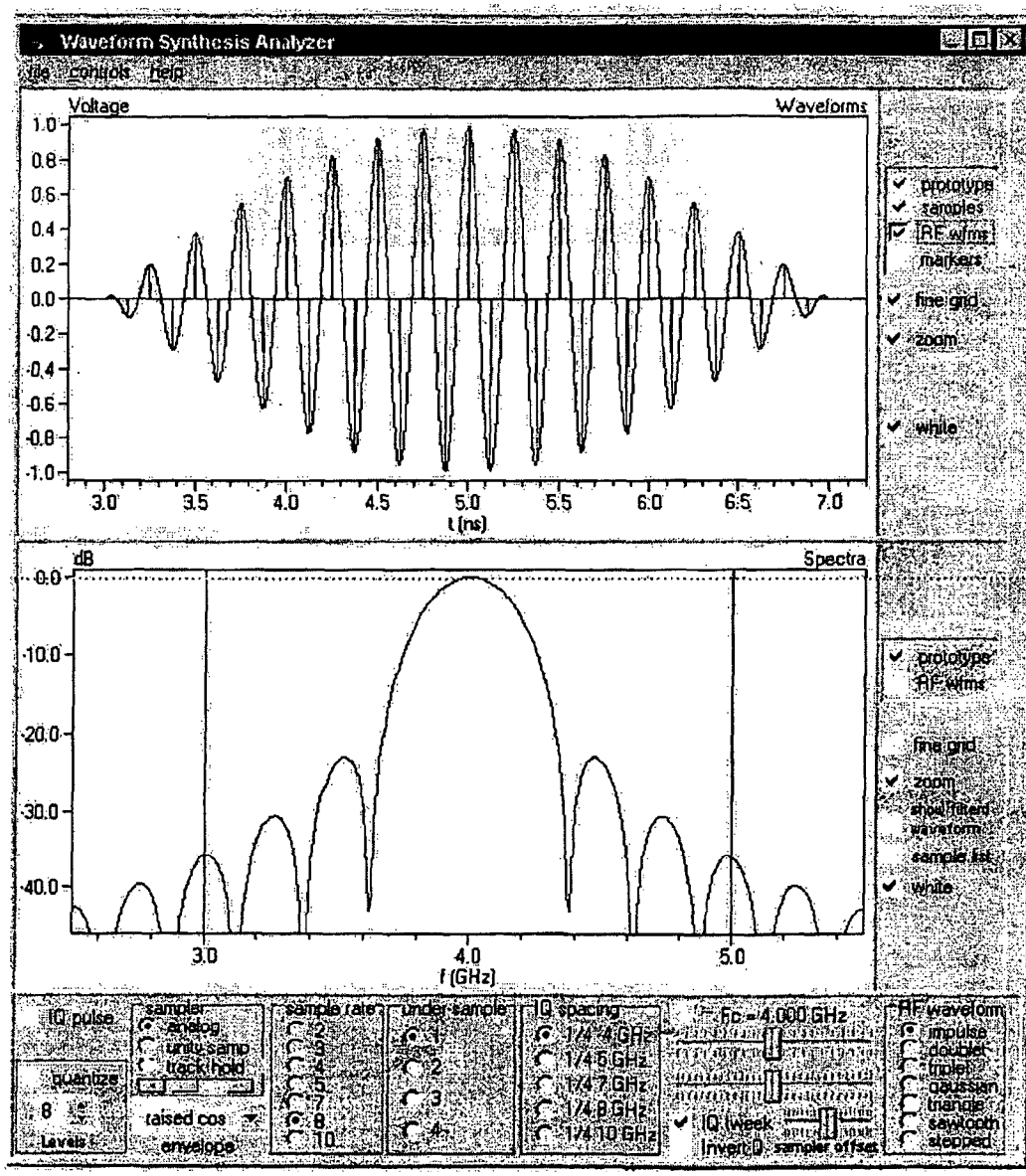
FIG. 69 presents the primary display of the Waveform Synthesis Analyzer software.

The primary display of the Waveform Synthesis Analyzer software is depicted in FIG. 69. It includes a waveform plot, a spectra plot, and software controls. The waveform plot is used to depict the prototype signal (or desired waveform), samples of the prototype signal, and the plurality of RF waveforms to be generated to synthesize the prototype signal. The spectra plot is used to depict the energy spectra of the prototype signal and of the plurality of RF waveforms. The software controls are primarily used to define characteristics of the prototype signal such as its bandwidth and center frequency, envelope shape, etc., to define sampling characteristics, and to define the characteristics of the RF waveforms that would be generated to synthesize the prototype signal.

Figure 70:
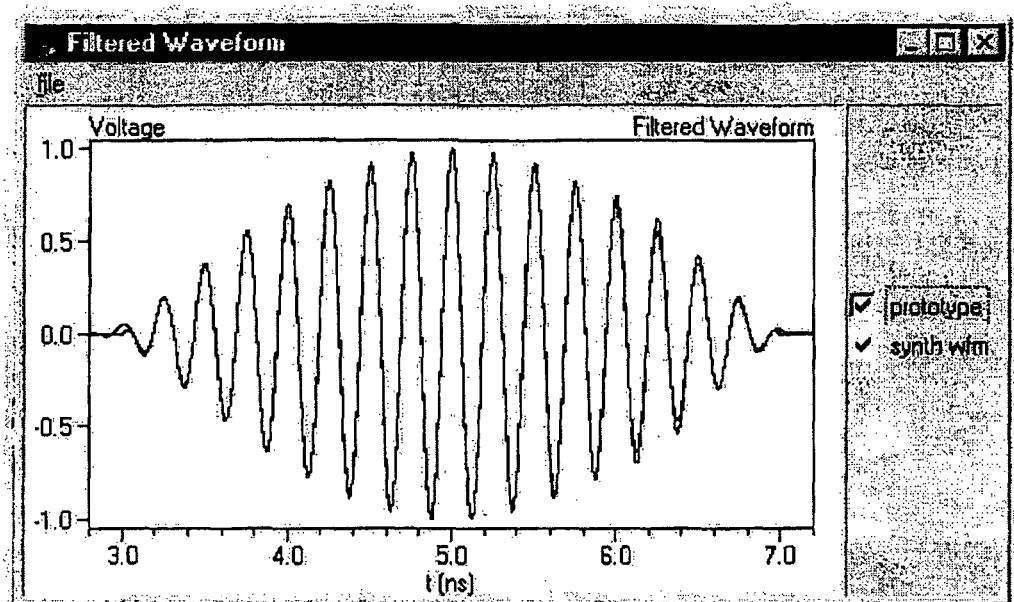
FIG. 70 presents another display of the Waveform Synthesis Analyzer software.
Figure 71:
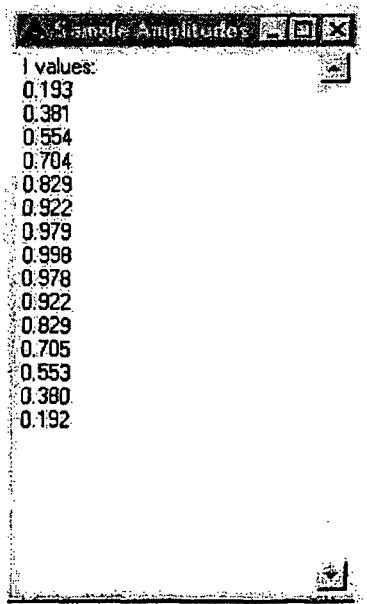
FIG. 71 depicts another display of the Waveform Synthesis Analyzer software.

FIG. 70 depicts an output window of the Waveform Synthesis Analyzer software that is used to compare the time profile of the prototype signal to the time profile of the plurality of RF waveforms if they are filtered, which is an optional feature of the invention. FIG. 71 depicts the values of the samples used to scale the plurality or RF waveforms as defined by the software controls.

It will be apparent to one skilled in the art that the detailed description of the invention disclosed herein comprises exemplary embodiments of the invention and that modifications may be made without departing from the teachings of the invention. Accordingly, the embodiments disclosed herein should be understood to only be representative and that the scope of the present invention should only be limited by the claims included herein and their equivalents.

What is claimed is:

1. A method of emulating a desired waveform, comprising:
producing a time profile of said desired waveform characterized by a plurality of sample values; and
generating a plurality of RF (radio frequency) waveforms, each RF waveform of said plurality of RF waveforms having energy scaled relative to a reference value in accordance with a corresponding one of the plurality of sample values of said time profile, the reference value corresponding to a maximum sample value of the plurality of sample values, where the plurality of sample values are normalized against the maximum sample value.

2. The method of claim 1, wherein the plurality of RF waveforms have an aggregate RF energy approximating at least one spectral characteristic of the desired waveform.

3. The method of claim 2, further comprising:
filtering the aggregate RF energy within a frequency band.

4. The method of claim 2, wherein the at least one spectral characteristic is a frequency profile defined by a frequency, phase and amplitude parameters.

5. The method of claim 1, wherein a polarity of each of the plurality of generated RF waveforms corresponds to one of the plurality of sample values.

6. The method of claim 1, wherein the energy of each of the generated RF waveforms is scaled by at least one of patterning, making, regulating, setting, and estimating based on the corresponding one of the plurality of sample values.

7. The method of claim 1, wherein the sample values are generated by sampling the time profile based on a carrier frequency of the desired waveform.

8. The method of claim 1, wherein the plurality of generated waveforms are based on at least one spectral requirement of the desired waveform.

9. The method of claim 8, wherein the at least one spectral requirement is one of an energy level and a power distribution of a frequency spectrum.

10. A method of emulating a desired waveform, comprising:
    producing a time profile of the desired waveform characterized by a plurality of sample values;
    normalizing the plurality of sample values against a maximum sample value;
    generating a corresponding RF (radio frequency) waveform to each of the plurality of sample values;
    scaling relative to a reference value each of RF waveforms based on the corresponding sample value of the time profile, wherein the RF waveforms for the plurality of sample values have an aggregate RF energy of the desired waveform, wherein the reference value corresponds to the maximum sample value.

11. The method of claim 10, wherein the generating is based on a timing of the plurality of sample values.

12. The method of claim 10, wherein at least one of amplitude, width or type of each of the plurality of generated RF waveforms is based on the corresponding one of the plurality of sample values.

13. A transmitter, comprising:
    a waveform generator configured to produce a time profile of a desired waveform, the desired waveform characterized by a plurality of sample values, and configured to generate a plurality of RF (radio frequency waveforms), each RF waveform of the plurality of RF waveforms having energy scaled in accordance with a corresponding one of the plurality of sample values of said time profile, wherein the plurality of sample values are normalized against a reference value.

14. The transmitter of claim 13, wherein the RF waveforms have an aggregate RF energy approximating at least one spectral characteristic of the desired waveform.

15. The transmitter of claim 14, wherein the waveform generator is further configured to filter the aggregate RF energy within a frequency band.

16. The transmitter of claim 14, wherein the at least one spectral characteristic is a frequency profile characterized by a frequency, phase and amplitude of the desired waveform.

* * * * *